(12) United States Patent
Duong et al.

(10) Patent No.: US 11,481,612 B1
(45) Date of Patent: Oct. 25, 2022

(54) STORAGE OF INPUT VALUES ACROSS MULTIPLE CORES OF NEURAL NETWORK INFERENCE CIRCUIT

(71) Applicant: Perceive Corporation, San Jose, CA (US)

(72) Inventors: Kenneth Duong, San Jose, CA (US); Jung Ko, San Jose, CA (US); Steven L. Teig, Menlo Park, CA (US)

(73) Assignee: PERCEIVE CORPORATION, San Jose, CA (US)

( * ) Notice: Subject to any disclaimer, the term of this patent is extended or adjusted under 35 U.S.C. 154(b) by 802 days.

(21) Appl. No.: 16/355,656

(22) Filed: Mar. 15, 2019

Related U.S. Application Data

(60) Provisional application No. 62/797,910, filed on Jan. 28, 2019, provisional application No. 62/792,123, filed on Jan. 14, 2019, provisional application No. 62/773,162, filed on Nov. 29, 2018, provisional application No. 62/773,164, filed on Nov. 29, 2018, provisional application No. 62/753,878, filed on Oct. 31, 2018, provisional application No. 62/742,802, filed on Oct. 8, 2018, provisional application No. 62/724,589, filed on Aug. 29, 2018, provisional application No. 62/660,914, filed on Apr. 20, 2018.

(51) Int. Cl.
*G06N 3/063* (2006.01)
*G06F 17/16* (2006.01)
*G06F 7/544* (2006.01)

(52) U.S. Cl.
CPC .......... *G06N 3/063* (2013.01); *G06F 7/5443* (2013.01); *G06F 17/16* (2013.01)

(58) Field of Classification Search
None
See application file for complete search history.

(56) References Cited

U.S. PATENT DOCUMENTS

| 5,956,703 A | 9/1999 | Turner et al. |
| 9,858,636 B1 | 1/2018 | Lim et al. |

(Continued)

OTHER PUBLICATIONS

Achterhold, Jan, et al., "Variational Network Quantization," Proceedings of 6th International Conference on Learning Representations (ICLR 2018), Apr. 30-May 3, 2018, 18 pages, ICLR, Vancouver, BC, Canada.

(Continued)

*Primary Examiner* — Eric Coleman
(74) *Attorney, Agent, or Firm* — Adeli LLP

(57) ABSTRACT

Some embodiments provide a neural network inference circuit (NNIC) for executing a neural network that includes multiple computation nodes at multiple layers. Each of a set of the computation nodes includes a dot product of input values and weight values. The NNIC includes dot product cores, each of which includes (i) partial dot product computation circuits to compute dot products between input values and weight values and (ii) memories to store the weight values and input values for a layer of the NN. The input values for a particular layer of the NN are stored in the memories of multiple cores. A starting memory location in a first core for the input values of the layer stored in the first core is the same as a starting memory location for the input values in each of the other cores that store the input values for the layer.

20 Claims, 24 Drawing Sheets

(56) References Cited

U.S. PATENT DOCUMENTS

| | | | |
|---|---|---|---|
| 9,904,874 | B2 | 2/2018 | Shoaib et al. |
| 10,445,638 | B1 | 10/2019 | Amirineni et al. |
| 10,489,478 | B2 | 11/2019 | Lim et al. |
| 10,740,265 | B1* | 8/2020 | Xu ............... G06F 13/4221 |
| 10,768,856 | B1 | 9/2020 | Diamant et al. |
| 10,796,198 | B2 | 10/2020 | Franca-Neto |
| 10,853,321 | B2* | 12/2020 | Hasegawa ........... G06F 16/1727 |
| 11,138,292 | B1 | 10/2021 | Nair et al. |
| 2004/0078403 | A1 | 4/2004 | Scheuermann et al. |
| 2007/0103482 | A1 | 5/2007 | Yoshiura et al. |
| 2009/0279141 | A1* | 11/2009 | Ohhashi ............. H04N 1/32593 358/1.16 |
| 2016/0239706 | A1 | 8/2016 | Dijkman et al. |
| 2016/0342893 | A1 | 11/2016 | Ross et al. |
| 2017/0011006 | A1 | 1/2017 | Saber et al. |
| 2017/0011288 | A1 | 1/2017 | Brothers et al. |
| 2017/0075816 | A1* | 3/2017 | Okada ..................... G06F 21/79 |
| 2017/0323196 | A1 | 11/2017 | Gibson et al. |
| 2018/0018559 | A1 | 1/2018 | Yakopcic et al. |
| 2018/0046900 | A1 | 2/2018 | Dally et al. |
| 2018/0101763 | A1 | 4/2018 | Barnard et al. |
| 2018/0114569 | A1 | 4/2018 | Strachan et al. |
| 2018/0121796 | A1 | 5/2018 | Deisher et al. |
| 2018/0189229 | A1 | 7/2018 | Desoli et al. |
| 2018/0197068 | A1 | 7/2018 | Narayanaswami et al. |
| 2018/0246855 | A1 | 8/2018 | Redfern et al. |
| 2018/0285726 | A1 | 10/2018 | Baum et al. |
| 2018/0285727 | A1* | 10/2018 | Baum ..................... G06F 12/02 |
| 2018/0293490 | A1 | 10/2018 | Ma et al. |
| 2018/0293493 | A1 | 10/2018 | Kalamkar et al. |
| 2018/0293691 | A1 | 10/2018 | Nurvitadhi et al. |
| 2018/0300600 | A1 | 10/2018 | Ma et al. |
| 2018/0307494 | A1 | 10/2018 | Ould-Ahmed-Vall et al. |
| 2018/0307950 | A1 | 10/2018 | Nealis et al. |
| 2018/0307980 | A1* | 10/2018 | Barik ................... G06N 3/0454 |
| 2018/0308202 | A1 | 10/2018 | Appu et al. |
| 2018/0315158 | A1 | 11/2018 | Nurvitadhi et al. |
| 2018/0322386 | A1 | 11/2018 | Sridharan et al. |
| 2018/0373975 | A1 | 12/2018 | Yu et al. |
| 2019/0012296 | A1 | 1/2019 | Hsieh et al. |
| 2019/0026078 | A1 | 1/2019 | Bannon et al. |
| 2019/0026237 | A1 | 1/2019 | Talpes et al. |
| 2019/0026249 | A1* | 1/2019 | Talpes .................. G06N 3/0481 |
| 2019/0057036 | A1 | 2/2019 | Mathuriya et al. |
| 2019/0073585 | A1 | 3/2019 | Pu et al. |
| 2019/0095776 | A1 | 3/2019 | Kfir et al. |
| 2019/0114499 | A1 | 4/2019 | Delaye et al. |
| 2019/0138891 | A1 | 5/2019 | Kim et al. |
| 2019/0171927 | A1 | 6/2019 | Diril et al. |
| 2019/0187983 | A1 | 6/2019 | Ovsiannikov et al. |
| 2019/0196970 | A1 | 6/2019 | Han et al. |
| 2019/0205358 | A1 | 7/2019 | Diril et al. |
| 2019/0205736 | A1 | 7/2019 | Bleiweiss et al. |
| 2019/0205739 | A1 | 7/2019 | Liu et al. |
| 2019/0205780 | A1 | 7/2019 | Sakaguchi |
| 2019/0236445 | A1 | 8/2019 | Das et al. |
| 2019/0294413 | A1 | 9/2019 | Vantrease et al. |
| 2019/0294968 | A1 | 9/2019 | Vantrease et al. |
| 2019/0303749 | A1 | 10/2019 | Appuswamy et al. |
| 2019/0325296 | A1 | 10/2019 | Fowers et al. |
| 2019/0332925 | A1 | 10/2019 | Modha |
| 2019/0347559 | A1 | 11/2019 | Kang et al. |
| 2020/0042856 | A1 | 2/2020 | Datta et al. |
| 2020/0042859 | A1 | 2/2020 | Mappouras et al. |
| 2020/0089506 | A1 | 3/2020 | Power et al. |
| 2020/0134461 | A1 | 4/2020 | Chai et al. |
| 2021/0110236 | A1 | 4/2021 | Shibata |
| 2021/0173787 | A1 | 6/2021 | Nagy et al. |
| 2021/0241082 | A1 | 8/2021 | Nagy et al. |

OTHER PUBLICATIONS

Andri, Renzo, et al., "YodaNN: An Architecture for Ultra-Low Power Binary-Weight CNN Acceleration," IEEE Transactions on Computer-Aided Design of Integrated Circuits and Systems, Mar. 14, 2017, 14 pages, IEEE, New York, NY, USA.

Bang, Suyoung, et al., "A 288μW Programmable Deep-Learning Processor with 270KB On-Chip Weight Storage Using Non-Uniform Memory Hierarchy for Mobile Intelligence," Proceedings of 2017 IEEE International Solid-State Circuits Conference (ISSCC 2017), Feb. 5-7, 2017, 3 pages, IEEE, San Francisco, CA, USA.

Bong, Kyeongryeol, et al., "A 0.62mW Ultra-Low-Power Convolutional-Neural-Network Face-Recognition Processor and a CIS Integrated with Always-On Haar-Like Face Detector," Proceedings of 2017 IEEE International Solid-State Circuits Conference (ISSCC 2017), Feb. 5-7, 2017, 3 pages, IEEE, San Francisco, CA, USA.

Chen, Yu-Hsin, et al., "Eyeriss: A Spatial Architecture for Energy-Efficient Dataflow for Convolutional Neural Networks," Proceedings of 2016 ACM/IEEE 43rd Annual International Symposium on Computer Architecture (ISCA 2016), Jun. 18-22, 2016, 13 pages, IEEE, Seoul, South Korea.

Chen, Yu-Hsin, et al., "Using Dataflow to Optimize Energy Efficiency of Deep Neural Network Accelerators," IEEE Micro, Jun. 14, 2017, 10 pages, vol. 37, Issue 3, IEEE, New York, NY, USA.

Cho, Minsik, et al., "MEC: Memory-Efficient Convolution for Deep Neural Network," Jun. 21, 2017, 10 pages, arXiv:1706 06873v1, Computer Research Repository (CoRR)—Cornell University, Ithaca, NY, USA.

Courbariaux, Maitthieu, et al., "Binarized Neural Networks: Training Neural Networks with Weights and Activations Constrained to +1 or −1," Mar. 17, 2016, 11 pages, arXiv:1602.02830v3, Computing Research Repository (CoRR)—Cornell University, Ithaca, NY, USA.

Courbariaux, Matthieu, et al., "BinaryConnect: Training Deep Neural Networks with Binary Weights during Propagations," Proceedings of the 28th International Conference on Neural Information Processing Systems (NIPS 15), Dec. 7-12, 2015, 9 pages, MIT Press, Montreal, Canada.

Emer, Joel, et al., "Hardware Architectures for Deep Neural Networks," CICS/MTL Tutorial, Mar. 27, 2017, 258 pages, Massachusetts Institute of Technology, Cambridge, MA, USA, retrieved from http://www.rle.mit.edu/eems/wp-content/uploads/2017/03/Tutorial-on-DNN-CICS-MTL.pdf.

Gao, Mingyu, et al., "TETRIS: Scalable and Efficient Neural Network Acceleration with 3D Memory," Proceedings of the 22nd International Conference on Architectural Support for Programming Languages and Operating Systems (ASPLOS '17), Apr. 8-12, 2017, 14 pages, ACM, Xi'an, China.

Guo, Yiwen, et al., "Network Sketching: Exploring Binary Structure in Deep CNNs," 2017 IEEE Conference on Computer Vision and Pattern Recognition (CVPR 2017), Jul. 21-26, 2017, 9 pages, IEEE, Honolulu, HI.

He, Zhezhi, et al., "Optimize Deep Convolutional Neural Network with Temarized Weights and High Accuracy," Jul. 20, 2018, 8 pages, arXiv:1807.07948v1, Computing Research Repository (CoRR)—Cornell University, Ithaca, NY, USA.

Hegde, Kartik, et al., "UCNN: Exploiting Computational Reuse in Deep Neural Networks via Weight Repetition," Proceedings of the 45th Annual International Symposium on Computer Architecture (ISCA '18), Jun. 2-6, 2018, 14 pages, IEEE Press, Los Angeles, CA, USA.

Horowitz, Mark, "Computing's Energy Problem (and what can we do about it)," 2014 IEEE International Solid-State Circuits Conference (ISSCC 2014), Feb. 9-13, 2014, 5 pages, IEEE, San Francisco, CA, USA.

Huan, Yuxiang, et al., "A Low-Power Accelerator for Deep Neural Networks with Enlarged Near-Zero Sparsity," May 22, 2017, 5 pages, arXiv:1705.08009v1, Computer Research Repository (CoRR)—Cornell University, Ithaca, NY, USA.

Jeon, Dongsuk, et al., "A 23-mW Face Recognition Processor with Mostly-Read 5T Memory in 40-nm CMOS," IEEE Journal on Solid-State Circuits, Jun. 2017, 15 pages, vol. 52, No. 6, IEEE, New York, NY, USA.

Jouppi, Norman, P., et al., "In-Datacenter Performance Analysis of a Tensor Processing Unit," Proceedings of the 44th Annual Inter-

(56) References Cited

OTHER PUBLICATIONS national Symposium on Computer Architecture (ISCA '17), Jun. 24-28, 2017, 17 pages, ACM, Toronto, ON, Canada.

Judd, Patrick, et al., "Cnvlutin2: Ineffectual-Activation-and-Weight-Free Deep Neural Network Computing," Apr. 29, 2017, 6 pages, arXiv:1705.00125v1, Computer Research Repository (CoRR)—Cornell University, Ithaca, NY, USA.

Leng, Cong, et al., "Extremely Low Bit Neural Network: Squeeze the Last Bit Out with ADMM," Proceedings of 32nd AAAI Conference on Artificial Intelligence (AAAI-18), Feb. 2-7, 2018, 16 pages, Association for the Advancement of Artificial Intelligence, New Orleans, LA, USA.

Li, Fengfu, et al., "Ternary Weight Networks," May 16, 2016, 9 pages, arXiv:1605.04711v1, Computing Research Repository (CoRR)—Cornell University, Ithaca, NY, USA.

Merolla, Paul, et al., "Deep Neural Networks are Robust to Weight Binarization and Other Non-linear Distortions," Jun. 7, 2016, 10 pages, arXiv:1606.01981v1, Computing Research Repository (CoRR)—Cornell University, Ithaca, NY, USA.

Moons, Bert, et al., "Envision: A 0.26-to-10TOPS/W Subword-Parallel Dynamic-Voltage-Accuracy-Frequency-Scalable Convolutional Neural Network Processor in 28nm FDSOI," Proceedings of 2017 IEEE International Solid-State Circuits Conference (ISSCC 2017), Feb. 5-7, 2017, 3 pages, IEEE, San Francisco, CA, USA.

Moshovos, Andreas, et al., "Exploiting Typical Values to Accelerate Deep Learning," Computer, May 24, 2018, 13 pages. vol. 51—Issue 5, IEEE Computer Society, Washington, D.C.

Non-Published commonly Owned U.S. Appl. No. 16/355,648, filed Mar. 15, 2019, 91 pages, Perceive Corporation.

Non-Published commonly Owned U.S. Appl. No. 16/355,653, filed Mar. 15, 2019, 92 pages, Perceive Corporation.

Non-Published commonly Owned U.S. Appl. No. 16/355,659, filed Mar. 15, 2019, 91 pages, Perceive Corporation.

Park, Jongsoo, et al., "Faster CNNs with Direct Sparse Convolutions and Guided Pruning," Jul. 28, 2017, 12 pages, arXiv:1608.01409v5, Computer Research Repository (CoRR)—Cornell University, Ithaca, NY, USA.

Pedram, Ardavan, et al., "Dark Memory and Accelerator-Rich System Optimization in the Dark Silicon Era," Apr. 27, 2016, 8 pages, arXiv:1602.04183v3, Computer Research Repository (CoRR)—Cornell University, Ithaca, NY, USA.

Rastegari, Mohammad, et al., "XNOR-Net: ImageNet Classification Using Binary Convolutional Neural Networks," Proceedings of 2016 European Conference on Computer Vision (ECCV '16), Oct. 8-16, 2016, 17 pages, Lecture Notes in Computer Science, vol. 9908, Springer, Cham, Amsterdam, Netherlands.

Ren, Mengye, et al., "SBNet: Sparse Blocks Network for Fast Inference," Jan. 7, 2018, 10 pages, arXiv:1801.02108v1, Computer Research Repository (CoRR)—Cornell University, Ithaca, NY, USA.

Rutenbar, Rob A., et al., "Hardware Inference Accelerators for Machine Learning," 2016 IEEE International Test Conference (ITC), Nov. 15-17, 2016, 39 pages, IEEE, Fort Worth, TX, USA.

Shayer, Oran, et al., "Learning Discrete Weights Using the Local Reparameterization Trick," Proceedings of 6th International Conference on Learning Representations (ICLR 2018), Apr. 30-May 3, 2018, 12 pages, ICLR, Vancouver, BC, Canada.

Shin, Dongjoo, et al., "DNPU: An 8.1TOPS/W Reconfigurable CNN-RNN Processor for General-Purpose Deep Neural Networks," Proceedings of 2017 IEEE International Solid-State Circuits Conference (ISSCC 2017), Feb. 5-7, 2017, 3 pages, IEEE, San Francisco, CA, USA.

Sze, Vivienne, et al., "Efficient Processing of Deep Neural Networks: A Tutorial and Survey," Aug. 13, 2017, 32 pages, arXiv:1703.09039v2, Computer Research Repository (CoRR)—Cornell University, Ithaca, NY, USA.

Wang, Min, et al., "Factorized Convolutional Neural Networks," 2017 IEEE International Conference on Computer Vision Workshops (ICCVW '17), Oct. 22-29, 2017, 9 pages, IEEE, Venice, Italy.

Yang, Xuan, et al., "DNN Dataflow Choice Is Overrated," Sep. 10, 2018, 13 pages, arXiv:1809.04070v1, Computer Research Repository (CoRR)—Cornell University, Ithaca, NY, USA.

Zhang, Shijin, et al., "Cambricon-X: An Accelerator for Sparse Neural Networks," 2016 49th Annual IEEE/ACM International Symposium on Microarchitecture (MICRO '16), Oct. 15-19, 2016, 12 pages, IEEE, Taipei, Taiwan.

Zhu, Chenzhuo, et al., "Trained Ternary Quantization," Dec. 4, 2016, 9 pages, arXiv:1612.01064v1, Computing Research Repository (CoRR)—Cornell University, Ithaca, NY, USA.

Liu, Chenchen, et al., "A Memristor-based Neuromorphic Engine with a Current Sensing Scheme for Artificial Neural Network Applications," 2017 22nd Asia and South Pacific Design Automation Conference (ASP-DAC), Jan. 16-19, 2017, 6 pages, Chiba, Japan.

Boo, Yoonho, et al., "Structured Sparse Ternary Weight Coding of Deep Neural Networks for Efficient Hardware Implementations," 2017 IEEE Workshop on Signal Processing Systems (SiPS), Oct. 3-5, 2017, 6 pages, IEEE, Lorient, France.

Ardakani, Arash, et al., "An Architecture to Accelerate Convolution in Deep Neural Networks," IEEE Transactions on Circuits and Systems I: Regular Papers, Oct. 17, 2017, 14 pages, vol. 65, No. 4, IEEE.

* cited by examiner

STORAGE OF INPUT VALUES ACROSS MULTIPLE CORES OF NEURAL NETWORK INFERENCE CIRCUIT

BACKGROUND

In a typical neural network, a standard computation is a dot product between input values (activations) and weight values. A typical way for an integrated circuit to compute these weight values is to use multiply-accumulate (MAC) circuits that repeatedly perform the multiplication of an input value by a weight value, add that to an existing partial dot product, and store the new partial dot product. However, this requires numerous clock cycles, as each term in the dot product computed by a MAC uses a separate cycle. In addition, the storage of each intermediate term requires the use of memory (contributing to both slowing down of the computation and use of resources for the read/write operations). Accordingly, techniques for parallelization without massively expanding the surface area of the circuit are required.

BRIEF SUMMARY

Some embodiments provide an integrated circuit (IC) for implementing a machine-trained network (e.g., a neural network). The IC of some embodiments includes a set of input processing circuits, a neural network computation fabric that can be configured to apply a neural network to an input value, and a microprocessor (e.g., for controlling the input processing circuits and configuring the neural network computation fabric). The neural network computation fabric of some embodiments includes (i) a set of cores that compute dot products of input values and corresponding weight values and (ii) a channel that aggregates these dot products and performs post-processing operations (as well as performs other operations), in order to compute the outputs of neural network computation nodes.

In some embodiments, at startup of the IC, the microprocessor loads neural network configuration data (e.g., weight values, scale and bias parameters, etc.) from off-chip storage and generates instructions for the neural network computation fabric to write the neural network parameters to memory. In addition, microprocessor loads the neural network program instructions for the computation fabric to its own memory. These instructions are applied by the computation fabric to input data (e.g., images, audio clips, etc.) in order to execute the neural network. The instructions include, e.g., the memory locations to which input values are written, configuration data specifying how to compute specific neural network nodes, etc. Upon receiving input data (e.g., from a sensor on a device that incorporates the IC), the microprocessor provides neural network program instructions to the computation fabric. Once the final output of the neural network is computed, the fabric provides this output back to the microprocessor, so that the microprocessor (or other circuitry on the device) can evaluate this output and perform any actions based on the output.

The microprocessor executes a controller, in some embodiments, that provides the neural network instructions to the computation fabric. Some embodiments provide these instructions to the computation fabric incrementally. For instance, in some embodiments, the system controller on the microprocessor initially loads the instructions for the first layer (or a first portion of the first layer) of the neural network, then waits for a signal from the fabric indicating that these instructions have been completed. Once the first portion of the network is completed by the fabric, the system controller provides the fabric with the instructions for the second portion (either a second portion of the first layer, or the second layer of the network), and so on until the network has been fully executed.

As mentioned, the neural network computation fabric includes numerous cores as well as a global channel that connects the cores, with the various data processing circuits configured by the hierarchical set of control circuits. These data processing circuits operate to compute neural network operations in an efficient, low-power manner, according to the configuration data provided by the control circuits.

A typical neural network operates in layers, with each layer including numerous nodes. Examples of neural networks include feed-forward neural networks, regulatory feedback networks, radial basis function networks, recurrent networks, etc. In convolutional neural networks (a type of feed-forward network), a majority of the layers include computation nodes with both a linear function followed by a non-linear activation function (applied to the result of the linear function). The linear function is a dot product of input values (either the initial inputs based on the input data for the first layer, or outputs of the previous layer for subsequent layers) and predetermined (trained) weight values, along with bias (addition) and scale (multiplication) terms, which are also predetermined based on training. As such, for convolutional neural networks, the dot products are the primary computation that uses the most circuit resources.

The neural network computation circuit of some embodiments computes numerous neural network nodes simultaneously, with the computation for one node spread across multiple cores (and subsequently the global channel). That is, each of several cores of the computation fabric computes a partial dot product from a subset of the input values and weight values for the node. In some embodiments, a set of input values are used as the input to multiple nodes in a layer, so a core simultaneously computes the dot products of these input values with multiple sets of weight values. Similarly, a set of weight values (referred to as a filter, or filter slice when that filter is divided across multiple cores) are used as the weights for numerous nodes with different sets of input values, so in some embodiments the cores load sets of weight values once and then compute dot products of these weight values with numerous different sets of input values.

For a dot product computed across more than one core, these multiple cores compute partial dot products and provide these partial dot products to the global channel. In the simplest case, all of the partial dot products for a given computation node are computed in the same clock cycle and provided at the same time to the global channel. In some cases, however (e.g., for dot products with a very large number of terms), each core computes more than one partial dot product, requiring multiple clock cycles. Based on configuration data specifying which outputs from the cores are to be added together (and whether multiple partial dot products are required from the same core), the global channel aggregates these partial dot products to compute the complete dot product for each node, then applies various post-processing functions (e.g., the bias, scale, and non-linear activation functions) to compute the output of each node.

In some embodiments, each segment of the global channel includes a dot product bus, a set of post-processing circuits, and an output bus. The dot product bus, in some embodiments, includes a number of independent dot product bus lanes that each receives partial dot products from the cores, aggregates these dot products together, and provides the aggregated dot products to the post-processing circuits. In some embodiments, configuration data specifies to which post-processing unit each aggregated dot product is sent. Each lane of the dot product bus spans all of the channel segments, each of which aggregates the partial dot products from its own cores.

In some embodiments, each segment includes the same number of post-processing units as dot product bus lanes, with each post-processing unit receiving the output of a different dot product bus lane as its primary input. The post-processing units, as mentioned, perform the non-dot product functions of the neural network nodes. For a typical computation node of a convolutional (or fully-connected) layer, this includes a bias factor, a scaling factor, and a non-linear activation function. The non-linear activation function, in some embodiments, is implemented as a lookup table rather than a hardwired function. In some embodiments, the outputs of the linear function are quantized or truncated to a particular number of bits (e.g., 4 bits). Using a small, fixed number of bits for the outputs of each computation node allows for (i) power and resource savings by enabling smaller computations and (ii) certainty in the scheduling of computations (i.e., by knowing that all input values will be within a particular range) that enables further power and resource savings in design.

In addition to these operations, in some embodiments the post-processing units include additional circuitry for (i) performing additional dot product operations if required and (ii) performing operations for neural network computation nodes that do not use dot products. The post-processing units of some embodiments each have the ability to combine dot products from two separate cycles (e.g., if a dot product is too large to be computed in a single cycle across the cores of the computation fabric, if a filter slice needs to be split between two cores, or if larger input values are used). Neural network computation nodes that do not use dot products include, for example, pooling layers of convolutional networks (e.g., average pooling and max pooling layers) as well as nodes that perform element-wise operations. In some of these embodiments, the cores provide input values directly to the post-processing units without computing dot products, and the post-processing units are configured to perform the appropriate operations on these inputs.

The output bus carries the computation node outputs from the post-processing units back to the cores, to be stored in the memory of the core and used as inputs for the next layer of neural network computation nodes. In some embodiments, the output values may be computed by post-processing units in one cluster but carried to a core in another cluster to be stored. For efficiency, the compiler of some embodiments (a software program that generates the configuration data for enabling the IC to execute a particular neural network) attempts to optimize the location of the post-processing unit for each computation node output relative to the cores used to compute the constituent partial dot products for that computation node and the destination core for the output value.

As mentioned, the cores compute partial dot products in parallel that are provided to the dot product bus of the local channel segment. In some embodiments, the cores include memory that stores the weight values and input values, an input buffer into which input values are loaded for the partial dot product computations, a set of weight value buffers into which weight values are loaded for the partial dot product computations, a controller or set of controller circuits for loading the input values and weight values from memory into the respective buffers, and a set of partial dot product computation circuits.

In some embodiments, the number of partial dot product computation circuits in each core is equal to (i) the number of weight value buffers in the core (or half of the number of weight value buffers, if primary and secondary buffers are used), (ii) the number of independent lanes of the dot product bus, and (iii) the number of post-processing units of each segment of the global channel. Thus, for a typical neural network computation node, the partial dot products computed by the partial dot product computation circuits having a particular index are aggregated by the dot product bus lane with the same index and that aggregated dot product is provided for post-processing to one of the post-processing units with the same index (i.e., the post-processing unit with that index in one of the channel segments).

As mentioned, each core includes one input value buffer and numerous weight value buffers in some embodiments. In convolutional neural networks, a set of input values are used as the inputs to a number of different nodes, and each layer has numerous different filters (sets of weight values). For parallelization within the cores, such a set of input values are loaded into the input value buffers of the cores used to compute the dot product for a node (by computing partial dot products that are then aggregated), while the weight values for each of these different nodes are loaded into the weight value buffers (for a node computed across multiple cores, the weight values for a given node are loaded into the weight value buffers with the same index in each of the cores). The partial dot product computation circuits corresponding to these weight value buffers then simultaneously compute the partial dot product computations for the loaded input values.

In some embodiments, the weight values for each layer of the network are ternary values (e.g., each weight is either zero, a positive value, or the negation of the positive value), with at least a fixed percentage (e.g., 75%) of the weight values being zero. Using ternary weight values allows for the weights to be treated as $\{0, 1, -1\}$ (with a potential multiplication by the actual positive weight value in the post-processor), such that the multiplication of each input value by its weight value can be handled with a simple circuit that avoids actual multiplier circuits. The remainder of the partial dot product computation in a core can then be computed with an adder tree. The sparsity requirement allows for some embodiments to reduce the size of the partial dot product computation circuits by mapping each of a first number of input values (e.g., 144) to a second number of dot product inputs (e.g., 36), such that each input value with a non-zero corresponding weight value is mapped to a different one of the dot product inputs.

Specifically, in some embodiments, the partial dot product computation circuits include at least two sets of wires for each input value, with each of the sets of wires for a given input value providing that input value to two different dot product inputs. With a guarantee of at least 75% weight sparsity (i.e., at least 75% of the weight values for any set of input values are zero), the number of dot product inputs is set at 25% (or slightly more than 25%, for redundancy) of the number of input values provided to the circuit. In some embodiments, the weight sparsity is guaranteed by the training algorithm used to train the weights to perform a specific purpose, and the neural network computation circuit is adaptable for any set of weights that meets the guarantee. In some cases, individual partial dot product computations will not meet the sparsity requirement, and solutions for handling these situations are described below. In addition to storing discrete weight values (e.g., 0, 1, and −1), in some embodiments the input values (which, other than for the first layer, are output values of previous computation nodes) are discrete values (e.g., 4-bit values).

The use of small (1 or 2-bit) weight values and consistently-sized (e.g., 4-bit) input values allows for optimizing the storage of these values in the core memories. In some embodiments, the weight and input values are aligned both within a core and between cores in such a way as to optimize (i) the efficient retrieval and usage of these values to compute the dot products of the neural network computation nodes and (ii) the minimization of the configuration instructions that the controller circuit hierarchy sends to the core controllers in order to execute this retrieval and usage of the values.

The compiler of some embodiments determines the storage location of each of the weight and input values according to sets of rules defined for how these values should be aligned in the memory. In some embodiments, the weight values for all layers of the neural network are stored in the memory at startup (boot time) of the IC (as the weight values are the same for all inputs processed by the neural network), whereas the input values are determined (and stored) during runtime (these values are different for each input processed by the neural network).

Each core of the neural network computation fabric of some embodiments includes the same circuit structure, including the same amount of memory (e.g., random access memory). In each core, this memory is divided between weight memory and activation memory. The weight memory partition is typically larger than the activation memory partition because the weight memory stores all of the weights for the network whereas the activation memory only stores the input/output values for a small number of layers at a time. In some embodiments, at least two layers of activations are stored at a time (i.e., the inputs for a current layer as well as the outputs for that layer, which are the inputs to the next layer). Because some layers have too many filters for the entire layer to be computed in a single pass, the input activation values for that layer cannot be overwritten immediately by the output activation values for that layer (as these inputs will be needed for second/third/etc. passes to generate additional output activation values for the layer).

In some embodiments, the compiler determines how many and which cores store the activation values for each layer of the network. The cores that store the input values for a layer are referred to as "source cores" for the layer and the cores to which the output values for the layer are written are referred to as the "destination cores" for the layer (these are then the source cores for the next layer). In general, the compiler will select cores within the same cluster before expanding to additional clusters (i.e., if only four source cores are to be used, the compiler will choose a single cluster rather than two cores of one cluster and two cores of a second cluster). Irrespective of the number of source cores used for a layer, in some embodiments the activation values are aligned across cores, with the same memory locations used in each source core to store the input activation values for the layer. Depending on the structure of the input activation values for a layer (described further below), the number of input activation values stored in each core may differ slightly. However, some embodiments always start the input activation values for a layer at the same memory location in each source core, and use zero-padding in the source cores with fewer activation values.

For convolutional neural networks, the input activation values for each layer (or at least each convolutional layer) are conceptually represented a three-dimensional array. This three-dimensional array is structured as numerous two-dimensional grids. For instance, the initial input for an image is three two-dimensional pixel grids (e.g., a 1280×720 RGB image will have three 1280×720 input grids, one for each of the red, green, and blue channels). The number of input grids for each subsequent layer is determined by the number of filters used in the previous layer (assuming standard convolutional layers). The size of the grids for the subsequent layer depends on the number of computation nodes in the previous layer, which is based on the size of the filters and how those filters are convolved over the previous layer input activations.

For a typical convolutional layer, each filter is a small kernel of weights (often 3×3 or 5×5) with a depth equal to the number of grids of the layer's input activations. The dot product for each computation node of the layer multiplies the weights of a filter by a subset of the coordinates of the input activation values. For example, the input activations for a 3×3×Z filter are the activation values located at the same 3×3 square of all Z input activation grids for a layer.

To optimize the dot product computations, all of the input activations for a single grid are stored in the same source core, and the total number of grids is divided evenly across the source cores (i.e., if there are Q source cores, then each source core stores the activations of 1/Q of the grids). If the number of grids is not evenly divisible by the number of source cores, then some embodiments use grids of zeros to even out the number of activations in each core.

These activations within a core are not necessarily arranged with all of the activation values of a grid stored contiguously. Instead, within each core, some embodiments store all of the activations for a particular coordinate (i.e., an x-y coordinate) within the grids assigned to that core contiguously. That is, each activation has an x-coordinate, y-coordinate, and z-coordinate in the three-dimensional array, with the z-coordinate indicating the grid to which the activation belongs. Thus, in some embodiments, the activation memory for a layer in a particular core starts with the activations at (0,0) for all of the grids assigned to that core. In some embodiments, if there are more grids assigned to a core than the number of activation values that a memory location (i.e., a RAM word) can store, then these are split up into separate sets of activations, and only a single memory location worth of activation values at the same coordinate are stored contiguously. As a result, a given memory location in one source core for a layer will store activations for the same x-y coordinates as that memory location in any of the other source cores.

As mentioned, arranging the input activation values for a layer in this manner enables optimized use of these activation values for computing dot products of the various computation nodes of a layer. Specifically, the arrangement (and use of a cache for words that are read but not fully loaded into the input buffer) enables the cores to load the values into the input buffer while minimizing the number of memory reads that are required. In addition, the buffer is implemented as a configurable shift register, so that activation values do not need to be re-loaded between subsequent sets of dot product computations.

In some embodiments, when a controller in the core reads a memory location (i.e., a RAM word) storing activation values, the controller stores the contents of the RAM word in a cache. In addition, the activation values from that RAM word that are required for the next set of dot product computations are loaded into the correct locations in the input buffer of the core. In many cases, multiple RAM words are read in order to load the initial values for a layer into the input buffer, and the cache of some embodiments can hold multiple RAM words (e.g., up to a fixed maximum) at once. Once all of the activations are loaded (and the weights for the layer or layer portion are loaded into the weight buffer), the neural network computation fabric computes the set of dot products (i.e., separate dot products between the set of activations and each of the loaded filters), performs the post-processing for the computation nodes, and provides the computed output activation values to the appropriate destination cores. After this computation, the values in the input buffer are shifted by a predetermined amount that depends on both the filter size and the number of columns in the grid by which the filter moves between computations (the "slide" value). For instance, for a 3×3 filter with a slide value of 1, then in some embodiments that group the activation values of each two-dimensional grid together within the buffer, each group is shifted by 3 values (such that 3 new values are loaded into the buffer for each two-dimensional grid stored in the core). For the next set of dot products, the controller preferably loads this next set of values (i.e., 3 activation values from the next column in each grid) from the cache if possible, without an additional memory read. However, if some or all of these new values are stored in memory locations not already in the cache, then the controller reads the required memory locations (and stores these in the cache). This process can be repeated for each subsequent set of dot products until the end of the current row is reached, in some embodiments.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Some embodiments provide an integrated circuit (IC) for implementing a machine-trained network (e.g., a neural network). The IC of some embodiments includes a set of input processing circuits, a neural network computation fabric (also referred to as a neural network inference circuit) that can be configured to apply a neural network to a set of input values, and a microprocessor (e.g., for controlling the input processing circuits and configuring the neural network computation fabric). The neural network computation fabric of some embodiments includes (i) a set of cores that compute dot products of input values and corresponding weight values and (ii) a channel that aggregates these dot products and performs post-processing operations (as well as performs other operations), in order to compute the outputs of neural network computation nodes.

Figure 1:
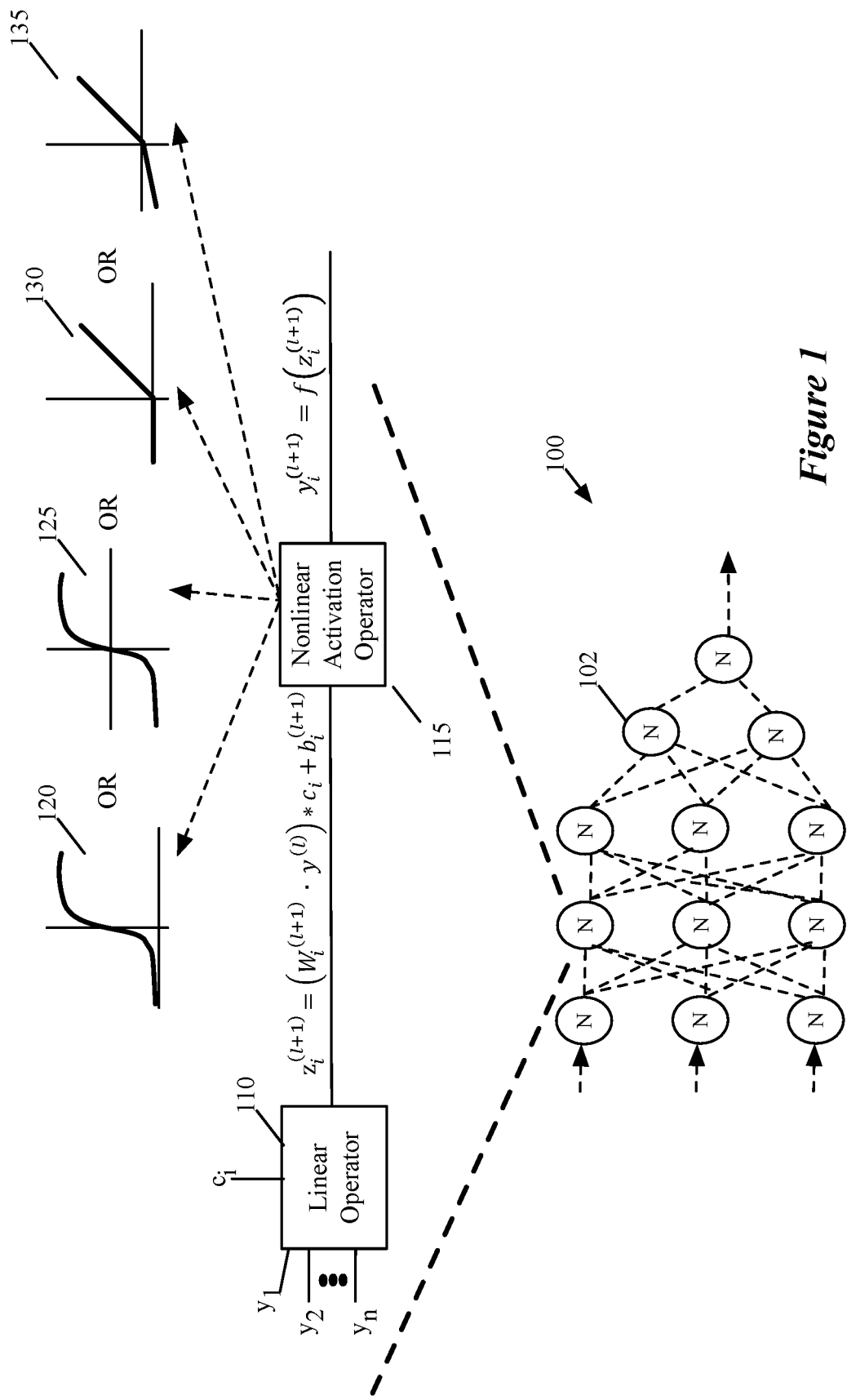
FIG. 1 illustrates an example of a multi-layer machine-trained network of some embodiments.

FIG. 1 illustrates an example of a multi-layer machine-trained network of some embodiments. This figure illustrates a feed-forward neural network 100 that has multiple layers of processing nodes 102 (also called neurons). In all but the first (input) and last (output) layer, each node 102 receives two or more outputs of nodes from earlier processing node layers and provides its output to one or more nodes in subsequent layers. The output of the node (or nodes) in the last layer represents the output of the network 100. In different embodiments, the output of the network 100 is a number in a range of values (e.g., 0 to 1), a vector representing a point in an N-dimensional space (e.g., a 128-dimensional vector), or a value representing one of a predefined set of categories (e.g., for a network that classifies each input into one of eight possible outputs, the output could be a three-bit value).

In this example, the neural network 100 only has one output node. Other neural networks of other embodiments have several output nodes that provide more than one output value. Furthermore, while the network 100 includes only a few nodes 102 per layer, a typical neural network may include a varying number of nodes per layer (with some layers having several thousand nodes) and significantly more layers than shown (e.g., several dozen layers). In addition, the neural networks of other embodiments may be types of networks other than feed forward networks (e.g., recurrent networks, regulatory feedback networks, radial basis function networks, etc.).

The illustrated network 100 is a fully-connected network in which each node in a particular layer receives as inputs all of the outputs from the previous layer. However, the neural networks of some embodiments are convolutional feed-forward neural networks. In this case, the intermediate layers (referred to as "hidden" layers) may include convolutional layers, pooling layers, fully-connected layers, and normalization layers. The convolutional layers of some embodiments use a small kernel (e.g., 3×3×3) to process each tile of pixels in an image with the same set of parameters. The kernels (also referred to as filters) are three-dimensional, and multiple kernels are used to process each group of input values in in a layer (resulting in a three-dimensional output). Pooling layers combine the outputs of clusters of nodes from one layer into a single node at the next layer, as part of the process of reducing an image (which may have a large number of pixels) or other input item down to a single output (e.g., a vector output). In some embodiments, pooling layers can use max pooling (in which the maximum value among the clusters of node outputs is selected) or average pooling (in which the clusters of node outputs are averaged).

As shown in FIG. 1, each node in the neural network 100 has a linear component 110 and a nonlinear component 115. The linear component 110 of each hidden or output node in this example computes a dot product of a vector of weight coefficients and a vector of output values of prior nodes, plus an offset. In other words, a hidden or output node's linear operator computes a weighted sum of its inputs (which are outputs of the previous layer of nodes) plus an offset (also referred to as a bias). Similarly, the linear component 110 of each input node of some embodiments computes a dot product of a vector of weight coefficients and a vector of input values, plus an offset. In other embodiments, each input node receives a single input and passes that input as its output. Each node's nonlinear component 115 computes a function based on the output of the node's linear component 110. This function is commonly referred to as the activation function, and the outputs of the node (which are then used as inputs to the next layer of nodes) are referred to as activations.

The notation of FIG. 1 can be described as follows. Consider a neural network with L hidden layers (i.e., L layers that are not the input layer or the output layer). The variable l can be any of the hidden layers (i.e., l ∈ {1, ..., L−1} index the hidden layers of the network, with l=0 representing the input layer and l=L representing the output layer). The variable $z_i^{(l+1)}$ represents the output of the linear component of a hidden node i in layer l+1. As indicated by the following Equation (A), the variable $z_i^{(l+1)}$ is computed as the dot product of a vector of weight values $W_i^{(l+1)}$ and a vector of outputs $y^{(l)}$ from layer l multiplied by a constant value $c_i$, and offset by a bias value $b_i$:

$$z_i^{(l+1)} = (W_i^{(l+1)} \cdot y^{(l)}) * c_i + b_i^{(l+1)} = \sum_{k=1}^{n}(w_{ik}^{(l+1)} * y_k^{(l)}) * c_i + b_i^{(l+1)}. \quad (A)$$

The constant value $c_i$ is a value to which all the weight values are normalized. In some embodiments, the constant value $c_i$ is 1. The symbol * is an element-wise product, while the symbol · is the dot product. The weight coefficients $W^{(l)}$ are parameters that are adjusted during the network's training in order to configure the network to solve a particular problem (e.g., object or face recognition in images, voice analysis in audio, depth analysis in images, etc.). In some embodiments, the training algorithm imposes certain constraints on the weight values. Specifically, some embodiments impose a ternary constraint that requires all of the weight values for any given layer to be either zero, a positive value, or a negation of the positive value (e.g., 0, 1, and −1). In addition, some embodiments use a training technique that maximizes the number of weight values that are equal to zero (such that, e.g., 75% or 90% of the weight values equal zero).

The output $y^{(l+1)}$ of the nonlinear component 115 of a node in layer l+1 is a function of the node's linear component, and can be expressed as by Equation (B) below:

$$y_i^{(l+1)} = f(z_i^{(l+1)}). \quad (B)$$

In this equation, $f$ is the nonlinear activation function for node i. Examples of such activation functions include a sigmoid function 120 ($f(x)=1/(1+e^{-x})$), a tanh function 125, a ReLU (rectified linear unit) function 130 or a leaky ReLU function 135, as shown.

Traditionally, the sigmoid function and the tanh function have been the activation functions of choice. More recently, the ReLU function ($f(x)=\max(0, x)$) has been proposed for the activation function in order to make it easier to compute the activation function. See Nair, Vinod and Hinton, Geoffrey E., "Rectified linear units improve restricted Boltzmann machines," ICML, pp. 807-814, 2010. Even more recently, the leaky ReLU has been proposed in order to simplify the training of the processing nodes by replacing the flat section (i.e., x<0) of the ReLU function with a section that has a slight slope. See He, Kaiming, Zhang, Xiangyu, Ren, Shaoqing, and Sun, Jian, "Delving deep into rectifiers: Surpassing human-level performance on imagenet classification," arXiv preprint arXiv:1502.01852, 2015. In some embodiments, the activation functions can be other types of functions, like cup functions and periodic functions.

Equation (B) can be expressed in the following expanded format of Equation (C):

$$y_i^{(l+1)} = f(z_i^{(l+1)}) = f\left[\left(\sum_{k=1}^{n} w_{ik} * y_k\right) * c_i + b_i^{(l+1)}\right]. \quad (C)$$

In this equation, $w_{ik}$ are weight values associated with the inputs $y_k$ of the node i in layer l+1.

Before a multi-layer network can be used to solve a particular problem, the network is put through a supervised training process that adjusts the network's configurable parameters (e.g., the weight coefficients of its linear components). The training process iteratively selects different input value sets with known output value sets. For each selected input value set, the training process typically (1) forward propagates the input value set through the network's nodes to produce a computed output value set and then (2) backpropagates a gradient (rate of change) of a loss function (output error) that quantifies in a particular way the difference between the input set's known output value set and the input set's computed output value set, in order to adjust the network's configurable parameters (e.g., the weight values).

Figure 2:
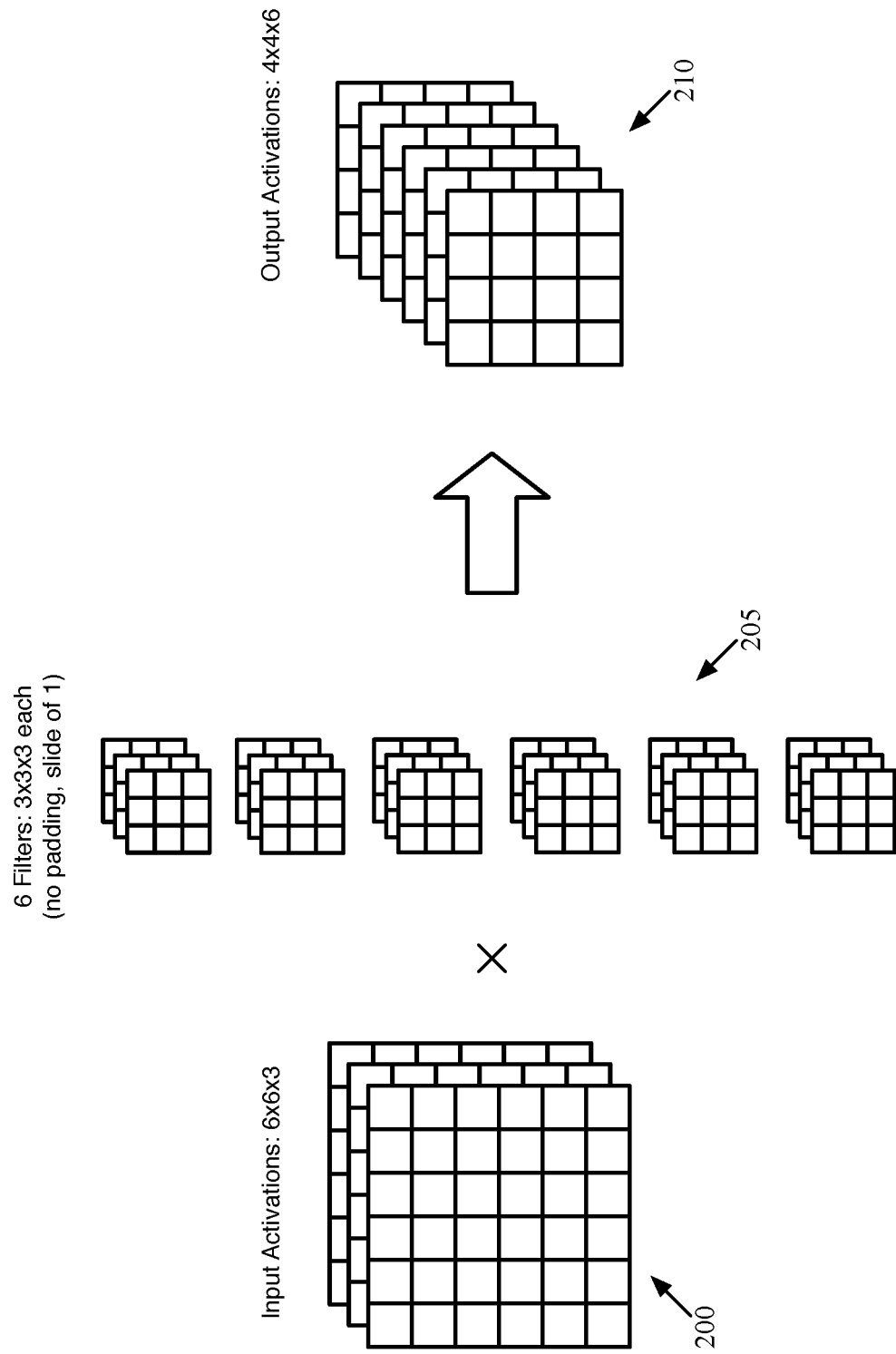
FIG. 2 conceptually illustrates a representation of a convolutional layer of a convolutional neural network.

FIG. 2 conceptually illustrates a representation of a convolutional layer of a convolutional neural network. The convolutional layer receives a set of input activation values 200 organized as a three-dimensional array. This three-dimensional array is either (i) a set of input values for the network, if the convolutional layer is the first layer of the network, or (ii) a set of output values of a previous layer of the network (e.g., a previous convolutional layer, a pooling layer, etc.). The array can be conceptualized as a set of two-dimensional grids, as shown in the figure. In this example, the dimensions of the input values is 6×6×3 (i.e., three 6×6 grids).

Each computation node of the convolutional layer involves a linear component (e.g., a dot product followed by scaling and bias functions) as well as a non-linear component, as described above. The input to each computation node is a subset of the input activation values, and the dot product for the computation node involves multiplying those input activation values by one of the filters of the layer. As shown, in this example the layer includes six filters 205, each of which are 3×3×3. Each value in one of the filters is a weight value that is trained using the techniques described above. Thus, in the example shown in this figure, each filter includes 27 trainable weight values.

The size of the filters in the x and y directions can vary (3×3 and 5×5 are common sizes), but in some embodiments the depth is required to match the depth of the input activations (in this case there are three grids, so the depth is three). The number of filters in a given layer can also vary—in general, each filter is attempting to identify the presence of a particular feature in the input values. For instance, in image analysis, a filter in an early layer might test for the presence of an edge in a particular direction while a filter in a later layer tests for the presence of a more specific object type in the image (e.g., a nose).

To generate the output activations, each of the filters 205 is applied to numerous subsets of the input activation values. Specifically, in a typical convolution layer, each 3×3×3 filter is moved across the three-dimensional array of activation values, and the dot product between the 27 activations in the current subset and the 27 weight values in the filter is computed. This process starts in the top left corner (i.e., x=0-2, y=0-2) of the grid, and includes the full depth of the array. The filter moves across the rows, in this case using a slide of 1 (i.e., moving one column per computation node, such that the second dot product uses activations at x=1-3, y=0-2). When the end of a row is reached, the filter is moved back to the first columns (i.e., x=0-2) and down one row (i.e., y=1-3), and so on until the bottom right corner of the array is reached. Though not the case in this example, some embodiments use zero-padding at the edges of the grids.

The output activation values 210 are arranged in a 4×4×6 array in this example. The outputs from a single filter are arranged in a single grid, and because the example has six filter 205 the output activations have six grids. Using a slide value of 1 with no zero-padding results in a 4×4 output grid for each filter. These output activation values 210 are then the input activation values for the next layer of the neural network.

As mentioned, some embodiments provide an IC that implements a machine-trained network such as that shown in FIG. 1 (e.g., a convolutional neural network with layers similar in structure to that shown in FIG. 2). The ICs of some embodiments are configurable to implement different networks trained to perform a particular function, which may have various different arrangements of nodes and different trained weight values. For instance, the ICs may implement networks for object or facial recognition in images, voice recognition in audio samples, etc. The IC of some embodiments includes a set of input processing circuits, a neural network computation fabric that can be configured to apply a neural network to an input value, and a microprocessor (e.g., for controlling the input processing circuits and configuring the neural network computation fabric).

Figure 3:
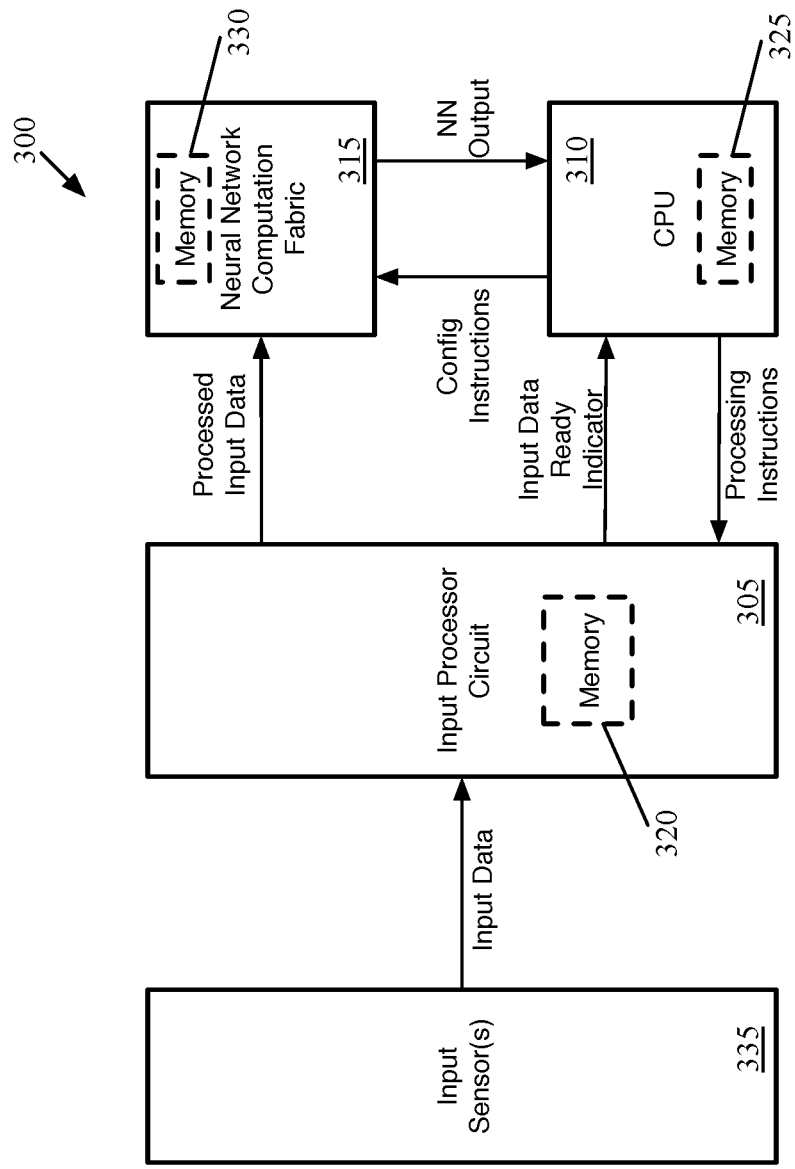
FIG. 3 conceptually illustrates an integrated circuit of some embodiments.

FIG. 3 conceptually illustrates such an IC 300 of some embodiments. As shown, the IC includes an input processor circuit 305, a microprocessor (CPU) 310, and a neural network computation fabric 315. Each of these components 305-315 also has corresponding memory (e.g., random access memory (RAM)) 330. In addition, in some embodiments, the IC is integrated into a device (such as an Internet of Things (IOT) device) with one or more input sensors 335. These input sensors can include cameras (e.g., for capturing video images on which the neural network computation fabric 315 performs face or object recognition, etc.), microphones (e.g., for capturing audio on which the neural network computation fabric 315 performs voice recognition, speech processing, etc.), or other types of input sensors. In other embodiments, the input sensors 335 are located on a separate device that is linked with the IC 300.

In some embodiments, at bootup of the IC 300, the CPU 310 loads neural network configuration data (e.g., weight values, scale and bias parameters, lookup table masks for each layer, memory locations for the weight and input values to use for computing each layer of the network, etc.) from off-chip storage and generates instructions for the neural network computation fabric 315 to write the weight values and other data to its memory 330. In addition, the CPU 310 loads the neural network program instructions for the computation fabric to its own memory 325. These instructions are applied by the computation fabric 315 to input data in order to execute the neural network. These runtime instructions include, e.g., indications as to which pre-loaded sets of instructions to use for each set of calculations, etc.

The input processor circuit 305 receives input data (e.g., still images or video frames, sounds, etc.) from the input sensor(s) 335, and processes these according to processing instructions received from the CPU 310. The CPU 310 stores in its memory instructions for the input processor circuit to prepare input data for the computation fabric 315 as well as the neural network program instructions. These instructions identify, in some embodiments, any sort of initial processing to apply to the raw data (e.g., decompression of compressed data, etc.) as well as how to arrange the data to be provided to the computation fabric 315. For an image, e.g., these instructions might specify the order in which the pixels should be arranged and streamed to the computation fabric 315, so that the computation fabric stores this data in the appropriate locations of its memory 330 for subsequent operations. The input processor circuit 305 also sends signals to the CPU 310 to indicate when it has fully buffered an input (e.g., a frame of video) and when the input is prepared to be sent to the computation fabric 315.

In addition to instructing the input processor circuit 305 how and when to provide input data to the computation fabric 315, the CPU 310 provides the neural network program instructions to the computation fabric. In some embodiments the CPU 310 provides these instructions in stages (e.g., one layer or portion of a layer at a time). Once the final output of the neural network is computed, the fabric 315 provides this output back to the CPU, so that the CPU (or other circuitry on the device) can evaluate this output and perform any actions based on the output.

The computation fabric of some embodiments provides a set of circuits for performing the various computations required for neural networks (e.g., dot product computations, scaler and bias operations, activation functions, etc.), with the network parameters (weight values, bias values, node arrangement, filter size, etc.) configurable. In some embodiments, the computation fabric imposes certain requirements on the networks, such as a maximum size of the network (i.e., a maximum size of the dot product computations), that the weight values be ternary (e.g., 0, α, and −α for each layer of the network), and/or that at least a particular percentage of the weight values be equal to zero.

Figure 4:
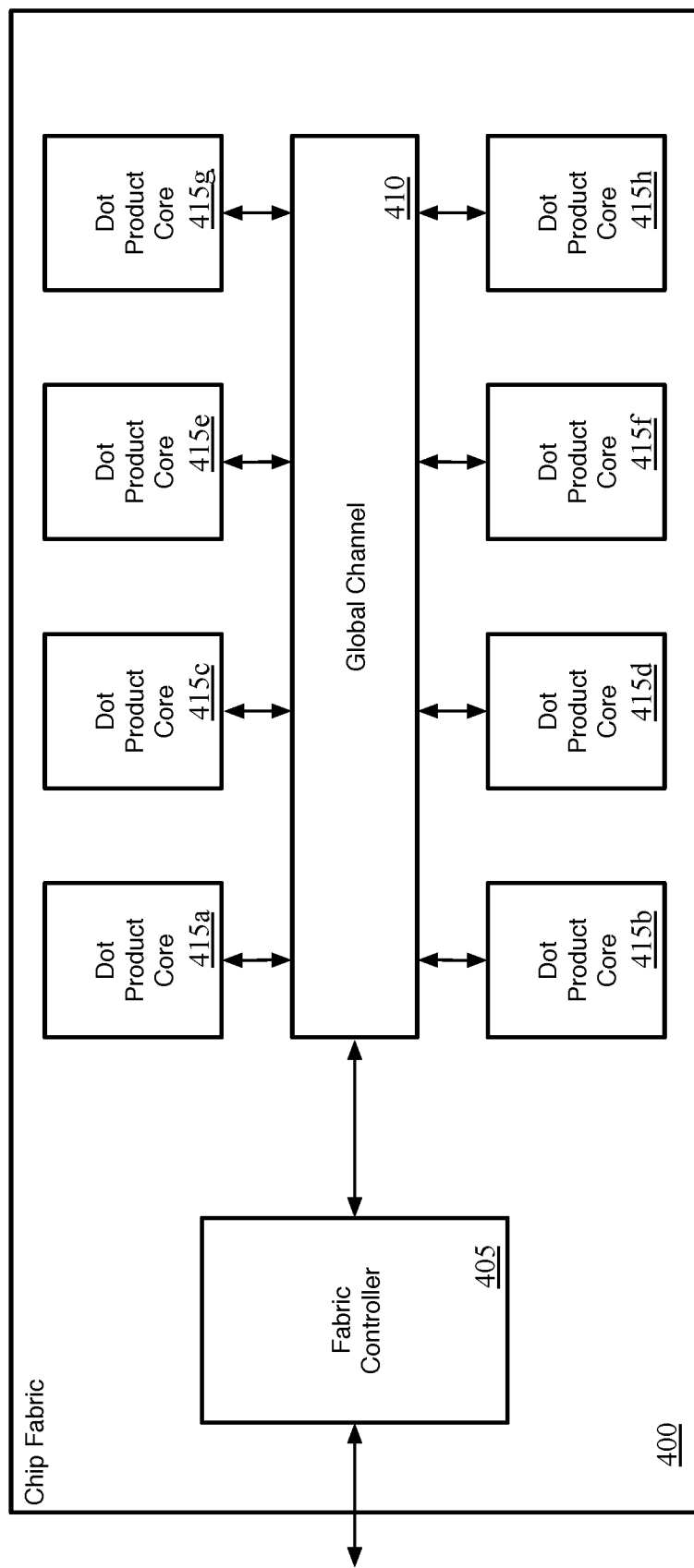
FIG. 4 conceptually illustrates the neural network computation fabric of some embodiments.

FIG. 4 conceptually illustrates the neural network computation fabric 400 (also referred to as the chip fabric) of some embodiments. The chip fabric 400 of some embodiments includes a fabric controller 405, a global channel 410, and a set of dot product cores 415a-h. The connections between the various components 405-415 represent the flow of both control data (e.g., configuration data for a particular neural network layer) and computation data at runtime in some embodiments.

The fabric controller 405 is responsible for managing the operation of the rest of the chip fabric 400 (e.g., the dot product cores 415) in some embodiments. The fabric controller 405 loads instruction arguments (e.g., weight and activation value locations, which cores to use for a particular computation, etc.) from local memory (not shown) on the chip, maps instructions into a sequence of memory-mapped register writes, synchronizes the downstream controllers (e.g., controllers for the various cores 415), etc. The instructions managed by the fabric controller 405 are configured at compile time, in some embodiments, based on the parameters of the network being implemented by the chip fabric 400. In some embodiments, the fabric controller 405 interacts with the microprocessor of the IC as well (i.e., the fabric controller 405 handles the communication with the CPU 310 shown in FIG. 3).

The chip fabric also includes numerous dot product cores 415 as well as a global channel 410 that connects the cores, with these data processing circuits configured by the fabric controller (and a set of hierarchical control circuits, in some embodiments). These data processing circuits 410 and 415 operate to compute neural network operations in an efficient, low-power manner, according to the configuration data provided by the control circuits.

The dot product cores 415a-h include circuitry for computing partial dot products in some embodiments, which is described in further details below. In some embodiments, this circuitry includes memory and/or buffers for storing weights and activations, controllers for reading these values out of memory, and adder trees for computing the partial dot products based on the weight and activation inputs. The core memory, controllers, adder trees, and other core circuitry of some embodiments are described below in greater detail.

The global channel 410 is responsible for providing a communications bus for control and computation data between the fabric controller 405 and the cores 415, as well as from one core to another. The global channel 410, among other operations, accumulates partial dot products from multiple cores when computing dot products that require more computations than can be performed in a single core, and performs post-processing on these dot products. In addition, the global channel 410 carries activations (i.e., computation node outputs) after post-processing for storage (and for use as inputs to subsequent computation nodes) in other cores 415. In some embodiments, the global channel 410 includes an accumulating bus for accumulating the dot products and a non-computation bus for providing activations, weights, and other configuration data to the cores and other computation circuits. In some embodiments, the linear function post-processing and non-linear function for each neural network node are also performed by circuits in the global channel 410.

The chip fabric 400 of some embodiments computes numerous neural network computation nodes simultaneously, with the computation for one node often spread across multiple cores (and subsequently the global channel). In some cases, if a neural network layer is small enough, then computation for that layer may be confined to a single core 415. However, if multiple cores are used for a given layer (any number of cores may be used in some embodiments), then each dot product computed for that layer is spread across all of the cores 415 in use.

That is, for a dot product computed across more than one core 415, each of these cores computes a partial dot product from a subset of the input values and weight values for the node, then provides these partial dot products to the global channel 410. In some embodiments, a set of input values are used as the input to multiple nodes in a layer, so a core simultaneously computes the dot products of these input values with multiple sets of weight values. Similarly, a set of weight values (referred to as a filter, or filter slice when that filter is divided across multiple cores) are used as the weights for numerous nodes with different sets of input values, so in some embodiments the cores load sets of weight values once and then computes dot products of these weight values with numerous different sets of input values.

In the simplest case, all of the partial dot products are computed in the same clock cycle and provided at the same time to the global channel 410. In some cases, however (e.g., for dot products with a very large number of terms or using larger than standard activation values, or when filters have too many nonzero weight values), each core 415 computes more than one partial dot product for a single computation node, requiring multiple clock cycles (also referred to as time-multiplexing of the dot products). Based on configuration data specifying which outputs from the cores are to be added together (and whether multiple partial dot products are required from the same core), the global channel 410 aggregates these partial dot products to compute the complete dot product for each node, then applies various post-processing functions (e.g., the bias, scale, and non-linear activation functions) to compute the output of each node.

Figure 5:
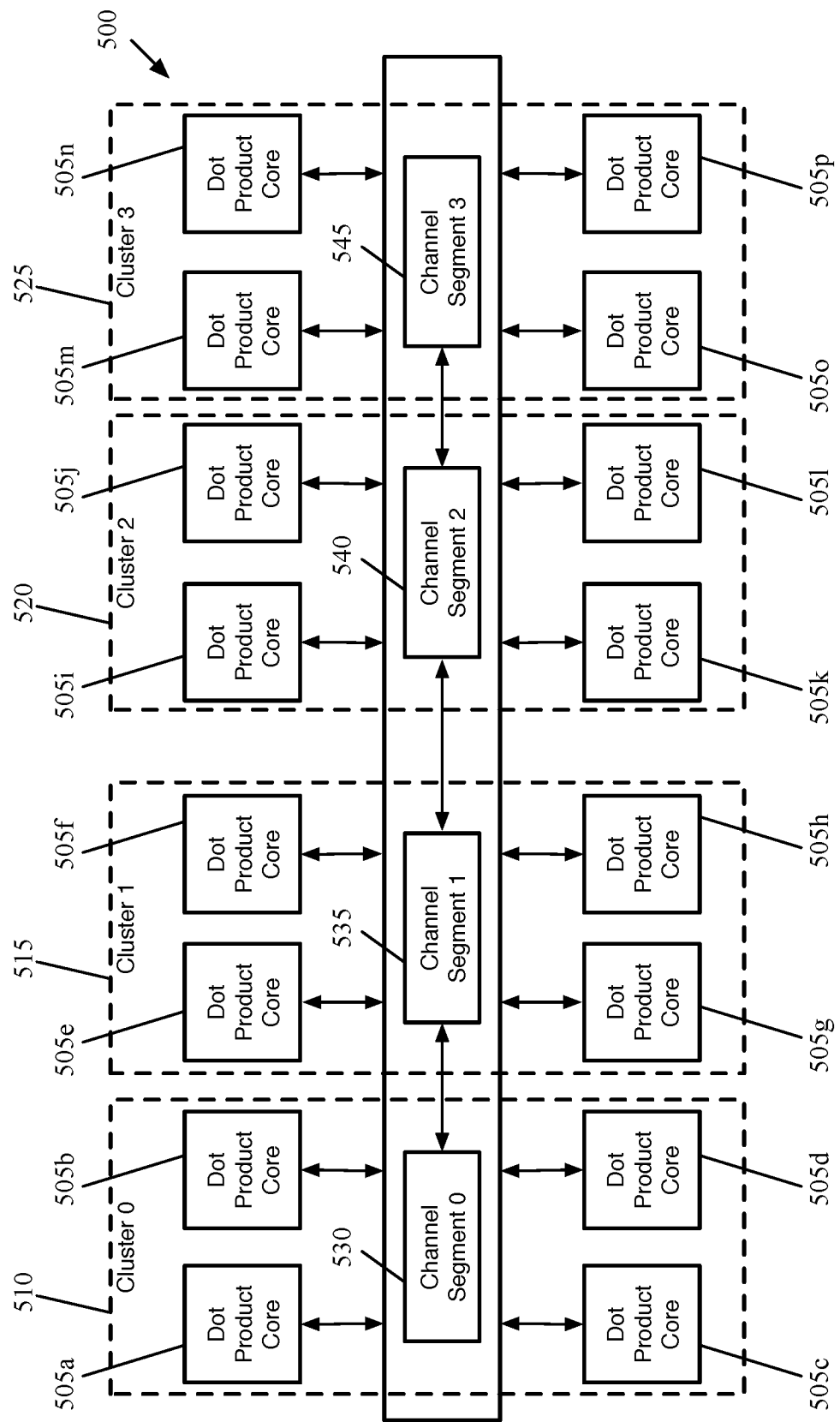
FIG. 5 illustrates a neural network computation fabric of some embodiments with sixteen dot product cores grouped into four clusters.

In some embodiments, the dot product cores are grouped into clusters, and the global channel includes separate segments for each such cluster. FIG. 5 illustrates a neural network computation fabric 500 of some embodiments with sixteen dot product cores 505a-p grouped into four clusters 510-525. In addition, the global channel includes four channel segments 530-545. Each of these channel segments includes the same circuitry in some embodiments, with the exception that buses in the first channel segment 530 and last channel segments 545 only connect to corresponding buses in one other channel segment while the buses in the intermediate channel segments 535 and 540 connect to corresponding buses in two channel segments.

The data processing circuitry of each of the channel segments 530-545 includes a dot product bus, a set of post-processing circuits, and an output bus in some embodiments. The dot product bus receives partial dot products from the cores, aggregates these dot products together, and provides the aggregated dot products to the post-processing circuits. The post-processing circuits perform the non-dot product computations of the neural network computation nodes, which may include a bias (addition) factor, a scaling (multiplication) factor, and a non-linear activation function (e.g., for a node in a convolutional or fully-connected layer). The output of the post-processing circuits are the computation node outputs (activations). The output bus, or activation write bus, carries the outputs of the post-processing circuits to the cores 505a-p to be stored as inputs for the next computation layer.

In some embodiments, each cluster 510-525 or group of clusters (e.g., clusters 510 and 515 being one group and clusters 520 and 525 being a second group) can execute a separate neural network. This allows the fabric to execute multiple networks simultaneously, so long as the networks are not so large as to require more than the cores of the allocated cluster. For instance, a single chip of an IOT device could run both a facial recognition network and an object recognition network, a facial recognition network and a language parsing network, etc.

Figure 6:
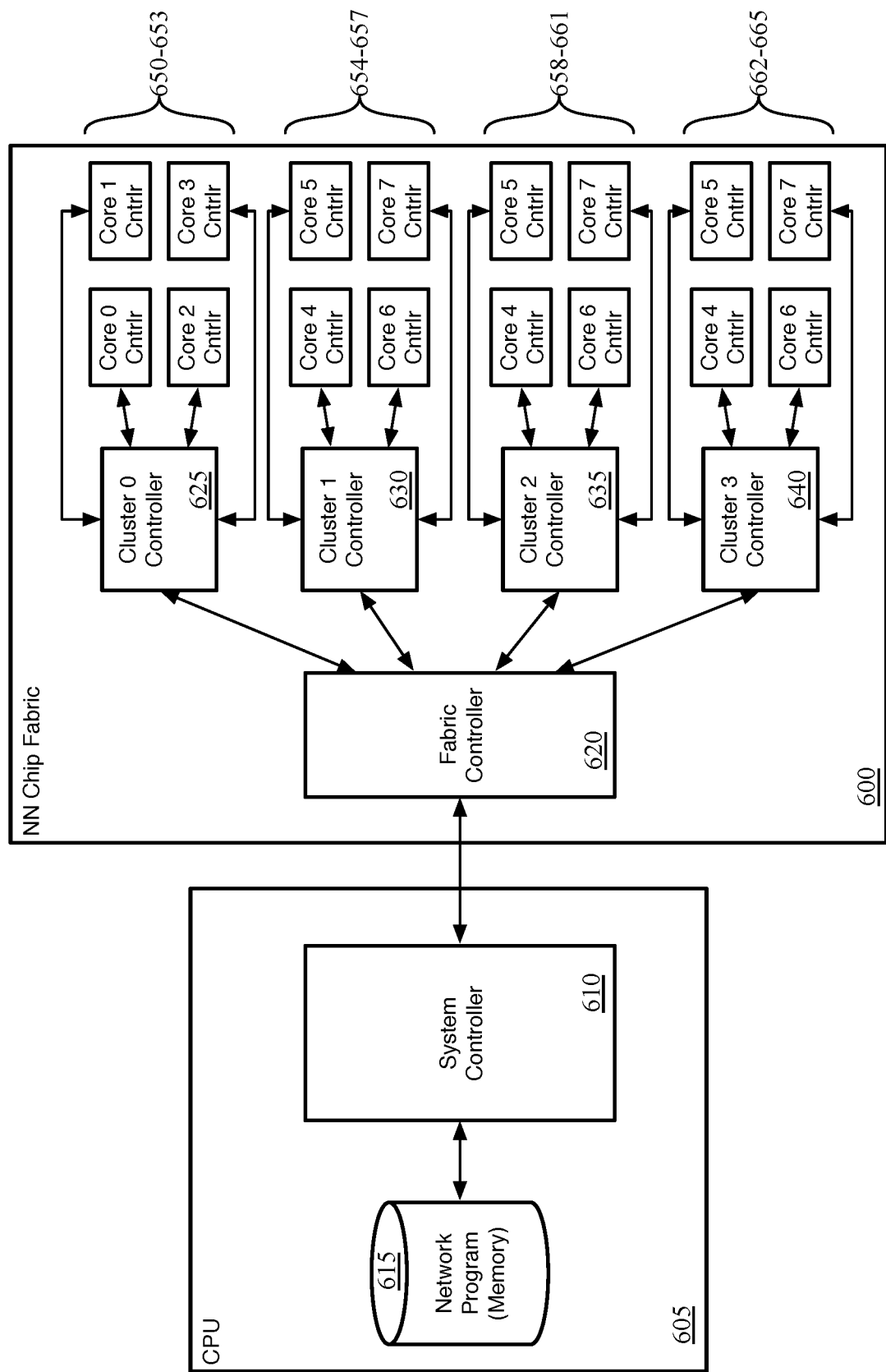
FIG. 6 conceptually illustrates a set of controller circuits for configuring a neural network chip fabric of some embodiments to execute a neural network.

Before describing the structure of the computation circuitry in greater detail, the hierarchical control and configuration of the neural network chip fabric will be described. FIG. 6 conceptually illustrates the set of controller circuits for configuring a neural network chip fabric 600 of some embodiments to execute a neural network. As shown, a CPU 605 executes a system controller 610 and stores a neural network program 615 (i.e., the compiled version of the neural network) in its memory.

The system controller 610 provides the neural network instructions to the chip fabric 600 (per the stored network program 615) for the chip fabric to execute the program on incoming input data (e.g., images, etc.). In some embodiments, the system controller 610 provides these instructions to the chip fabric 600 incrementally. For instance, in some embodiments, the system controller 610 initially loads the instructions for the first layer of the neural network, or a portion of the first layer, then waits for a signal from the chip fabric 600 indicating that these instructions have been completed.

If a layer of the network is small enough to be completed in a single pass, then the compiler of some embodiments schedules the entire layer for one pass. However, in some embodiments, there is a maximum number of filters that can be loaded in a single pass (e.g., 64). In addition, in some embodiments there is a maximum number of output sets that can be written to the same core in the same pass, so this can also constrict the number of filters in a pass. The chip fabric computes the output all of the nodes for each filter loaded (i.e., each pass loads all of the input activations for the layer in the correct order for the outputs to be computed). However, if a layer has more than this maximum number of filters, then the layer will be divided across multiple passes. Once the first portion of the network is completed, the system controller 610 provides the fabric 600 with the instructions for the second portion (e.g., a second layer, or a second pass of the first layer), and so on until the chip fabric has fully executed the network.

The chip fabric 600 includes a hierarchical control structure for configuring the data processing circuitry (i.e., the dot product cores and global channel segments) to execute the neural network instructions from the system controller 610. As shown, the chip fabric 600 of some embodiments includes (i) a fabric controller 620 that interacts with the system controller 610 on the CPU 605, (ii) a set of cluster controllers 625-640, and (iii) a set of core controllers 650-665. Some embodiments include one cluster controller for each cluster of the chip fabric and one core controller for each core (in this case the chip fabric 600 has four clusters with four cores each).

The fabric controller 620 provides the point of interaction with the CPU 605 for the chip fabric 600, receiving neural network program instructions from the system controller 610 and sending signals to the system controller to indicate when instructions have been completed. Upon receiving neural network instructions (e.g., for a layer of the network or portion of a layer), the fabric controller 620 receives these neural network instructions, parses the instructions to identify the active cores (and thus the active clusters), and unpacks additional arguments stored in local instruction memory on the chip fabric. In some embodiments, in order to minimize power usage, the instructions provided from the CPU are high-level commands that the fabric controller parses in order to determine more detailed instructions for the lower-level controllers. Doing so limits control signal power consumption on the chip while encapsulating implementation details of the lower-level (cluster, core) circuits.

For example, in some embodiments the instructions from the system controller 610 to the fabric controller 620 specify to execute a particular pass of a particular layer of the network, and the fabric controller memory includes the required information to execute this specific pass. In some embodiments, this information is conveyed by the system controller instructions specifying to execute a particular type of pass or layer (e.g., convolution) based on the arguments found at a particular memory location of the fabric controller's memory. The specified memory location stores arguments such as the source cores for the computations (i.e., the cores that will perform the dot product calculations) and the destination cores for the output values (i.e., the cores to which the output values are stored), the memory locations in the cores at which to find the weight and/or input values for the computations (in some embodiments, the weight values are loaded into memory initially such that these memory locations are the same across all of the source cores), information for calculating the non-linear activation function for the layer (e.g., the lookup table mapping information), etc.

Because layers may potentially include thousands of output activation values, having the CPU specify a core and RAM location for each such activation value would require a lot of power. Instead, as described, some embodiments specify only a few parameters required for the chip fabric to determine the memory locations for each activation value (e.g., the cores at which the values will be stored, the starting memory address that is the same for each core, and the dimensions of the activation layer). In addition, similar principles apply to the use of input values already stored in RAM (the outputs of the previous layer) for the dot products of the current layer. The weight values and their location in memory, the location of the input values, the lookup table configuration for a layer, etc. are all the same for each network input (e.g., each frame of video) as the network is statically scheduled, so resources can be saved by storing all of this information on the chip at bootup, with a minimal amount of instruction information sent from the CPU for each layer or pass (i.e., only the location in the fabric controller of the arguments for the current layer).

The fabric controller then provides cluster instructions to the cluster controllers for the identified clusters that are in use for the current neural network layer, and waits for completion signals from the clusters indicating that the current set of instructions has been executed (and thus, that the fabric controller can notify the system controller on the CPU that the current set of instructions is complete, causing the system controller to provide the next set of instructions). Avoiding use of some of the clusters when possible provides power savings, as these cores can be powered down, or at least the memories in the cores put to sleep. Even for networks that require the use of all of the cores of the chip fabric, often the initial layers have smaller dot product computations that require fewer cores. In addition, in some embodiments, the fabric controller synchronizes the cluster controllers, ensuring that dot products computed across multiple clusters are aggregated together correctly.

In some embodiments, the cluster instructions provided by the fabric controller are not fully parsed instructions, pushing some of this work to the cluster and/or core controllers. For instance, the fabric controller may only provide the starting memory address for the activations and the activation layer dimensions, allowing the cluster controllers to determine at which core (and the RAM location within that core) each activation value is to be stored. The fabric controller also broadcasts these instructions in some embodiments, while including certain bits that specify the difference in setup between the clusters (or whether certain clusters even need to act on the instructions). Some embodiments broadcast the instructions only to the clusters involved in the computation (which could include clusters with source cores, destination cores, or both). This broadcasting reduces latency and power consumption as compared to sending separate sets of instructions to each cluster.

Each of the cluster controllers 625-640 receives instructions from the fabric controller and configures its own segment of the global channel in addition to parsing the instructions to identify configuration data for each of the cores in its cluster. That is, each cluster controller 625-640 that receives cluster instructions for a given high-level instruction directly configures the dot product bus, the post-processing units, and the activation write bus in its channel segment. In addition, these cluster controllers 625-640 determines which of its cores require the instructions and provides these instructions to the core controllers for these identified cores.

Much as the fabric controller 620 parses the high-level instructions from the system controller 610, the cluster controllers 625-640 of some embodiments decompose the instructions from the fabric controller 620 to determine the configuration data to provide to its channel segment circuits (dot product bus, post-processing units, and activation write bus) as well as the sets of instructions for each of its cores. The cluster controllers configure the channel segment circuits to, e.g., aggregate the partial dot products from the cores correctly (both within a channel segment and across channel segments), provide these aggregated dot products to the post-processing units in the correct channel segment, perform post-processing operations, and provide the output of the post-processors to the correct core. In some embodiments, this information both comes from the fabric controller (e.g., the lookup table mapping for the non-linear activation function) as well as from information stored in cluster controller memory.

The use of separate cluster controllers enables the ability of the chip fabric to execute multiple separate networks simultaneously in some embodiments. The fabric controller 620 can provide instructions to the first cluster controller 625 for a layer of a first neural network and, so long as those instructions do not require the use of other clusters, the first cluster can execute the entire neural network layer in a self-contained manner. At the same time, the fabric controller 620 could provide instructions to the second cluster controller 630 for a layer of a second neural network, with the second cluster executing the entire neural network layer in a self-contained manner. The third and fourth cluster controllers 635 and 640 could receive instructions for third and fourth networks as well, to execute at the same time as the first two. In addition, other combinations of clusters can execute multiple networks simultaneously (e.g., the first two clusters executing a first network and the second two clusters executing a second network, the first two clusters executing a first network while the third and fourth clusters each separately execute second and third networks, etc.

The cluster controllers 625-640, as mentioned, also provide the appropriate configuration data to each of the core controllers 650-665, which coordinate the dot product processing in the core (as well as the direct delivery of input activation values to the global channel for pooling, element-wise operations, etc.). In some embodiments, the cluster controllers do not fully parse the instructions to specify each individual memory read or write, but instead provide the higher-level instructions to each core controller. In addition, some embodiments broadcast the instructions from a particular cluster controller to each of the core controllers within the cluster (or the core controllers for each of the cores active in the current pass), while including certain bits that specify the difference in setup between the cores. This broadcasting reduces latency and power consumption as compared to sending separate sets of instructions to each core.

The core controllers 650-665 then parse these instructions to determine the specific configuration data for the operations of the core. This configuration data includes memory locations for various read operations to read and align weight and activation values, enable bits for the dot product operations, memory locations for write operations after activations have been computed, etc. Once the instructions are fully executed, the core controllers 650-665 send completion signals to the cluster controllers 625-640. Similarly, once the cluster controllers 625-640 receive these completion messages, they send similar messages to the fabric controller 620, which can then notify the system controller executing on the CPU that the instructions are complete. In some embodiments, the last set of neural network instructions is a set of memory read operations, for the computation fabric to deliver the neural network output results to the system controller for any post-processing operations (e.g., a soft-max operation to generate a probability, etc.). After this, the system controller puts the fabric to sleep until the next set of input data is to be processed, in some embodiments. If only a portion of the fabric is involved in executing the neural network (e.g., because one or more clusters execute a different neural network in parallel), then that portion of the fabric is put to sleep in some embodiments.

Figure 7:
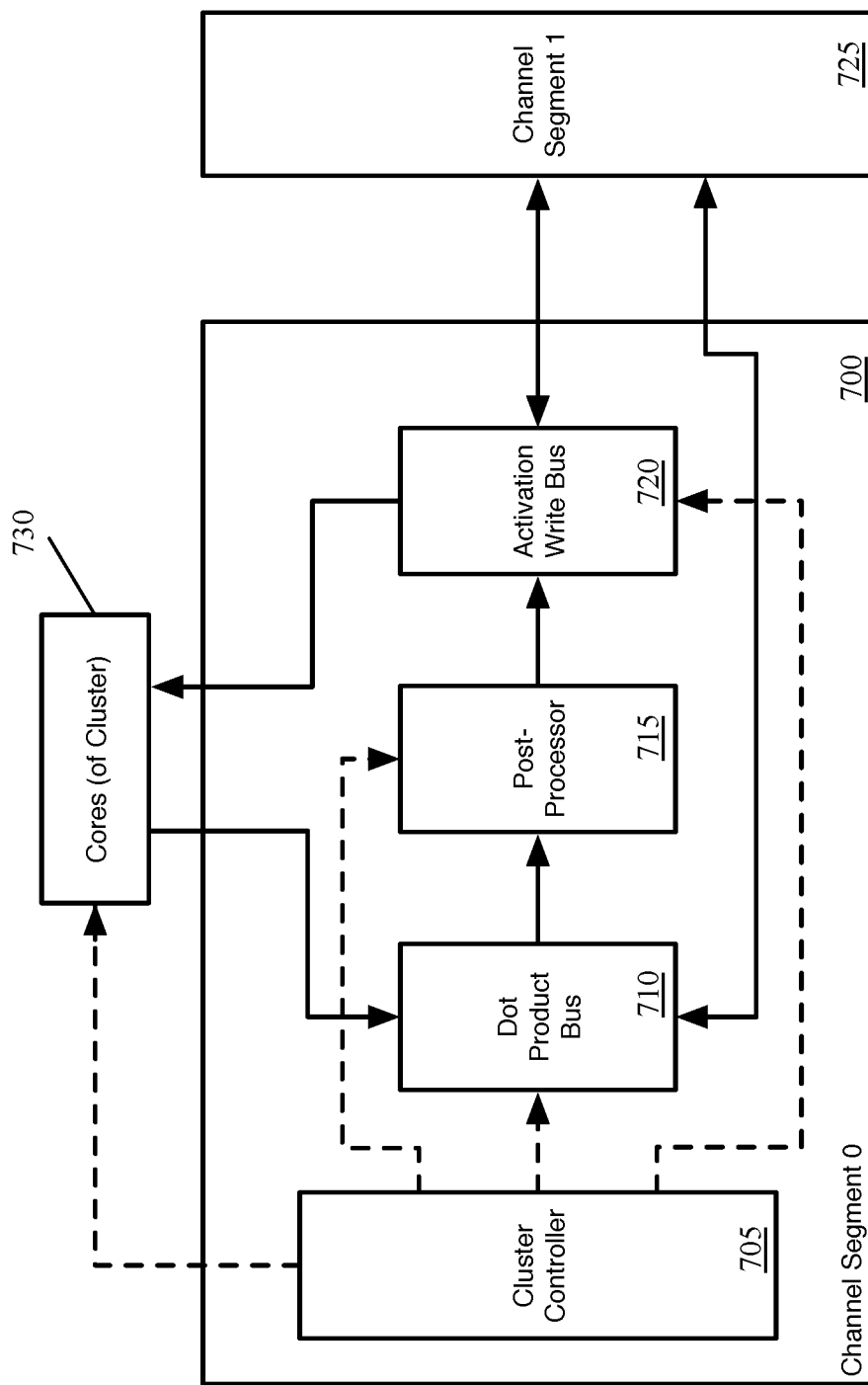
FIG. 7 conceptually illustrates the circuit blocks of a channel segment of some embodiments.

Returning to the neural network computation circuitry, FIG. 7 conceptually illustrates the circuit blocks of a channel segment 700 of some embodiments (e.g., one of the channel segments 530-545 shown in FIG. 5). The channel segment 700 includes a cluster controller 705, a dot product bus 710, a post-processor 715, and an activation write bus 720 (also referred to as an output bus). In addition to the channel segment 700, the figure also illustrates an additional channel segment 725 and the cores 730 of the local cluster for the channel segment 700, as the circuit blocks of the channel segment 700 exchange dot product and configuration data with these other circuits. In this diagram, the dashed lines represent the flow of configuration data while the solid lines represent the flow of neural network computation node data for convolution or fully-connected layer nodes (i.e., nodes that use a dot product based linear function). Additional neural network computation data, such as that flowing directly from the cores 730 to the post-processor 715 for pooling nodes or element-wise operators, is not shown.

The cluster controller 705 configures the dot product bus 710, post-processor 715, and activation write bus 720 as per the configuration instructions received from the fabric controller in some embodiments. For the dot product bus 710, this configuration data specifies, in some embodiments, (i) which partial dot products are to be added together as part of the same neural network computation node and (ii) to which post-processing unit each aggregated dot product is sent (the post-processor 715 of some embodiments includes numerous post-processing units with the same circuitry). In other embodiments, the post-processing unit that receives each aggregated dot product is not specified as configuration data because there are an equal number of dot product bus lanes and post-processing units, so that the data from each lane is provided as the primary input to a different post-processing unit.

For the post-processor 715, the configuration data of some embodiments indicates (for each of the post-processing units) whether a dot product computation node or other computation node (e.g., pooling, element-wise operator) is being executed, the scaler and bias factors for a linear computation, the activation function to use (which may be specified, e.g., as a lookup table), as well as other data. For the activation write bus 720, the configuration data indicates to which cores each output value is to be delivered, in some embodiments.

As mentioned, the solid lines indicate the flow of neural network computation data, for a node in a convolutional or fully-connected layer. The cores 730 (as well as, in some cases, cores of other clusters) compute partial dot products. For a given computation node, these partial dot products may be computed across multiple cores. In some embodiments, if more than one core is used to compute the dot products for a neural network layer, then the partial dot products for each node are computed across all of these cores.

These partial dot products are output to the dot product bus 710, which aggregates the partial dot products from the cores 730 of the local cluster. The dot product bus 710, in some embodiments, includes a number of independent dot product bus lanes that each receives partial dot products from the cores, aggregates these together, and provides the aggregated dot products to the post-processing circuits. In some embodiments, each lane corresponds to (i) one of the adder trees in each of the cores (i.e., dot product bus lane N receives the partial dot products from each of the adder trees of index N in the cores), and (ii) one of the post-processing units in each of the clusters (i.e., dot product bus lane N provides its aggregated output to the post-processing unit N in one of the clusters, as specified by the configuration data).

Each lane of the dot product bus 710 spans all of the channel segments, and the dot product bus lanes in each channel segment aggregate the partial dot products from the cores of its local cluster. The dot product bus 710 in the channel segment 700 also exchanges locally-aggregated dot products with its neighboring segments for further aggregation if needed (i.e., if the source cores for the dot product computation span multiple clusters). In this case, the channel segment 700 only has one neighboring segment, but internal channel segments (e.g., the segments 535 and 540 in FIG. 5) will have two such neighboring segments. The configuration data from the cluster controller 705 specifies whether to send these dot products in one direction or the other along the global channel for each dot product bus lane, or to aggregate the dot products from the neighboring channels locally, depending on where post-processing will occur for each dot product.

The post-processor 715 includes numerous post-processing units that receive the dot products from their corresponding dot product bus lane and perform the non-dot product functions of the neural network computation nodes. For a typical computation node of a convolutional (or fully-connected) layer, these functions includes an addition operation to account for the bias factor, a multiplication operation to account for the scaling factor, and a non-linear activation function. In some embodiments, the outputs of the linear function are quantized or truncated to a particular number of bits (e.g., 4 bits, 5 bits, 8 bits). Using a small, fixed number of bits for the outputs of each computation node allows for (i) power and resource savings by enabling smaller computations and (ii) certainty in the scheduling of computations (i.e., by knowing that all input values will be within a particular range) that enables further power and resource savings in design. The non-linear activation function, in some embodiments, is implemented as a lookup table rather than a hardwired function. This enables the IC to execute different neural networks that use different activation functions and, in some embodiments, allows for different activation functions to be used in different layers of the neural network. The operation of the dot product bus 710 and the post-processing units 715 of some embodiments is discussed in greater detail in U.S. patent application Ser. Nos. 16/212, 617, now issued as U.S. Pat. No. 11,170,289, and 16/212, 643, now issued as U.S. Pat. No. 11,250,326, both filed Dec. 6, 2018, and which are incorporated herein by reference.

The activation write bus 720 receives the computation node activation outputs from the post-processing units and carries these outputs back to the cores 730, to be stored in the memory of the core and used as inputs for the computation nodes of the next layer of the neural network. The activation write bus connects to the cores 730 in the local cluster as well as the activation write bus in the neighboring channel segment 725. As with the dot product bus 710, the activation write bus 720 of some embodiments includes lanes, with each post-processing unit of the post-processor 715 sending its output to a different one of these lanes.

In some embodiments, the output values may be computed by the post-processor 715 in one cluster but carried by the activation write bus 720 to a core in another cluster to be stored. For efficiency, the compiler of some embodiments (a software program that generates the configuration data for enabling the IC to execute a particular neural network) attempts to optimize the location of the post-processing unit for each computation node output relative to the cores used to compute the constituent partial dot products for that computation node and the destination core for the output value. The activation write bus 720 also includes a right shift circuit for each core that is used to align the output values for the core, in order for the values to be stored in contiguous blocks within the core RAM.

Figure 8:
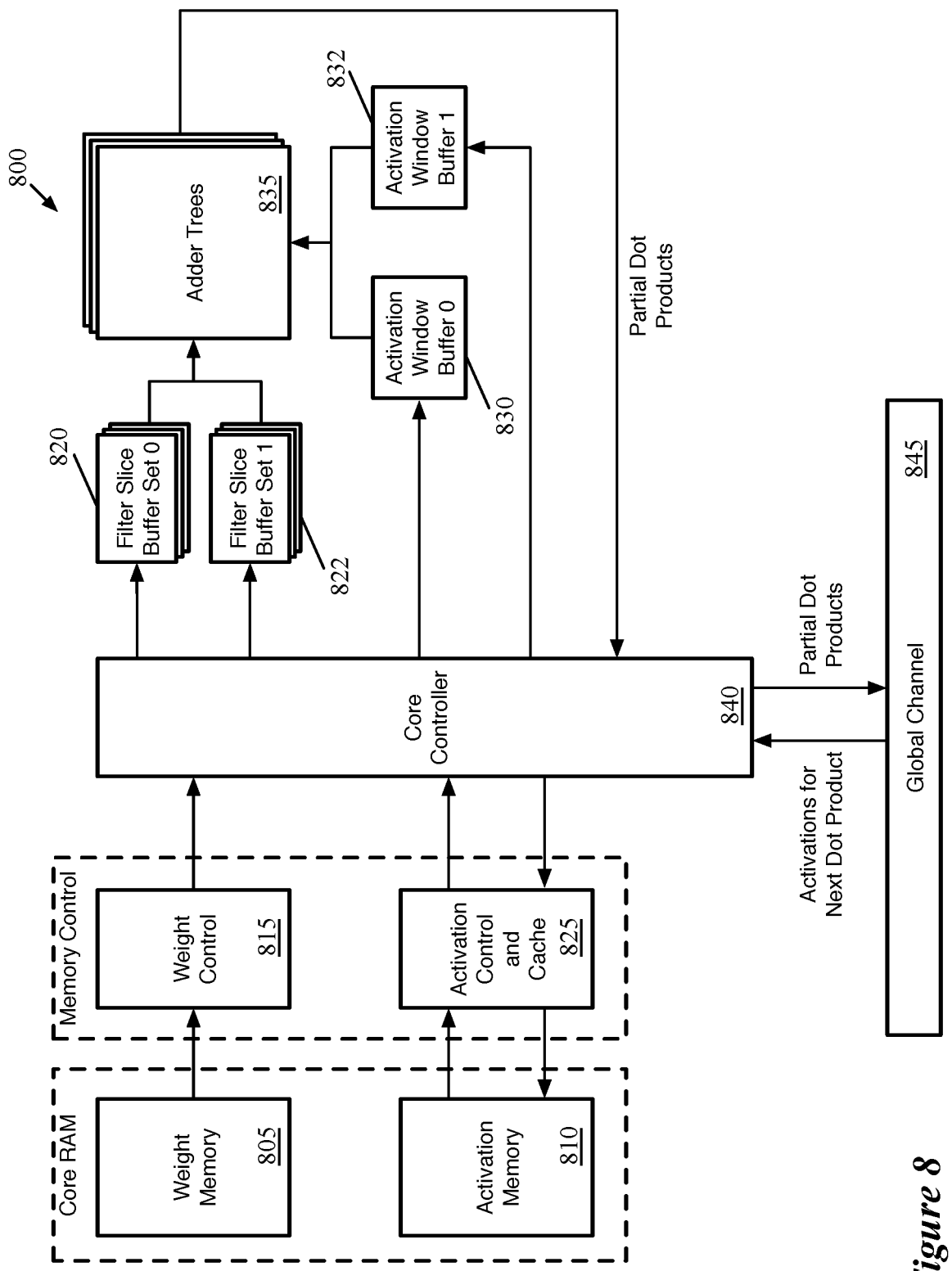
FIG. 8 conceptually illustrates the data flow within one of the cores of some embodiments for a dot product computation.

As mentioned, the dot product cores perform the majority of the dot product computation of the chip fabric of some embodiments. FIG. 8 conceptually illustrates the data flow 800 within one of the cores of some embodiments for a dot product computation. This data flow will be described with certain specifics (e.g., weight sizes, number of separate adder trees simultaneously computing partial dot products, etc.) as examples, but it should be understood that different embodiments may use different sizes for weight and/or activation values, different numbers of adder trees within a core, etc.

In some embodiments, the dot product cores store weight values (e.g., weights for multiple nodes in multiple layers) in the weight memory 805 and activation values in the activation memory 810. In some embodiments, as shown, these memories 805 and 810 are part of a single block of memory for the core (e.g., banks of random access memories such as SRAMs). In addition to storing weight and activation values, in some embodiments the microprocessor of the IC can use the memories in the cores as overflow memory (e.g., to store an image before the image is processed and provided as input to the neural network fabric). The manner in which the weight and activation values are stored in some embodiments is described in detail below by reference to FIGS. 11-13.

The weight values are part of the network parameters and thus are determined at compile time (and do not change at runtime), while the activation values (the input values to a particular node being computed) are the output values from a previous computation (or, for the first layer, are otherwise based on the network input) and thus are determined at runtime. Thus, the weight memory 805 is typically larger than the activation memory 810 (e.g., 512 KB to 64 KB), as the activation memory is at least party overwritten for each new layer of the neural network while the weight memory 805 stores the weights for all of the dot product computations performed by the core. In some embodiments, the weights are stored as 1-bit or 2-bit values (e.g., all values stored as 2-bit values, or zeros stored as a single bit and negative/positive values stored as 2-bit 1/−1). In other embodiments, the weights are encoded in such a manner that less than 1 bit of the weight memory 805 is allocated per weight value (e.g., by encoding the weight values in such a way that many of the zeros are removed).

The weight controller 815 reads data from the weight memory 805 into sets of filter slice buffers 820 and 822 that store the weight values to be used in the dot products. In some embodiments, as mentioned, a filter is a set of weights that is used to compute a dot product with a set of inputs (e.g., in order to identify a specific feature type within a portion of an image). Depending on the number of channels of the activation inputs, filters may be divided into multiple slices. Each filter, in some embodiments, is used repeatedly to compute dot products with numerous activation windows (e.g., contiguous sets of activation inputs). Some embodiments load 36 weight values into each filter slice buffer, which are actually used to compute 144 dot product components (with the requirement that at least 75% of the weight values be zero, the actual adder tree only receives 36 inputs for 144 activation values, as described in detail below).

Some embodiments include both primary filter slice buffers 820 and secondary filter slice buffers 822, as shown in this figure. In a given clock cycle, at most one of these sets of filter slice buffers is used to compute dot products (e.g., using multiplexers to select only one of the sets of weight values). For simpler dot product computations, only the primary filter slice buffer 820 is needed, so there is no need to load weight values into the secondary filter slice buffers 822. However, in other cases, both sets of filter slice buffers may be used (e.g., when dot products are too large to be computed in a single clock cycle using only the primary buffers).

The activation controller 825 reads data (input values) from the activation memory 810 into the activation window buffers 830 and 832. In addition, the activation controller 825 arranges the input values within the activation window buffer 830 in some embodiments to match up with the weight values in the filters. In some embodiments, the input values in an activation window read into the buffer 830 include all of the values (as opposed to the 25% of the values needed for a particular filter), because the activation window is multiplied by numerous filters simultaneously (i.e., some or all of the filters stored in the filter slice buffers). The input values, in some embodiments, are quantized to have a fixed size (e.g., 4 bits), or set of fixed sizes (e.g., 4 bits or 8 bits) for ease and simplicity of computation.

As with the sets of filter slice buffers, some embodiments include both a primary activation window buffer 830 and a secondary activation window buffer 832. In a given clock cycle, at most one of these sets of activation window buffers is used to compute dot products (e.g., using multiplexers to select only one of the sets of weight values). For simpler dot product computations, only the primary activation window buffer 820 is needed, so there is no need to load activation inputs into the secondary activation window buffer 822. However, in other cases, both activation window buffers may be used, as described below (e.g., when dot products are too large to be computed in a single clock cycle using only the primary buffers). The operation of the activation control and cache 825 and the activation window buffers 830 and 832 are described in greater detail below by reference to FIGS. 14-20. In some embodiments, the weight control 815 and the activation control 825 are a single circuit block that reads data from (and writes data to) the weight and memory partitions 805 and 810 of the core memory. In such embodiments, the cache may be used to store weight value data when reading the weights from the weight memory 805.

The adder trees 835 compute the dot products between the weight values in the filter slice buffers 820 and the input values in the activation window buffer 830. The details of these partial dot product computation circuits of some embodiments are described below by reference to FIG. 9. These adder trees 835 output partial dot products (e.g., 10-bit values) that are provided to the dot product bus, which combines the partial dot products with other partial dot products as described above. In some embodiments, the number of filter slice buffers in each of the sets 820 and 822 is equal to the number of adder trees 835, dot product bus lanes, and post-processing units in each segment. Thus, for a typical neural network computation node, the partial dot products computed by the adder trees 835 in multiple cores having a particular index are aggregated by the dot product bus lane with the same index and that aggregated dot product is provided for post-processing to one of the post-processing units with the same index (i.e., the post-processing unit with that index in one of the channel segments).

The core controller 840 configures and coordinates the operation of the memory controllers 815 and 825 in addition to the filter slice buffers 820, activation window buffer 830, and adder trees 835. Furthermore, the core controller 840 receives the input activations and weights from the memory controllers 815 and 825, and loads them into the correct slots in the sets of filter slice buffers 820 and 822 and the activation window buffers 830 and 832 (or directs them to the ALU bus for non-dot product computations). Lastly, when the adder trees 835 output their partial dot product values, the core controller 840 sends these values to the dot product bus in the global channel 845. When the activations are output, the activation write bus carries these values to the core controller 840, which provides them to the activation control 825 to be written to activation memory 810.

To reduce the circuit area and power required for dot product computations (which use the majority of resources for neural network inference), the partial dot product computation circuits (e.g., the adder trees 835) of some embodiments map each of a first number of input values to a second number (e.g., 25% of the first number) of dot product inputs, such that each dot product input only receives at most one input value with a non-zero corresponding weight value. Specifically, in some embodiments, the partial dot product computation circuit includes at least two sets of wires for each input (activation) value, with each of the sets of wires for a given input value connected to at least two different dot product inputs (so that each input value can be provided to at least two different inputs). With a guarantee of at least 75% weight sparsity (i.e., at least 75% of the weight values for any set of input values are zero), the number of dot product inputs is set at 25% (or slightly more than 25%, for redundancy) of the number of input values loaded in an activation window for the dot product computation circuit. In some embodiments, the weight sparsity is guaranteed by the training algorithm used to train the weights to perform a specific purpose, and the IC is adaptable for any set of weights that meets the guarantee.

Figure 9:
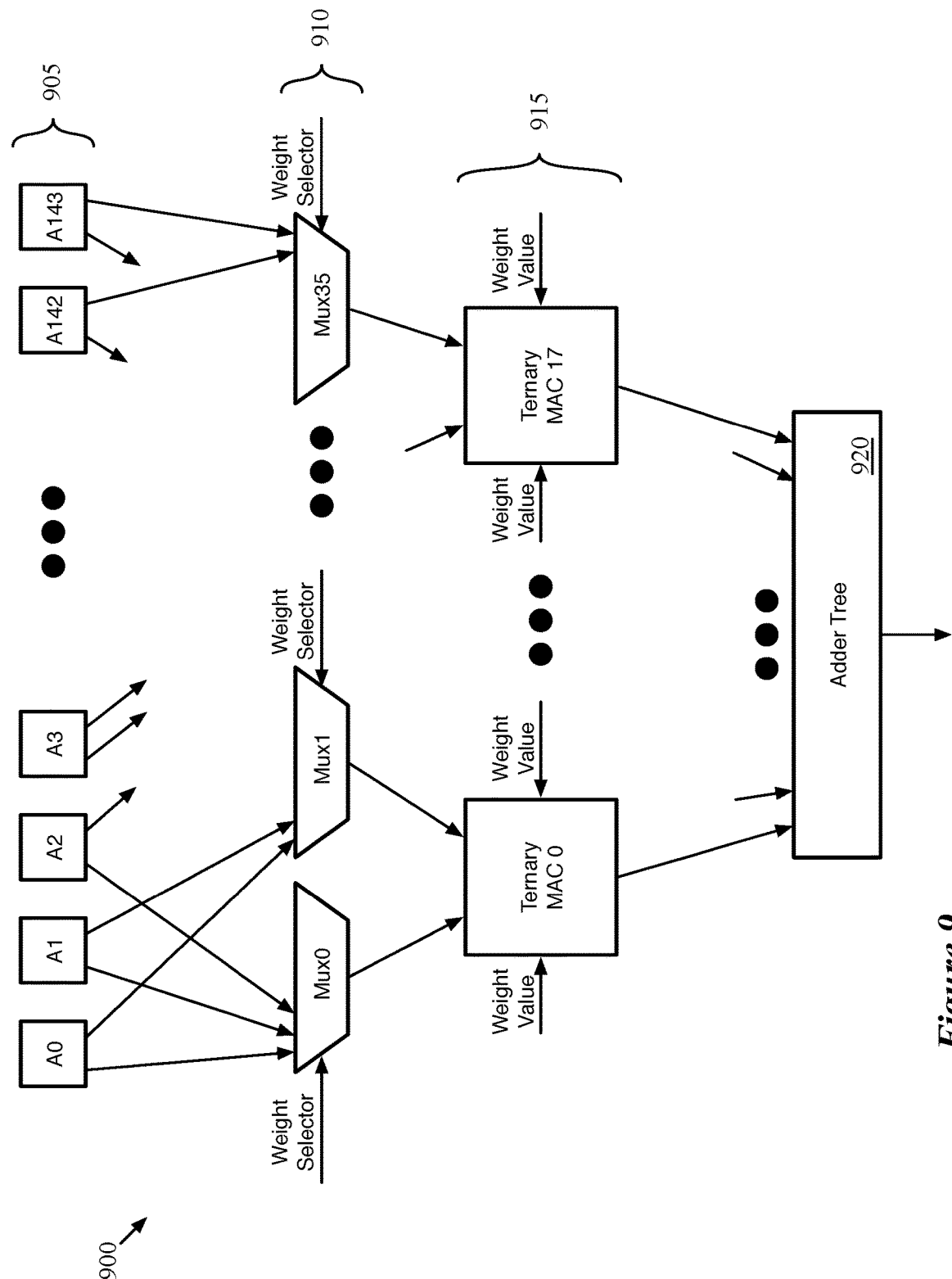
FIG. 9 conceptually illustrates an example of a partial dot product computation circuit for a guaranteed weight sparsity of at least 75%.

FIG. 9 conceptually illustrates an example of such a partial dot product computation circuit 900 for a guaranteed weight sparsity of at least 75%. The wiring of the input values for this dot product computation circuit is designed to optimize the likelihood that, so long as the weights meet the sparsity requirement, the compiler can ensure that at runtime each input value with a nonzero corresponding weight value is provided to a different dot product input for nearly any arrangement of the nonzero weight values. As shown, the dot product computation circuit 900 includes a set of activation inputs 905, a set of multiplexers 910, a set of ternary multiplier-accumulator (MAC) circuits 915, and an adder tree 920.

In this example, the dot product computation circuit 900 includes 144 input values 905. In different embodiments, the activation window buffer may have different sizes, which defines the size of the partial dot product computation. Each input value storage (e.g., each buffer location) is connected to two of the thirty-six multiplexers 910. In this example, at least 75% sparsity is assumed for each set of weight values, and thus the 144 activation inputs can be reduced to 36 inputs to the actual dot product computation. This significantly reduces the circuit area required for the dot product computation, as the number of adders is reduced by 75% (the adder tree effectively starts with 36 values rather than 144 values).

The multiplexers 910 each have eight inputs and receive a set of select bits (the weight selector input) from the core controller that specifies which of these eight inputs to pass to the dot product computation. Having thirty-six 8-input multiplexers 910 allows for 288 sets of wires from the activation inputs 905 to the multiplexers 910, which is two wires for each activation input. If the sparsity guarantee was only 50%, then seventy-two 4-input multiplexers could be used with two sets of wires for each activation input 905 (or seventy-two 8-input multiplexers with four sets of wires for each activation input 905), with similar proportions for different sparsity guarantees and numbers of wires per activation input.

The wire sets from the activation inputs to the multiplexers are arranged such that each input value with a nonzero corresponding weight is provided to a different one of the multiplexers 910. The weight values are not known at the time of IC manufacture, and thus the wiring design is resilient to different arrangements of the nonzero weight values (that meet the sparsity requirement). Some embodiments use a cuckoo hashing algorithm (or other algorithm) to optimally map the wire sets from the activation inputs 905 to the multiplexers 910. In some embodiments, this algorithm computes two hashes (e.g., with two different hash functions) for each of the activation input locations 905 that map to two different multiplexers 910 (e.g., by computing the hash modulo 36). Each activation input location 905 is wired to these two different multiplexers 910 determined by the hashes. If one of the hash functions maps an activation input to a multiplexer that already has eight inputs, then some embodiments compute a third hash function for either that activation input or one of the activation inputs previously mapped to the multiplexer.

Other embodiments use other techniques to select the multiplexers to which each input value is wired, so long as each input is wired to two different multiplexers (and thus each multiplexer has input wires from eight different activation inputs). Additional constraints may be imposed as well, such as ensuring that no more than a specified maximum number of activation inputs are wired to the same pair of multiplexers. In addition, it should be understood that these techniques can be applied to dot product computation circuits with different numbers of inputs, different numbers of multiplexers, and different numbers of wires per input.

The weight values are known before the network is executed by the IC (i.e., at compile time), and thus the compiler can determine which of the two multiplexers that receive each input value with a non-zero corresponding weight will select that input value, such that each input value is selected by a different multiplexer (and only one multiplexer). In some embodiments, the compiler uses the same cuckoo hashing or other algorithm as was used for the wires. The select bits for the multiplexers 910 are determined by which of the inputs to the multiplexer carries an input activation value with a nonzero corresponding weight value, and are received from the core controller. These multiplexers 910 provide their output to a set of ternary multiply-accumulator (MAC) circuits 915. The ternary MAC circuits effectively form the leaves of the dot product computation, and the number of such circuits is half the number of multiplexers 910 (18 ternary MAC circuits 915 in this example).

In some embodiments, the weight values for a particular dot product computation are all either zero, a positive value, or the negation of the positive value in some embodiments. In this case, the dot product does not require any actual multiplication at the leaves of the computation, as the positive and negative weight values can be treated as 1 and −1, with a single multiplication by the positive value afterwards. Removing the multiplication at the leaves saves significant circuit area for a chip with numerous such computation circuits.

To combine the two input values while accounting for the ternary weight values, the ternary MAC circuits 915 add the two input values from the multiplexers 910 while also receiving as inputs the corresponding weight values for these input values (or configuration bits generated based on the weight values). If both of the weights are positive, then the ternary MAC outputs the sum of the two input values (and outputs the negative of this sum if both of the weights are negative). If only one of the weight values is negative, then its corresponding input value is subtracted from the other input value (with a positive corresponding weight value), and if both of the weight values are zero, then the ternary MAC output is zero. Lastly, if only one of the weight values is zero, then the ternary MAC outputs the input value (or the negative of the input value) with the corresponding nonzero weight value). The negative values are accounted for in the bias computation within the post-processing unit, as described above.

The outputs of the ternary MACs provide the inputs to the adder tree 920 that computes the output for the partial dot product computation. In some embodiments, this adder tree is a standard adder tree circuit that adds pairs of values over several layers. For example, the adder tree 920 receives 18 inputs for 9 adders, which in turn provide outputs to 4 adders (with an additional output to be added in later), etc. In some embodiments, the inputs to the ternary MACs 915 are 4-bit inputs (the length of the quantized activation values), and the ternary MACs 915 output 6-bit values. The adder tree 920 receives these 6-bit values and outputs a 10-bit value after several stages of addition. It should be noted that this description refers to handling of signed 4-bit input values. Some embodiments can also handle unsigned input values by converting them to signed input values before performing the addition operations.

While this diagram shows the wires (or some of the wires) connecting the input value 905 to a single partial dot product computation circuit, in some embodiments each of these input values 905 in the activation window buffer is actually connected to each of the partial dot product computation circuits in the core. That is, for the case with 64 such circuits, each value in the activation slice register is carried by 128 total wires to 128 multiplexers (two for each of the partial dot product computation circuits). In some embodiments, the wiring arrangement is the same for each set of multiplexers (i.e., for each partial dot product computation circuit).

As mentioned, for redundancy, some embodiments use a number of dot product inputs (i.e., multiplexers) that is slightly more than required by the sparsity guarantee for the dot product computation. For instance, in the example above, rather than using 36 inputs (exactly 25% of the 144 input values), some embodiments use 38 or 40 inputs. In this case, some of the activations 905 are mapped to three of the multiplexers 910, rather than two.

Figure 10:
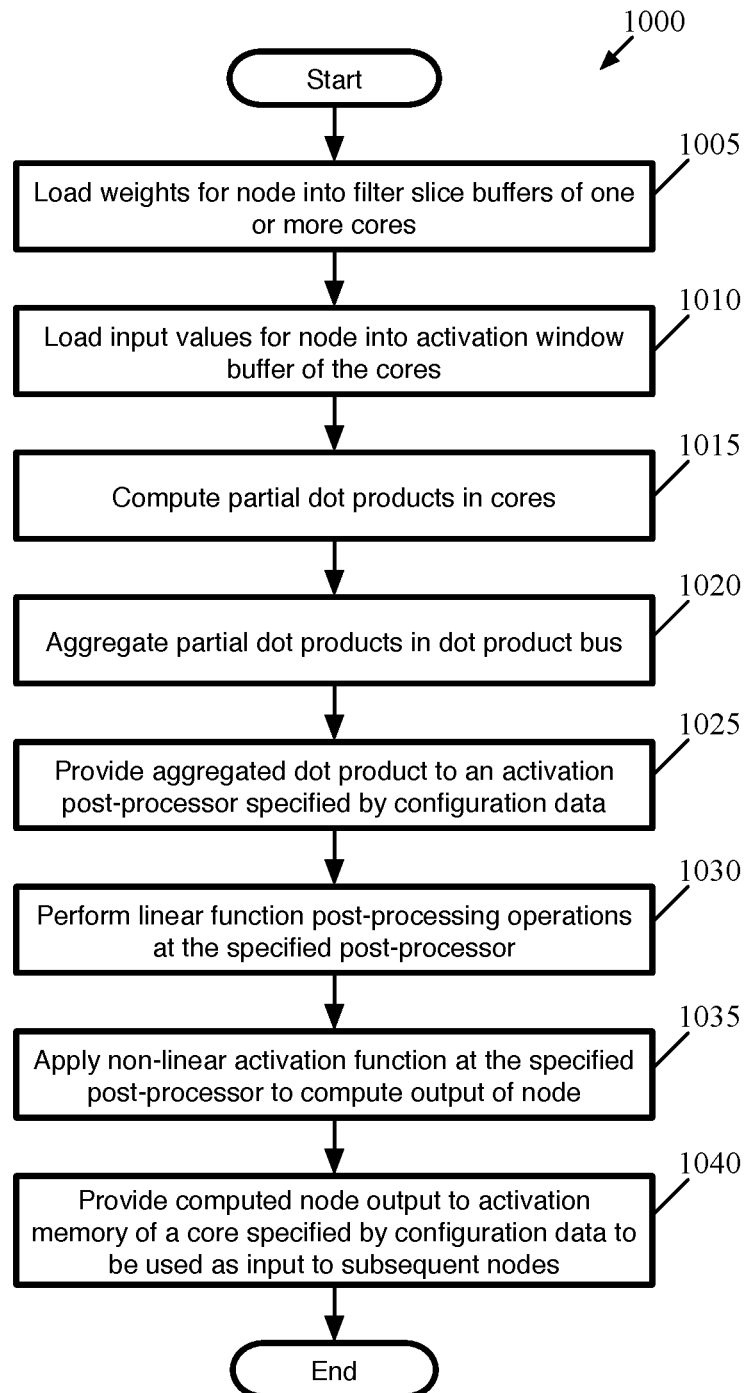
FIG. 10 conceptually illustrates a process of some embodiments for executing a set of instructions (or a portion of a set of instructions) to compute the output of a neural network node.

FIG. 10 conceptually illustrates a process 1000 of some embodiments for executing a set of instructions (or a portion of a set of instructions) to compute the output of a neural network node (specifically, a convolutional or fully-connected node). The process 1000 is executed by the chip fabric of a neural network IC, such as that described above. Typically, the process 1000 is executed simultaneously for multiple nodes, and is performed repeatedly for multiple activation windows (i.e., multiple groups of input values loaded into the activation window buffer) in order to completely execute a layer (or portion of a layer) of the neural network. In the case of the process 1000, the dot product can be computed in a single cycle and does not involve any split filter slices (i.e., no time-multiplexing is required).

As shown, the process begins (at 1005) by loading the weights for a node into filter slice buffers of one or more cores. In addition, the process loads (at 1010) the input (activation) values for the node into the activation window buffer of these cores. In some embodiments, a set of input values are loaded into one activation window buffer in a core while the weight values for several nodes are loaded into several filter slice buffers of the core. Other embodiments load the weight values into the filter slice buffers first, then load the input values into the activation window buffer. Furthermore, some embodiments load the weight values once for a pass (that computes outputs for many activation nodes), then iteratively load sets of input values and compute dot products for numerous nodes without the need to re-load the weights. In addition, the weights and activations for a node, in some embodiments, are divided among the filter slice buffers of all of the cores that are active for the current set of instructions. The storage of the activation values and loading of these values into the activation window buffer are also described in greater detail below.

The process 1000 then computes (at 1015) partial dot products in the cores. As described above, the activation values loaded into the activation window buffers in each of the active cores are multiplied by their corresponding weight values loaded into the filter slice buffers of these cores. In some embodiments, the size of the partial dot products is reduced using the wiring structure shown in FIG. 9, and with ternary weight values of {0, 1, −1}, the multiplication is handled by the ternary MAC circuits shown in this figure.

Next, the process aggregates (at 1020) these partial dot products in the dot product bus. In some embodiments, the partial dot products for a particular node are calculated by the adder tree with the same index (i.e., out of several adder trees) in each of the active cores, and thus these partial dot products are all passed to the same corresponding lane of the dot product bus (which has one lane for each of the adder trees in a core). In some embodiments, the final aggregation is performed by the dot product bus lane in the channel segment of the post-processor selected for the particular node.

The process 1000 then provides (at 1025) the aggregated dot product to an activation post-processor specified by configuration data. This configuration data, in some embodiments, is generated by a compiler and parsed by the hierarchical controller circuits of the neural network chip fabric, and indicates which channel segment will perform the post-processing. Each of the channel segments has an equal number of post-processing units, and the post-processing unit in the selected channel that corresponds to the dot product bus lane that aggregates the dot product is the post-processing unit that receives the aggregated dot product.

At the post-processing unit that receives the aggregated dot product, the process 1000 performs (at 1030) linear function post-processing operations. For all dot products, this includes the bias and scale operations, with the values for these operations sent as configuration data from the cluster controller. In addition, certain dot products are aggregated over multiple cycles (e.g., if time-multiplexing is required to handle dot products with a large number of components, or for dot products with double the standard number of bits).

Next, the process 1000 applies (at 1035) the non-linear activation function at the post-processing unit to complete the calculation of the node output value. In some embodiments, a lookup table is used for this computation (e.g., a 5-bit to 4-bit mapping table). The mapping for each possible set of input bits is provided by configuration data from the cluster controller in some embodiments.

In some embodiments, the operations 1015-1035 are executed to compute the node output without storing the any intermediate values in memory. That is, none of the partial dot products are stored in any memories (e.g., RAM) during the computation within the core, and the same is true before and during the aggregation within the dot product bus. In some embodiments, a register is used to aggregate multiple dot product bus inputs. However, in a standard case (e.g., for 4-bit dot products), this register passes the dot product input through and the entire set of operations 1015-1035 is executed in a single clock cycle.

Finally, the process 1000 provides (at 1040) the computed node output to the activation memory of one (or more) of the cores as specified by the configuration data, so that this output can be used as the input to a subsequent set of neural network nodes. In some embodiments, the node output value is carried to the specified core by the activation write bus, with the core index for the value specified by the cluster controller(s).

As mentioned, the process 1000 illustrates the most simplistic case for computing the dot product. For this simplest type of dot product computation, the neural network computation circuit of some embodiments places the following restrictions on the computation: (i) all of the input values should be of the specified discrete size (e.g., 4 bits), (ii) the maximum number of input values is the size of the input buffer multiplied by the number of cores (e.g., 144 inputs×16 cores=2304 total input values), (iii) all of the weight values are either 0, +α, or −α (and thus can be stored as 0, 1, and −1), and a large enough percentage of the weight values are 0 that the input values with non-zero weight values can each map to a different multiplexer input. Solutions for handling the cases when these requirements are not met are described in greater detail in U.S. patent application Ser. No. 16/212,643, which is incorporated herein by reference.

As mentioned above by reference to FIG. 8, each core includes a block of memory to store the weight and activation values used by the core to compute dot products (i.e., the activation values that are loaded into the activation window buffer and the weight values that are loaded into the filter slice buffers). In some embodiments, each core is allocated the same amount of memory in total, which is divided between weight memory and activation memory for a particular network by the compiler that designs the program for the inference circuit to execute the network. Some embodiments require that each core be divided between weight memory and activation memory in the same manner (i.e., the allocation of weight/activation memory to each core is the same for all of the cores), while other embodiments allow for different allocations between the cores. For example, in some embodiments the allocation is the same for each core within a cluster, but can vary between cores in different clusters (e.g., if a subset of cores are used for a majority of the layers of the network, then that subset of cores might need more of its memory allocated to weight storage.

Within a core, the weight memory and activation memory partitions are themselves subdivided between layers of the network. As described above, all of the weight values used by a core are stored at that core at bootup time, because these values are the same for every input provided to the network. On the other hand, the activation values are determined at runtime (and occupy more memory per value than the weight values), so the cores do not store all of the activation values at a time. Depending on the type of network, only two layers of activations may need to be stored at once (the input activation values for the current layer being executed as well as the output activation values for that layer). In this case, once layer L is being executed (using the layer L activations as inputs and outputting the layer L+1 activations), the circuit can overwrite the layer L−1 activations. On the other hand, if a network has residual connections (i.e., the output activations from layer L are used as inputs for more than just layer L+1), then more than two layers of activations may need to be stored at once.

Figure 11:
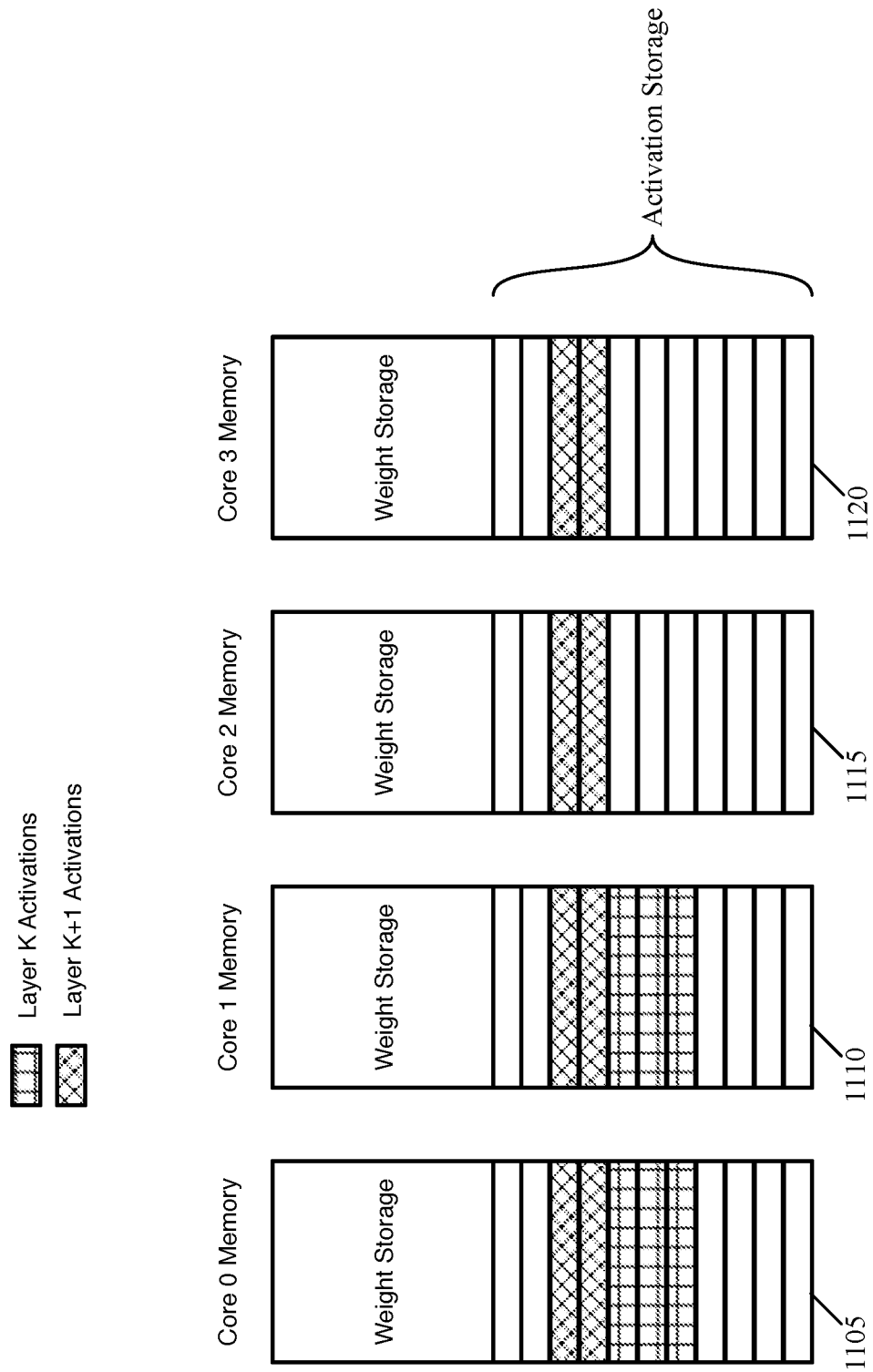
FIG. 11 conceptually illustrates the assignment of layers of activations to memories of four cores within a cluster.

FIG. 11 conceptually illustrates the assignment of layers of activations to memories 1105-1120 of four cores within a cluster. In this example, each of the cores is partitioned into weight storage (shown in the figure as a single block) as well as activation storage (shown as blocks of memory). Each of the blocks within the activation storage represents a set of memory locations (e.g., RAM words) in some embodiments. Though the figure shows a small number of such blocks within each core memory 1105-1120, it should be understood that a typical neural network inference circuit will have thousands of RAM words per memory. In addition, although the activation partition is larger than the weight partition in these examples, the weight partition will often be the larger partition because all of the weight values are stored in the memories at boot time.

The figure illustrates (using different types of cross-hatching) the memory portions allocated to the activation values (i.e., input activations) for each of two layers (layer K and layer K+1). In this example, the activations for layer K are divided across the memories 1105 and 1110 for two of the cores (meaning that only these two cores participate in the dot product calculations for this layer), whereas the activations for layer K+1 are divided across the memories 1105-1120 for all four illustrated cores. For each of the layers, the first RAM word storing activations for that layer is aligned to the same memory address (i.e., the first activation for the layer stored in each core starts at an equivalent memory location within the respective core). In addition, the first activation for a layer starts at the beginning of a RAM word (i.e., the least significant bit in the word) in some embodiments.

In some embodiments, the activation values for a layer are divided evenly among the cores storing the activations for that layer (or as close to evenly as possible). Some embodiments require that the number of cores for a layer is a multiple of the number of cores in a cluster (e.g., a multiple of four for the chip fabric shown above in FIG. 5). Other embodiments simply impose the requirement that the number of two-dimensional activation grids assigned to each core is equal (or as close to equal as possible). Referring to the three-dimensional structure of a layer of activations shown in FIG. 2, each two-dimensional grid of activations is assigned entirely to a single core. As such, if the number of activation grids is not evenly divisible by the number of cores to which those activations are assigned, then some of the cores will be assigned more of the actual activation values than other cores. However, some embodiments assign zero-grids (i.e., grids of activation values equal to zero) to make up the difference and even out the number of activations in each core for the layer. In other embodiments, rather than specifically ensuring the activation values are all zero (which would require generating one or more extra activation value grids of zeros and loading these values into the RAM each time the network is executed), the compiler ensures that the corresponding weight values stored in the weight memory are all zero, such that the data used for these activation value grids does not matter).

In addition, as shown in FIG. 11, all of the activation values for a layer are assigned to a contiguous block of each core's memory. As described further below, in certain cases, a portion of a RAM word may be zero-padded (or left with unverified data that is not used in the computations for the layer) within this contiguous block of memory.

Figure 12:
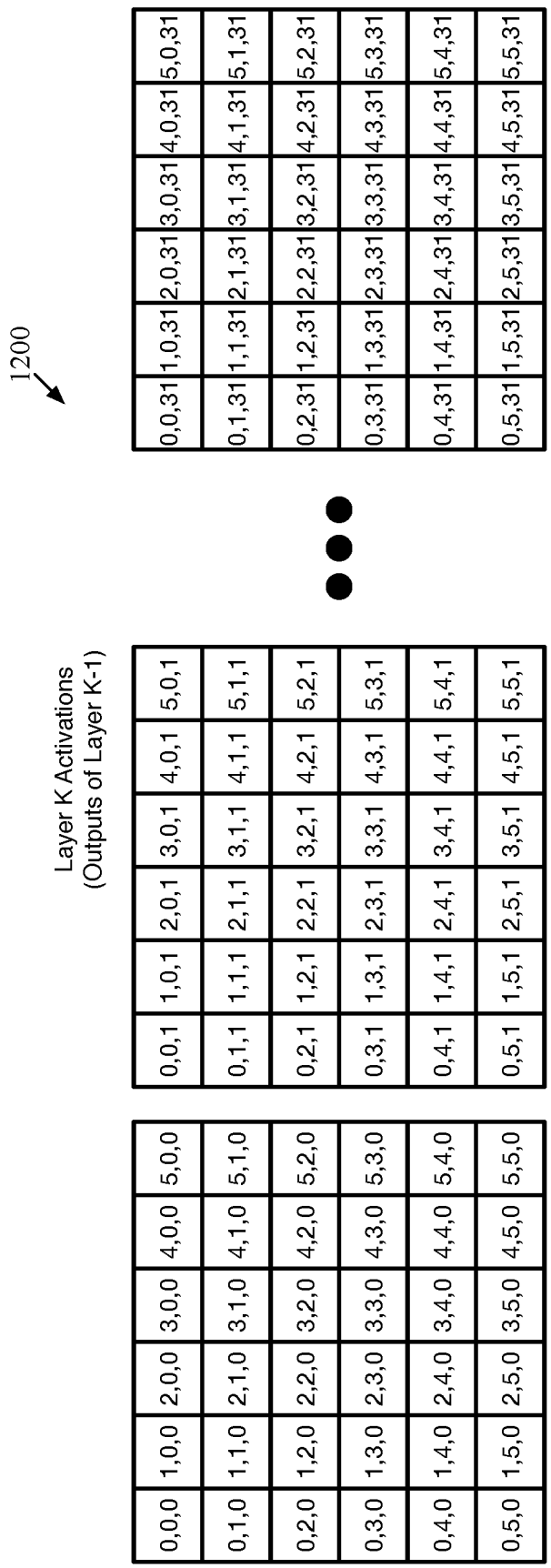
FIG. 12 conceptually illustrates a layer of activation values.
Figure 13:
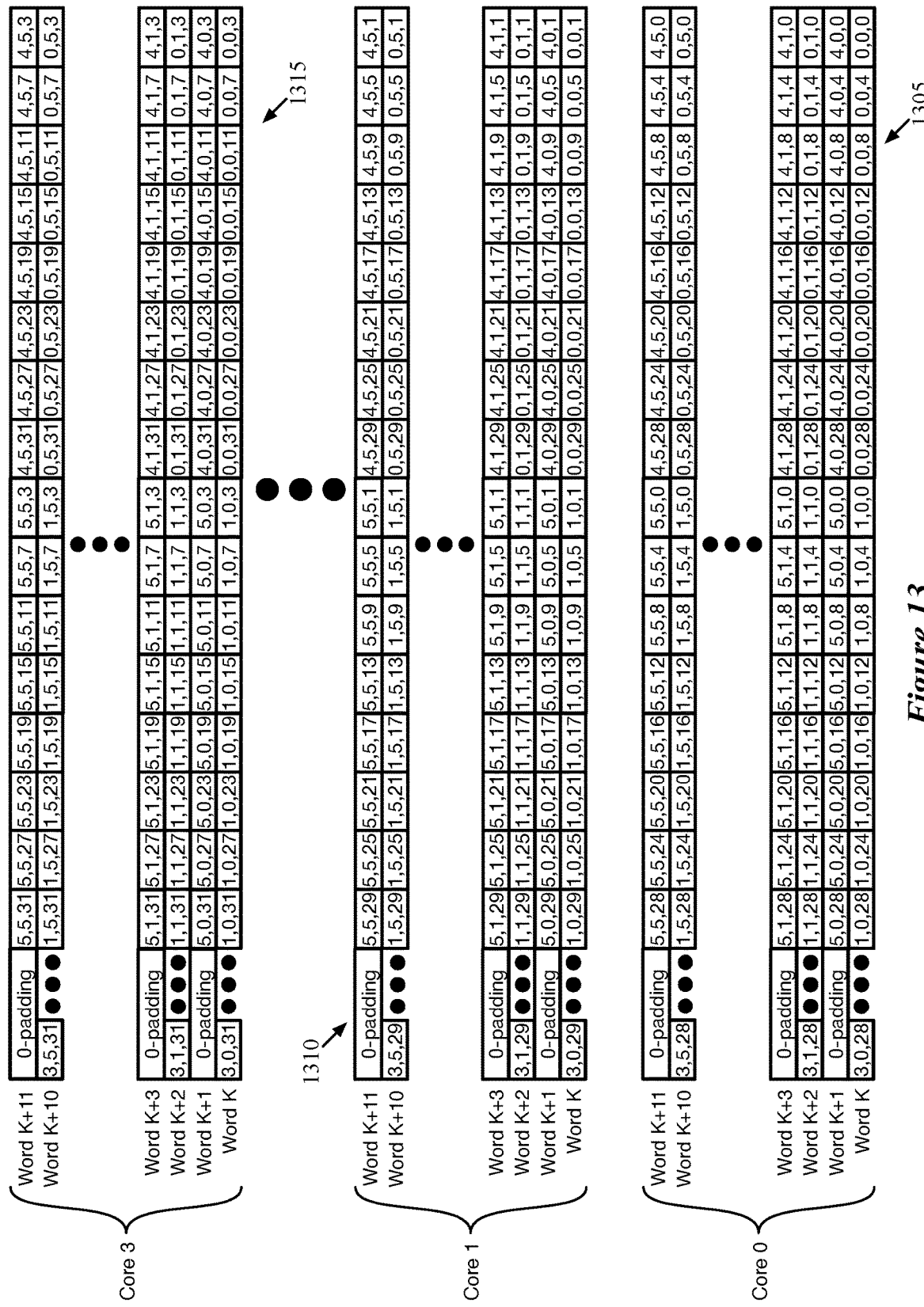
FIG. 13 conceptually illustrates the arrangement of the activation values of FIG. 12 among the memory of four cores.

FIG. 12 conceptually illustrates a layer of activation values 1200, and FIG. 13 conceptually illustrates the arrangement of these activation values 1200 among the memory of four cores. As shown in FIG. 12, the layer K activation values are structured as a 6×6×32 layer (i.e., 32 6×6 grids, meaning that the previous layer most likely had 32 filters). Each activation value in the layer is labeled with a three-dimensional (x, y, z) coordinate. The x-coordinate refers to the column to which the activation belongs (0-5), the y-coordinate refers to the row to which the activation belongs (0-5), and the z-coordinate refers to the grid to which the activation belongs (0-31). Each of these activations will have different values depending on the input data provided to the network, but the activation value at a given coordinate will be stored in the same location in the core memories each time the network is executed.

FIG. 13, as mentioned, illustrates the arrangement of the activation values 1200 according to the activation storage rules of some embodiments. In this case, the compiler determined that the activation values 1200 of Layer K will be stored in four cores of the neural network computation fabric (Cores 0-3). The memories 1305-1315 of each of the cores include numerous banks of RAM in some embodiments, divided into words that can each be read from or written to individually. These words may have different lengths in different embodiments; in this example, the words are each 128 bits long. Thus, if the activation values are each 4-bit values (as is the case in some embodiments), then a single word can hold 32 activation values. When larger 8-bit activation values are used, then a single word holds 16 activation values. In the figure, each word is shown with the least significant bits on the right, which will be referred to as the "start" of the word. Thus, the rightmost 4 bits (least significant nibble) of each word holds the first activation value of the word. In addition, the words are ordered, with this example showing the first word in each core (or at least the first word for the illustrated layer of activation values) at the bottom of the diagram.

To optimize the use of the core memory as well as the efficiency with which the activation values are read from the core memory, some embodiments organize the activation values in the memory according to a set of defined rules (which are shown by way of example in FIG. 13). As mentioned, each two-dimensional grid of activation values is assigned entirely to a single core. In this example, grids {0, 4, 8, . . . 28} are assigned to Core 0, grids {1, 5, 9, . . . 29} are assigned to Core 1, grids {2, 6, 10, . . . 30} are assigned to Core 2, and grids {3, 7, 11, . . . 31} are assigned to Core 3. The compiler may use different algorithms to assign grids of activation values to different cores in some embodiments, so long as the grids are assigned evenly (or as close as possible to evenly) to the cores.

The activation values within a core are not necessarily arranged with all of the activation values of a grid stored contiguously. Instead, within each core, some embodiments store all of the activations for a particular coordinate (i.e., an x-y coordinate) within the grids assigned to that core in a contiguous block. For a typical convolution, all of the activation values at a particular (x,y) coordinate will be used for dot product computations at the same time, so storing these values contiguously helps minimize resources used (and latency) for loading the activation values when computing the dot products for a layer.

As shown, the activation memory for layer K in each core starts with the activations at (0,0) for all of the grids assigned to that core. In this case, eight grids of activation values are assigned to each of the four cores (the 32 grids are evenly divisible by 4, so no zero-grids are required). Thus, the first eight values of the first word in each core (designated as word K) are the activations with (x,y) coordinates of (0,0). In some embodiments, if there are more grids assigned to a core than the number of activation values that a memory location (i.e., a RAM word) can store, then these are split up into separate sets of activations, and only a single word worth of activation values at the same coordinate are stored contiguously. That is, if 35 grids of activation values were assigned to Core 0, then only the first 32 activation values would have coordinates of (0,0). Those first 32 grids would be stored as a contiguous block that iterates through each (x,y) coordinate, followed by the remaining 3 grids of activation values (stored in the same way, iterating through each (x,y) coordinate).

Within the memory 1305-1315 of each core, the first 8 activation values are those located at coordinate (0,0). Next, the algorithm for activation value storage moves to the activation values coordinate (1,0)—that is, the x-coordinate is incremented as the next value in the same row of each grid is stored. This proceeds until the end of the current row is reached (i.e., the activation values with coordinate (5,0)). In some embodiments, once the end of a row in the activation grids is reached, the remainder of the current RAM word is 0-padded. As shown in the figure, this means that the last half (64 bits, or 16 activations) of word K+1 (as well as words K+3, K+5, etc.) in each of the memories 1305-1315 is 0-padded (or padded with unverified data that is never loaded into the activation window buffer). This pattern (arranging the activation values in row-major order) is repeated for each row of activation values in the grids assigned to a given core.

As will be described below, when loading the activation values as inputs to dot product computation, upon reaching the end of a row of the activation grids, the core memory controller returns to the start of the next row, and the activation values from the end of the previous row are not reused. The use of 0-padding (rather than starting the next row of activation values in the same RAM word) avoids the need to read multiple words when starting a new row of convolutional layer computations (which would require additional clock cycles).

As a result of this activation storage algorithm, a given memory location in one source core for a layer will store activations for the same x-y coordinates as that memory location in any of the other source cores. For example, the tenth activation in RAM word K+1 of Core 0 is the activation for coordinate (5,0) in activation grid 4. Correspondingly, the tenth activation in RAM word K+1 of any of the other cores is also an activation for coordinate (5,0), in different activation grids.

The weight values are stored in a similar manner, in some embodiments, with certain differences. Just as activation values for a layer are divided across multiple cores (and, specifically, the activation values for each particular dot product in a layer are divided across the multiple cores), the weight values for each filter in a layer also divided across these same multiple cores. Over the course of a convolutional layer, a particular weight value in a filter is multiplied by numerous activation values, all of which are in the same activation grid. As such, each weight value is stored in the same core as the activation grid that contains the activations by which that weight value is multiplied. However, in some embodiments, the length of each filter slice may be different, even within a single layer, due to the different number of non-zero weight values. That is, even if a filter slice buffer always has 36 (or 40) weight values, the amount of memory required to store those weight values may differ depending on the number of non-zero weight values.

As mentioned, arranging the input activation values for a layer in this manner enables optimized use of these activation values for computing dot products of the various computation nodes of a layer. Specifically, the arrangement (and use of a cache for words that are read but not fully loaded into the input buffer) enables the cores to load the values into the activation window buffers while minimizing the number of memory reads that are required. In addition, the buffer in each core is implemented as a configurable shift register, so that activation values do not need to be re-loaded between subsequent sets of dot product computations.

Figure 14:
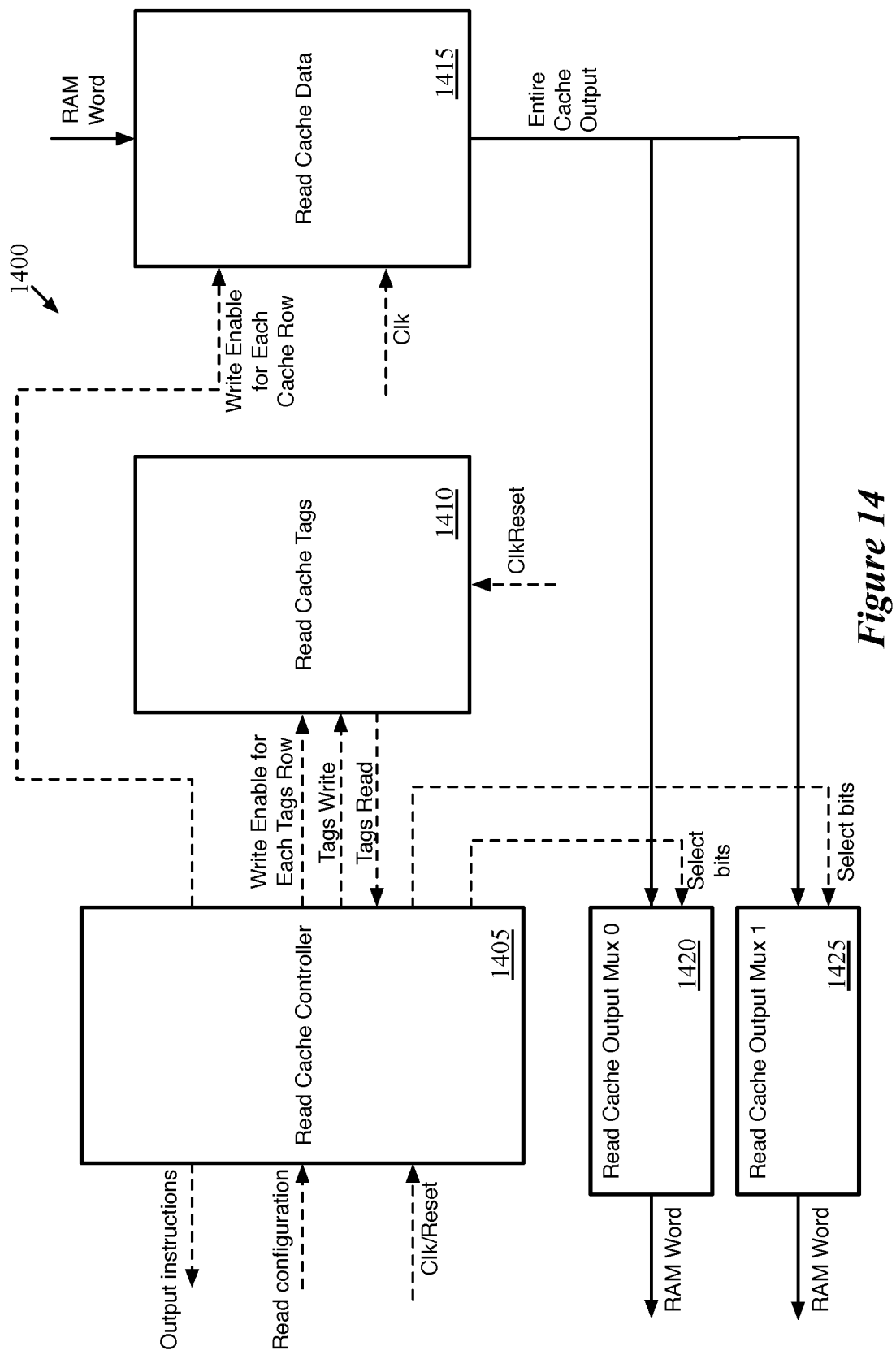
FIG. 14 conceptually illustrates the structure of an activation read cache of some embodiments.

FIG. 14 conceptually illustrates the structure of an activation read cache 1400 of some embodiments. In some embodiments, the activation cache 1400 is a sub-block of the activation memory control circuit (i.e., the activation memory controller 825 of FIG. 8). As shown, the activation read cache 1400 includes a cache controller 1405, a tags block 1410, a data block 1415 (the cache storage), and output multiplexers 1420 and 1425.

The cache controller 1405 receives read configuration data, which in some embodiments includes some or all of one or more memory addresses for data to be fetched (e.g., one or more addresses in the core RAM for data to be fetched), a read enable bit, a clear bit (to clear the cache), one or more mode bits (indicating in which of at least two possible modes the cache is currently operating), and data indicating whether the read data abuts or crosses a RAM word boundary. In addition, the cache controller 1405 receives clock and reset bits. As output (e.g., to other circuit blocks of the memory controller), in some embodiments the cache controller 1405 provides instructions data regarding read operations from the core memory and whether to read data from the cache data block 1415 (and in which row of the cache this data is found).

The cache controller 1405 receives one or more requested memory addresses (generated based on the read configuration data) and compares this with the memory addresses of the data stored in the cache, received from the tags block 1410. In some embodiments, when the cache is operating in a first mode for reading memory locations in order (e.g., when reading from weight memory to load weight values into the filter slice buffers), the cache controller 1405 performs two comparisons. On the other hand, when the cache is operating in a second mode that allows for reading RAM words out of order (e.g., when loading activation values for a typical convolutional layer), the cache controller 1405 performs only one comparison. When the data is already stored in the cache, the cache controller 1405 instructs the data block 1415 to output that data by providing a cache row number. Otherwise, the cache controller outputs a bit to initiate a read request from the core RAM, along with the required memory address. In some embodiments, if the requested activation data wraps across two RAM words, the cache controller 1405 outputs the incremented memory address (with the bit initiating a read request) as well as the cache row storing the matching RAM word.

The tags block 1410 stores the memory addresses (i.e., core RAM addresses) of the data stored in the data block 1415. When the contents of a memory address are written into the data block 1415, the cache controller 1405 also writes this address to the tags block 1410 (for use in later comparison operations, when a memory address is requested). As such, the tags block 1410 stores the same number of entries as the cache data block 1415, but with fewer bits. The tags block 1410 also stores one additional bit for each row, indicating whether the address data in that row is valid (the cache can be reset by setting all of these bits to 1). In some embodiments, each of these blocks is implemented as a group of registers. When instructed to by the cache controller 1405, the data block 1415 stores a RAM word read from the core memory (the write enable bit specifies which row of the cache will store this RAM word). The data block 1415 outputs its stored data to the output multiplexers 1420 and 1425.

The output multiplexers 1420 and 1425 can each output one of the rows of activation data from the data block 1415, when instructed by the cache controller 1405. The select bits from the cache controller 1405 specifies, in some embodiments, which of the cache data rows are to be output by each of the multiplexers. In some embodiments, these two outputs, as well as a RAM word from the core memory, are merged by a separate circuit block of the memory controller and provided to the activation window buffer (which is described below). In some embodiments, the second output is used when the cache is operating in the mode for reading continuously-increasing RAM words. Otherwise, such embodiments only output one RAM word from the cache at a time. In addition, when the merge circuit block merges activation values from the cache with activation values from a RAM word read from the core memory, some embodiments delay the output of the cache row by the latency required for the memory read operation (e.g., 5 clock cycles). This merge circuit block then shifts and merges the data as needed to provide the required set of activation values to the activation window buffer. If the number of activation values provided to the activation window buffer in a given cycle is less than a full RAM word worth of activation values, in some embodiments this merge circuit block aligns the required activation values such that there are no gaps between these values.

Figure 15:
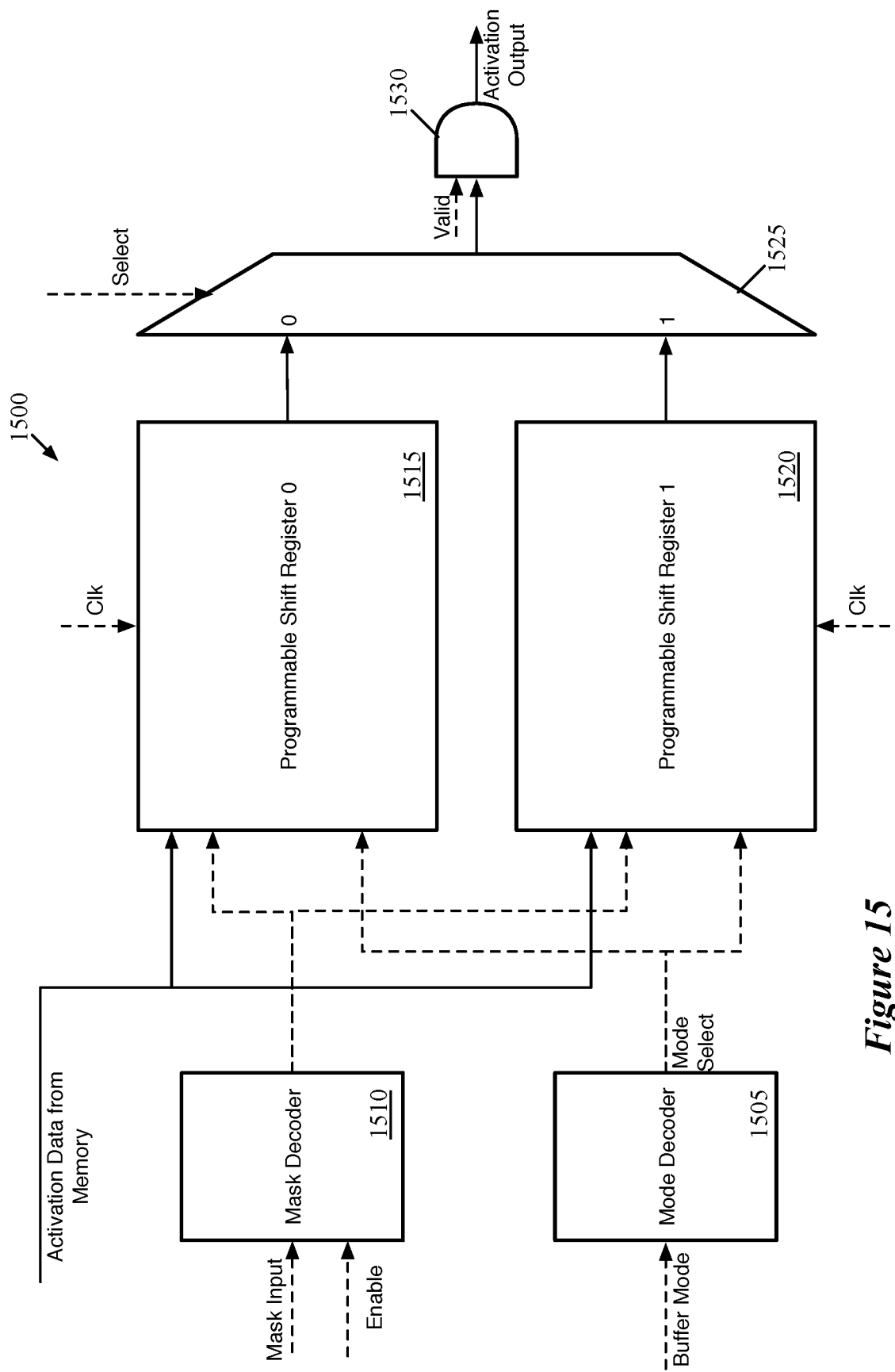
FIG. 15 conceptually illustrates the structure of an activation window buffer of some embodiments.

FIG. 15 conceptually illustrates the structure of an activation window buffer 1500 of some embodiments. As shown, the activation window buffer 1500 (i.e., collectively, the buffers 830 and 832 of FIG. 8) includes a mode decoder 1505, a mask decoder 1510, two programmable shift registers 1515 and 1520, a multiplexer 1525, and an and gate 1530. The two programmable shift registers 1515 and 1520 correspond to the primary and secondary activation window buffers, described above.

The mode decoder 1505 receives configuration data specifying one of several modes for the shift registers, and outputs a one-hot decoded mode input for the shift registers 1515 and 1520. Depending on the kernel size for a set of filters, the increments by which the activation values will be shifted within the window buffer after each dot product may vary. In some embodiments, the available modes are designed for optimizing the efficiency of square (e.g., 3×3, 4×4, 5×5, etc.) kernels during convolutional layers. In addition, whether time-multiplexed dot products are required (e.g., due to large activations, a large number of dot-product components, or filter slicing) also affects the mode setting in some embodiments. These different modes will be described in more detail below when describing the programmable shift registers 1515 and 1520.

The mask decoder 1510 receives configuration data specifying an input mask and outputs this mask for each of the two programmable shift registers 1515 and 1520. The mask bits allow for additional control on the length of the shift registers in some embodiments. In some embodiments, the compiler can define this mask data to disable unused portions of the shift register in order to save power. In addition, in some embodiments when an enable bit input to the mask decoder 1510 is set to zero, the mask decoder 1510 outputs entirely zeros (thereby preventing the shift registers from shifting data for that cycle).

Each of the programmable shift registers 1515 and 1520 includes a number of cells, with each cell storing a single activation value. For instance, in the examples described herein, each shift register includes 144 cells (corresponding to the 144 activations shown in FIG. 9). When no time-multiplexing is required (e.g., for a standard partial dot product with 144 or fewer components, with no filter slicing needed, and with standard-size activation values), only the first programmable shift register 1515 is used.

As mentioned, the different modes for the programmable shift registers 1515 and 1520 depend on the kernel size of the filters. For example, in the non-time-multiplexed case (using only the first programmable shift register 1515) with a 144-cell shift register, these different modes could have the programmable shift register 1515 implementing (i) 32 shift registers of length 4 for 2×2 kernels (no more than 32 shift registers are used, in some embodiments, because only 32 activation values (the length of a RAM word) can be received in a given clock cycle), (ii) 16 shift registers of length 9 for 3×3 kernels, (iii) 9 shift registers of length 16 for 4×4 kernels, (iv) 5 shift registers of length 25 for 5×5 kernels, (v) 4 shift registers of length 36 for 6×6 kernels, or (vi) 2 shift registers of length 72 for 7×7 kernels (in this case, only 49 cells of each of these shift registers will actually be used).

The length and number of shift registers is based on the kernel size in the following way, in some embodiments. Using a 3×3 kernel as an example, in order to avoid time-multiplexing, at most 16 two-dimensional activation grids can be assigned to a single core (because otherwise the partial dot product for a single computation node would require more than 144 activation values in each core). Thus, each of the 16 shift registers holds 9 values for a given dot product—one shift register for each possible 3×3 portion of a two-dimensional activation grid. For a slide of 1 between computation nodes, the activation values will be shifted by a length of 3 cells between dot product computations, which requires at least three clock cycles in some embodiments. Similarly, if the slide value for the convolution using a particular set of filters is 2, then the values are shifted by a length of 6 between dot products (i.e., requiring at least six clock cycles).

In some embodiments, each of the cells of the programmable shift registers 1515 and 1520 is itself a set of registers (e.g., blocks of four registers to hold the 4-bit activation values). These include both static registers and programmable registers. The static register blocks of some embodiments cannot receive activation values directly from memory, and instead only receive their activation values from the previous register block. Each static register block receives input (e.g., a 4-bit activation value) from a previous register block and outputs its value to the next register block. In some embodiments, each such static register outputs its value on the clock cycle. However, the register block also receives an enable signal (from the mask decoder 1510), and when this signal is 0 the clock signal is gated. Thus, the enable bit to the mask decoder 1510 can be used to prevent the entire set of register blocks from shifting their activation values (e.g., while waiting for a memory read operation to complete). The mask signal from the mask decoder 1510 can also be used to prevent some register blocks from shifting their output when the rest of the programmable shift register executes a shift operation, so that unused activation register blocks will not consume the power required to change their values. For instance, if the register is in 16×9 mode (for 3×3 kernels), but only 12 two-dimensional activation grids are stored in each core, then four of the shift registers (36 register blocks in total) will be disabled.

The programmable register blocks of some embodiments are capable of receiving their activation values from the previous register block or from the activation memory (i.e., from the merged output of the cache and the core memory), depending on the current mode of the programmable shift registers. Essentially, each programmable register block operates like the static register block, with multiplexers specifying which input the register block receives based on the mode received from the mode decoder 1505.

The static and programmable registers are arranged such that any cell that needs to receive its input from the activation memory in at least one mode of the activation window buffer is a programmable register, while all of the other cells are static registers (as the static registers occupy less surface area and require less power). Referring again to the 3×3 kernel mode that programs the programmable shift register 1515 as 16 shift registers of length 9, in this case every ninth cell receives its value from the activation memory. When loading the first set of activation values for a row of computations, the activation values are loaded in to this programmable register block one at a time, and then shifted on each clock cycle as the next activation value is loaded into the programmable register block. Thus, the initial load for a row of computations with 3×3 kernels requires at least nine clock cycles (in addition to the time required to read the data from the core memory). For subsequent computations, if the slide value is less than the size of the kernel, fewer clock cycles are required to prepare the programmable shift register for the next set of computations (e.g., three clock cycles if the slide value is 1).

These programmable shift registers 1515 and 1520 output their activation values to a multiplexer 1525 that receives a select bit indicating which value to pass through. For non-time-multiplexed dot products, the output of the first programmable shift register 1515 is always used. For time-multiplexed dot products, the output of the first programmable shift register 1515 is used on a first clock cycle and the output of the second programmable shift register 1520 is used on a subsequent clock cycle. The output of this multiplexer is gated by an AND gate 1530 so that the output is passed to the adder trees only once the activation values are fully loaded into the register(s). This prevents the adder trees from wasting power by performing unnecessary dot product operations on invalid data (e.g., during cycles when the activations are being loaded into the activation window buffer).

Figure 16:
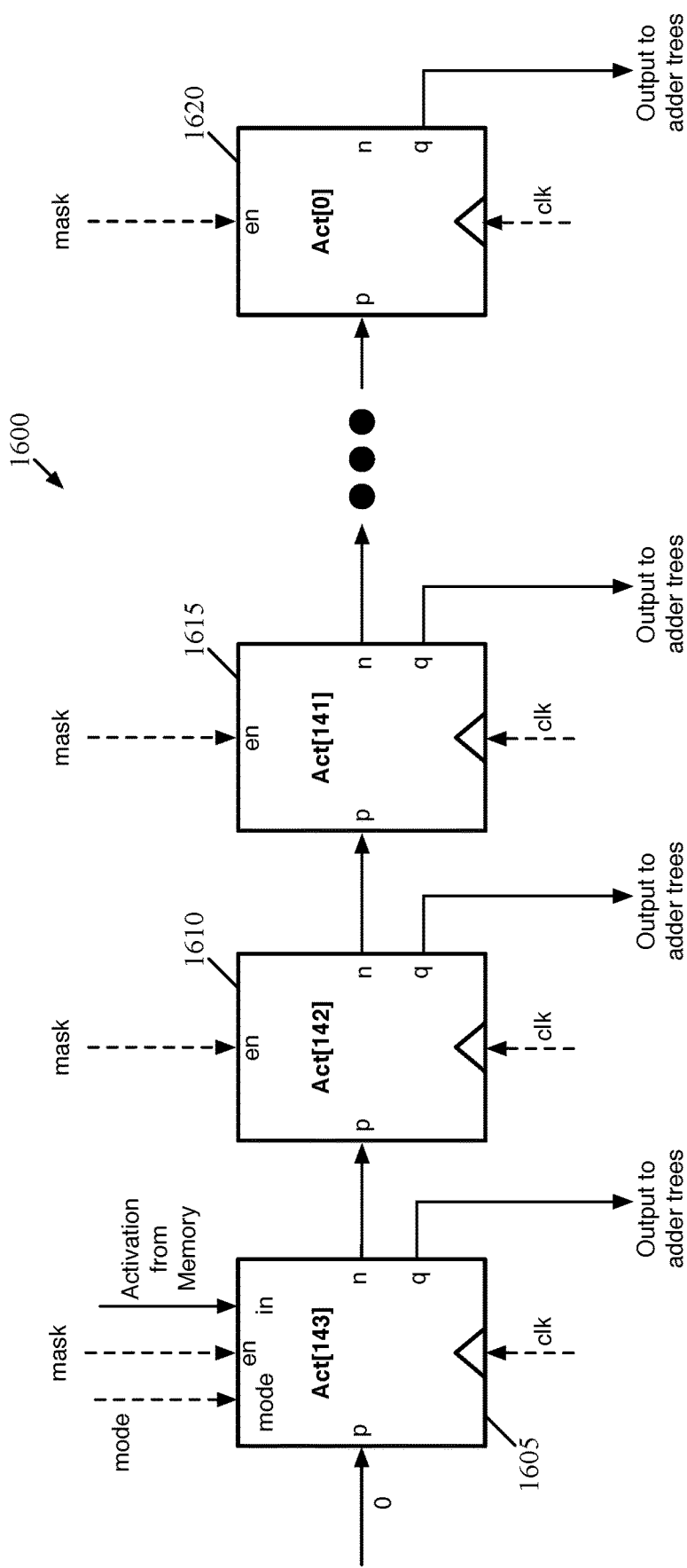
FIG. 16 conceptually illustrates the structure of a programmable shift register of some embodiments.

FIG. 16 conceptually illustrates the structure of one of the programmable shift registers 1600 of some embodiments (e.g., either the primary or secondary programmable shift registers 1515 and 1520). As shown, the programmable shift register 1600 includes several activation storage blocks 1605-1620 (in this case, there are 144 such cells, as in the example shown in FIG. 9). Each of these activation storage blocks 1605-1620 is a register (e.g., a 4-bit register), some of which are static registers and some of which are programmable registers.

In the illustrated programmable shift register 1600, the first activation storage block 1605 (numbered 143) is a programmable register while the other three illustrated activation storage blocks 1610-1620 (the second, third, and last blocks) are static registers. As mentioned, the programmable registers receive activation values from both activation memory and from the previous activation storage block (except in the case of the first activation storage block 1605, which has no previous activation storage block and instead receives the value 0 at this input).

All of the activation storage blocks 1605-1620 receive an input from the previous activation storage block (except the first block 1605, as noted in the previous paragraph), output their value to the next activation storage block (except for the last block 1620), and also output their value to the adder tree multiplexer inputs (those shown in FIG. 9). The activation storage blocks 1605-1620 are activated by the clock signal; however, this clock signal is internally gated by an enable signal from the activation buffer mask decoder. When the enable signal is 0 for a particular activation storage block, then the clock is internally gated so that the values are not shifted between activation storage blocks.

The programmable register block 1605 of some embodiments also includes input wires capable of carrying activation values from memory for each mode in which that block receives such an activation value. In addition, for each such mode in which the register block 1605 participates (i.e., receives an activation value), the block also has an input wire for the mode bit. For example, if the register block 1605 receives activation values in six of the possible modes, then the mode input is 6 bits wide. If one of these bits is set to 1, then the corresponding activation input for that mode is selected over (i) the other activation inputs and (ii) the input from the previous activation block (which is 0 for the first activation storage block 1605, but is an actual value from previous activation storage blocks for intermediate programmable register blocks). In some embodiments, a set of multiplexers that select based on the mode bits are used to implement these choices.

As described, the memory controller (including the activation cache) operates to read activation values from the memory and load these values into the activation window buffer in an efficient manner (both time-efficient and power-efficient). Once the data is loaded (and the weight values loaded into the filter slice buffers), the activation window buffer output is enabled and the partial dot product for the core computed (in addition to the further dot product computation and post-processing also occurring).

Figure 17:
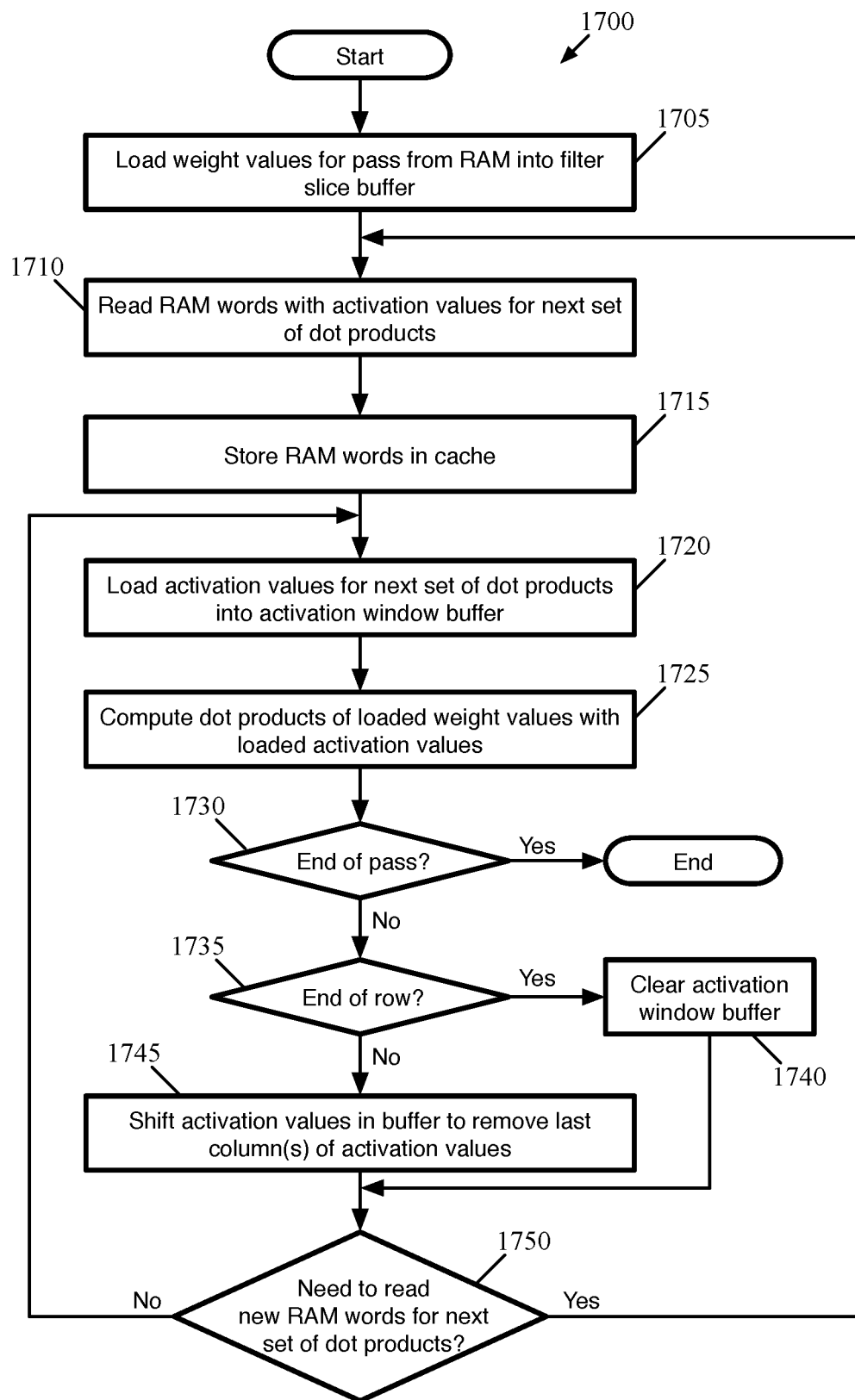
FIG. 17 conceptually illustrates a process of some embodiments for executing a pass (i.e., a layer or a portion thereof, depending on the number of filters in the layer) of a neural network.

FIG. 17 conceptually illustrates a process 1700 of some embodiments for executing a pass (i.e., a layer or a portion thereof, depending on whether the number of filters in the layer exceeds the number of filter slice buffers available) of a neural network. Specifically, the pass executed by the process computes all of the dot products for a particular set of filters of the neural network. The process 1700 is performed by a set of cores of a neural network inference circuit in some embodiments (i.e., the set of source cores for the layer), with the global channel (i.e., the dot product bus and possibly the post-processing units) also participating in the dot product computation. The process 1700 will be described in part by reference to FIGS. 18-20, which illustrate the loading of the activation values 1200 of FIG. 12 into an activation window buffer according to some embodiments.

As shown, the process 1700 begins by loading (at 1705) weight values for the pass from the core RAMs into the filter slice buffer. In some embodiments, for each active core, the weight controller (i.e., weight control circuit 815 of FIG. 8) reads and decodes the weight values from the weight partition of the core memory. The core controller provides the weight controller with configuration data that specifies which memory locations (i.e., which RAM words) to read for each of the filter slice buffers, and the weight controller decodes this data to identify the weight values (i.e., as either 0, 1, or −1) and load these weight values into the appropriate filter slice buffers. As mentioned above, in some embodiments the same read cache is used for loading weight values into the filter slice buffers as is used for loading activation values.

It should be understood that the process 1700 is a conceptual process, and certain operations in the process are executed synchronously with other operations in the process in some embodiments. For instance, loading the weight values for a pass might require numerous clock cycles in some embodiments (because many RAM words need to be read and decoded in order to load all of the weight values for a large number of filters. While these weight values are being loaded into the filter slice buffers, the cores concurrently read the first round of activation values from the core memory and load these activation values into the activation window buffers in some embodiments. For subsequent rounds of dot products using the same filters, the weight values will already be loaded into the filter slice buffers, and only the activation values need to be loaded. In other embodiments, all of the weight values are loaded before loading the activation values, because the same architecture for reading data from the core memory is used for both sets of values.

Thus, the process 1700 reads (at 1710) the RAM words storing input values for the next set of dot products. In addition, the process stores (at 1715) the RAM words that are read out of the core memory in the activation cache. In some embodiments, as described above, the activation memory controller includes a cache for storing up to a particular number of RAM words (e.g., 5, 7, 10, etc.). Some embodiments store When the activation values are stored in the RAM words in the manner shown in FIG. 13, a RAM word read from memory will often include activation values for both the next set of dot products as well as at least some of the activation values for the set of dot products to follow. While more RAM words may be read for a particular dot product than the total number of available spaces in the cache, many of these words will be completely used for the current dot product and thus do not need to be stored in the cache for use in the subsequent set of dot products. In general, for a convolutional layer using 3×3 filters, a maximum of three RAM words in a core will include both input values for the current set of dot products as well as input values for the subsequent set of dot products (one for each row of the input activation values). In this case, storing these RAM words in the activation cache allows the core to avoid re-reading the words out of memory, thereby realizing significant power savings.

Some embodiments store each RAM word read from the core memory in the cache, irrespective of whether any of the activation values will be used for subsequent dot products. In general, even if a RAM word is used entirely for the current dot product, multiple clock cycles are required to load all of the values from the RAM word into the activation window buffer (one exception to this being when all of the activation values stored in the RAM word belong to different two-dimensional activation grids at the same x-y coordinate). When overwriting rows of the cache, some embodiments simply write each newly read RAM word in order, while other embodiments selectively overwrite RAM words that do not contain activations needed for subsequent operations.

The process 1700 then loads (at 1720) the activation values for the next set of dot products into the activation window buffer. For the first set of dot products of a pass, all of the activation values will be newly read from the core memory (although other than the first set of coordinates loaded into the shift registers, the activation values will still be loaded from the cache rather than directly from memory). For subsequent sets of dot products, some of these activation values will already be stored in the activation window buffer, having been used for a previous set of dot products. Each of the activation values is loaded into the correct cell in the activation window buffer based on its coordinate within the three-dimensional activation array for the layer, in some embodiments. This will typically require several clock cycles, as the activation values are loaded one coordinate at a time. As described above by reference to FIGS. 15 and 16, in some embodiments the activations for each two-dimensional grid are stored in subsequent cells of the activation window buffer that are implemented as shift register for that two-dimensional grid.

Once all of the activation values for a given set of dot product computations are loaded into all of the cells of the activation window buffer (assuming that the weight values are also loaded into the filter slice buffer), the process 1700 computes (at 1725) the dot products between the loaded weight values of each filter and the loaded activation values. As described in more detail above by reference to FIG. 10, the cores compute partial dot products, which are aggregated in the dot product bus. In addition, the post-processing units perform post-processing to generate the next layer of activation values, which the activation write bus transports to the correct destination cores.

Figure 18A:
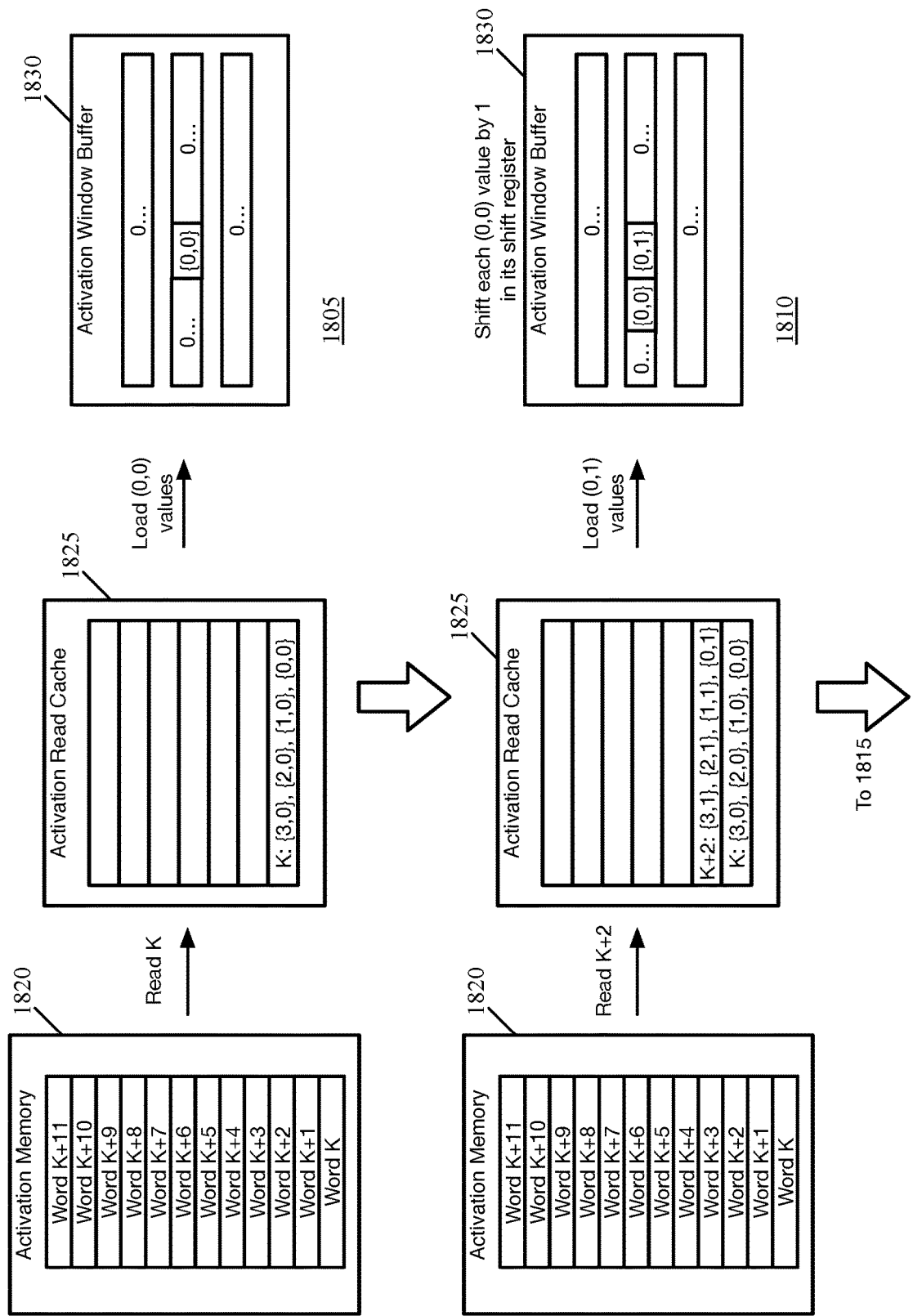
FIGS. 18A-B conceptually illustrates the loading of a first set of activation values into an activation window buffer in order to compute a set of dot products using the first set of activation values.
Figure 18B:
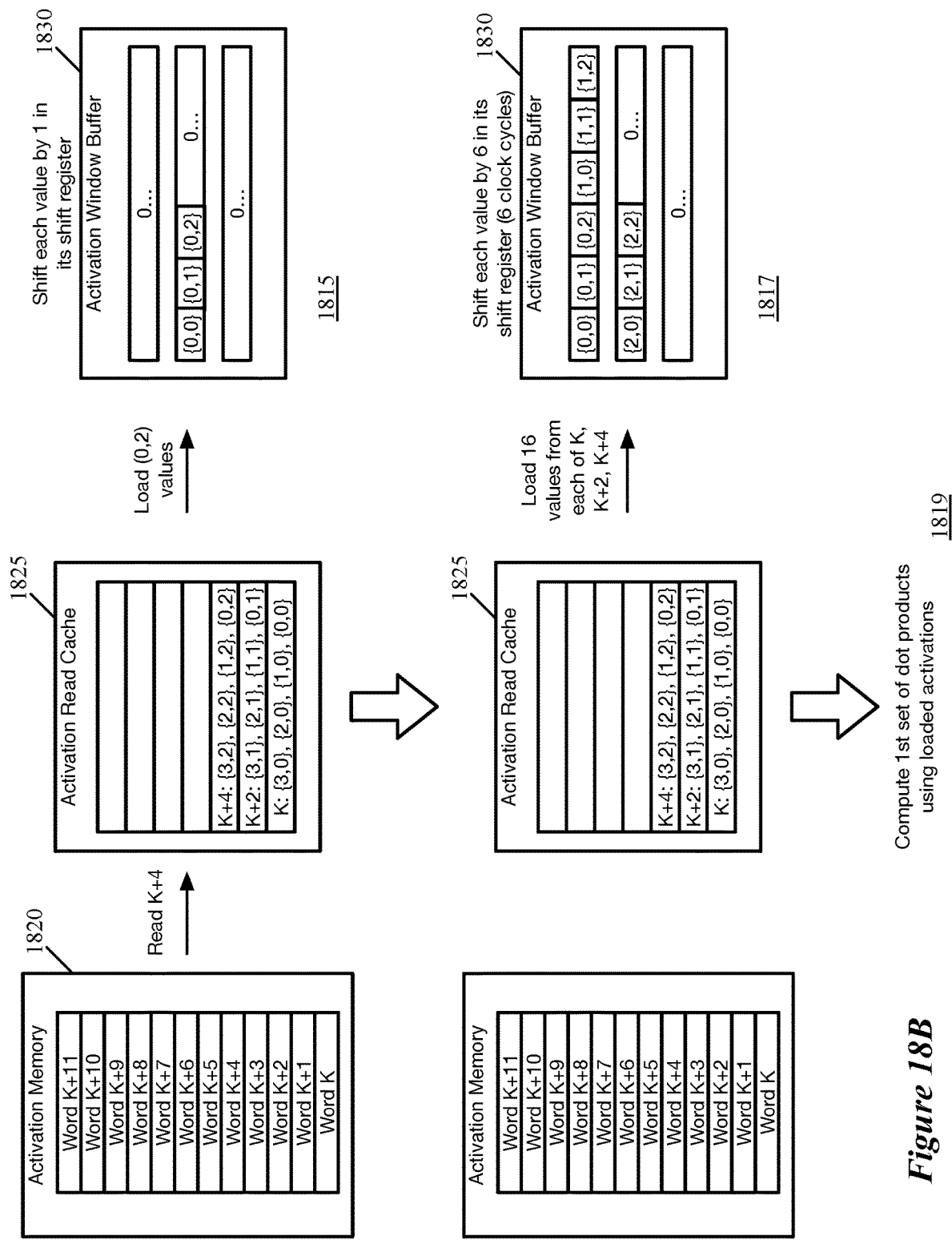

FIGS. 18A-B conceptually illustrate, over five stages 1805-1819, the loading of a first set of the activation values 1200 into an activation window buffer in order to compute a set of dot products using the first set of activation values. The first stage 1805 illustrates activation memory 1820, activation read cache 1825, and activation window buffer 1830. The activation memory 1820 represents the portion of the core memory that stores the activation input values 1200 of a layer K. As shown, this includes twelve RAM words, labeled K–K+11. The content of these RAM words corresponds to the RAM words shown in FIG. 13 for one of the core memories 1305-1315.

The activation read cache 1825 represents the data stored in the activation cache 1400 of FIG. 14 (i.e., the contents of the data block 1415). In this example, the activation read cache 1825 can store up to seven RAM words at a time. The activation window buffer 1830 represents the data stored in the programmable shift register 1515 (in this example, no time-multiplexing is required for the dot product calculations, so only the primary activation window buffer is used). While this figure (and the subsequent figures) show the activation memory, activation read cache, and activation window buffer for a single core, it should be understood that all of the other source cores for the neural network layer also execute the same operations to read activation values and store these values in the read cache and the activation window buffer.

In the first stage 1805, the first RAM word K is read from the activation memory 1820 into the activation read cache 1825, and the set of activation values for coordinate (0,0) are loaded into the activation window buffer 1830. In some embodiments, the memory read operation requires a fixed number of clock cycles (e.g., 5 cycles), and the entire RAM word is read into the cache at the same time that the (0,0) activation values are loaded into their respective shift registers within the activation window buffer 1830. Each of the words within the activation read cache 1825 includes 32 activation values, (i.e., 8 values for each of four (x,y) coordinates). The coordinates for which activation values are included in each word are shown in brackets in the figure. In some embodiments, the blank rows of the activation read cache 1825 and the portions of the activation window buffer 1830 shown as zeros may actually store data from a previous set of calculations (effectively junk data for the subsequent calculations), or may have been fully reset to all zeros at this point.

As shown, the activation values loaded into the activation window buffer 1830 are inserted into a specific register block at the entry point for each of the configured shift register. In this case, of the 16 possible shift registers available in the programmable shift register mode for 3×3 kernels, 8 of these shift registers are used. At this stage, only the activation values at coordinate (0,0) have been loaded, Though shown as blocks of 8 activation values in FIG. 18 (and in subsequent figures), it should be understood that the values at the same (x,y) coordinate are not stored next to each other in the activation window buffer 1830, for the reasons described above (they are each in a separate shift register for their respective two-dimensional activation grids).

The second stage 1810 illustrates that the memory controller reads the RAM word K+2, that stores the next set of data to be loaded into the activation window buffer 1830, from the activation memory 1820, and loads this word into the activation read cache 1825. In addition, the (0,1) activation values are loaded into the activation window buffer 1830, at the entry points in each shift register. Concurrently, the activation values at coordinate (0,0) are shifted by one register block.

In the third stage 1815, the memory controller reads the RAM word K+4, that stores the next set of data to be loaded into the activation window buffer 1830, from the activation memory 1820, and loads this word into the activation read cache 1825. In addition, the (0,2) activation values are loaded into the activation window buffer 1830, at the entry points in each shift register. Concurrently, the activation values at coordinates (0,0) and (0,1) are shifted by one register block within the activation window buffer 1830.

At this point, all of the activation values for the upcoming dot product have been read into the cache 1825, so additional memory reads are not required. Instead, as shown in the fourth stage 1817, over the next six clock cycles, the activation values for the next two columns of data are loaded into the activation window buffer 1830, starting with the activation values at coordinate (1,0) and finishing with the activation values at coordinate (2,2). These last values to load are stored at the programmable register blocks that receive activation values from the activation memory (as opposed to from the previous register block). With all of the activation values loaded, the chip fabric computes the first set of dot products in the fifth stage 1819.

Returning to FIG. 17, after computing the dot products using the loaded activation values, the process 1700 determines (at 1730) whether the end of the current pass has been reached. If the end of the pass has been reached, then all new filters and activations will need to be loaded for the next pass (possibly the next layer), and the process ends.

On the other hand, if the end of the current pass has not been reached, then the process 1700 determines (at 1735) whether the end of the current row has been reached. As described above, a convolutional layer typically convolves a filter over the set of activation grids starting at a first set of rows (e.g., first three rows for a 3×3 filter). Upon reaching the end of that row, the convolution returns to the beginning of the next set of rows. Depending on how the neural network is designed, this may include either some of the previous rows of input activations included or with all new rows of activation values (i.e., for the 3×3 filter example, if the first set of rows includes rows 0-2, then the next set of rows could include rows 1-3, rows 2-4, or rows 3-5). In some embodiments, an end of row signal is transmitted as part of the configuration data (e.g., this signal is usually 0, but is set to 1 when the end of a row is reached).

When the end of the current row has been reached, the process clears (at 1740) the activation window buffer in some embodiments, as the currently loaded activations will typically not be used for the subsequent set of computations. In other embodiments, the buffer is not "cleared" as such, but rather the values will be entirely shifted out of the buffer as the new values are shifted in, in subsequent operations.

If the end of the row has not been reached, the process shifts (at 1745) the activation values in the buffer to remove one or more columns of activation values. As mentioned, the process 1700 is a conceptual process, representing the set of operations performed in different circumstances. In some embodiments, the shifting is actually performed as the new activation values from activation memory (either from the cache or directly from the core memory) are loaded into the activation window buffer. That is, though shown in FIG. 17 as a separate operation, the shifting of previously-loaded activation values actually occurs at the same time as the loading of these values (as shown in FIGS. 18-20).

Next, the process 1700 determines (at 1750) whether additional RAM words need to be read from the core memory for the next set of dot product computations. That is, the process determines whether all of the activations required for the next set of dot products (that are not already in the activation window buffer) are stored in the activation read cache, or if they need to be read from the core RAM. As discussed above, in some embodiments the activation read cache controller 1405 compares the address of each RAM word with the required activation values to the addresses of the RAM words stored in the read cache to determine whether the RAM word needs to be read out of the core memory. In addition, though shown as a single determination in the conceptual process 1700, in some embodiments the comparison is made for each set of activation values loaded at one time into the activation window buffer 1830 (e.g., the activation values for each x-y coordinate).

When the RAM words are not stored in the cache, the process 1700 returns to 1710 to read these RAM words with the desired activation values from the core memory, store them in the cache, load the activation values for the next set of dot product computations into the activation window buffer, and compute the next set of dot products. On the other hand, when all of the required RAM words are already stored in the cache, the process 1700 does not need to execute any read operations from the core memory, and so instead returns to 1720 to load the activation values for the next set of dot product computations into the activation window buffer, and compute the next set of dot products. Once the end of the current pass is reached, the process 1700 ends.

Figure 19:
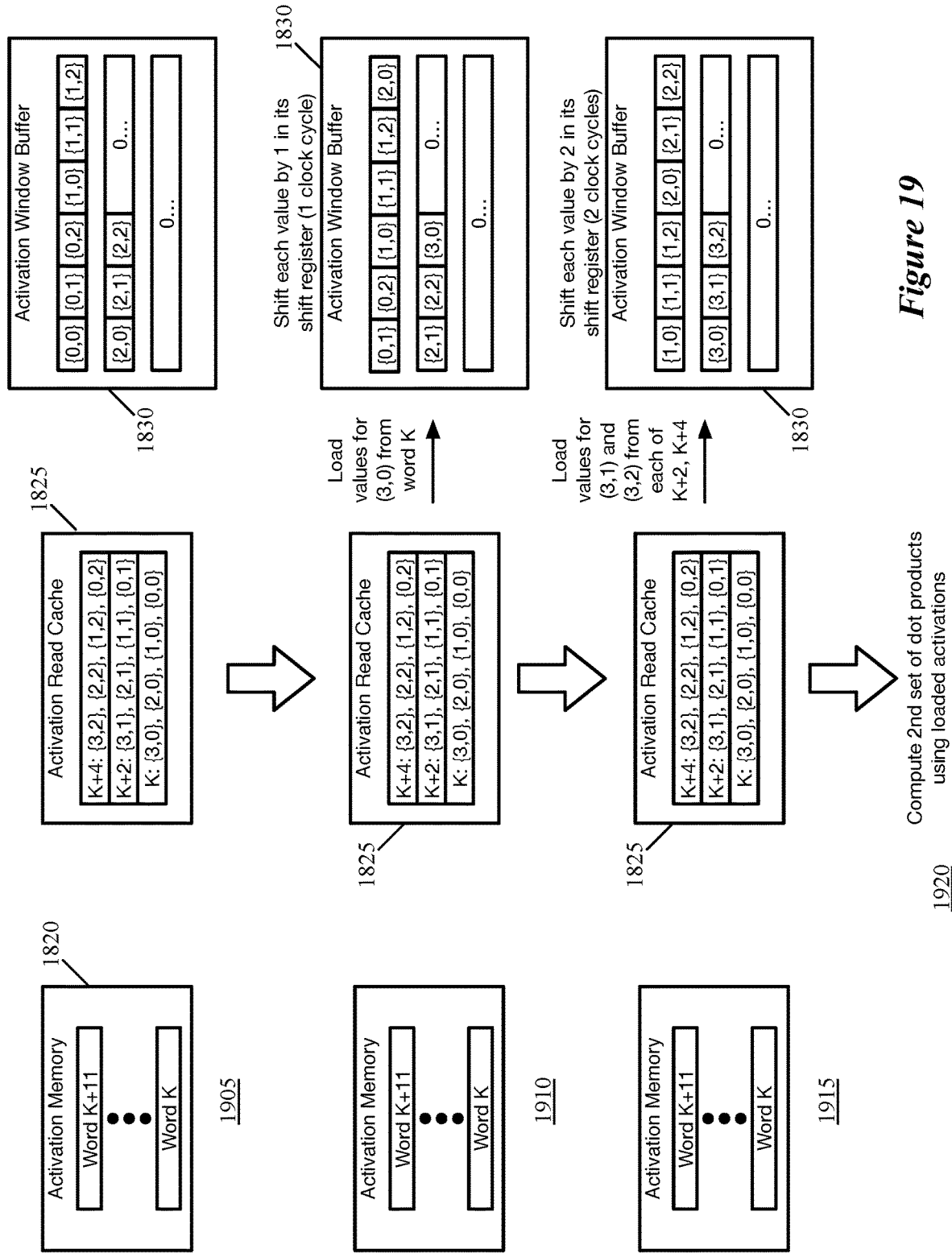
FIG. 19 conceptually illustrates the loading of activation values for a second set of dot products into the activation window buffer while shifting activation values from the previous dot product within the activation window buffer.

FIG. 19 conceptually illustrates the loading of activation values for a second set of dot products into the activation window buffer 1830 while shifting activation values from the previous dot product within the activation window buffer 1830 over four stages 1905-1920. In this example, all of the activation values required for the computation are already either (i) already loaded into the activation window buffer or (ii) already stored in the activation read cache 1825, so that no RAM words need to be read out of the activation memory 1820. For simplicity, the activation read cache 1825 only shows the three rows currently storing valid data (RAM words K, K+2, and K+4), rather than including the rows storing blank or invalid data.

The first stage 1905 illustrates the activation memory 1820, activation read cache 1825, and activation window buffer 1830 in the same state as in stage 1810 of FIG. 18, as the set of dot products are computed. The second stage 1910 illustrates the activation window buffer 1830 after one clock cycle of loading/shifting of activation values. Specifically, the eight values with coordinates of (3,0) are loaded into the programmable register blocks of the buffer 1830, the eight values with coordinates of (0,0) are shifted out of the buffer 1830, and the other activation values stored in the buffer 1830 are shifted by one register block.

The third stage 1915 illustrates the activation window buffer 1830 after two more clock cycles of loading/shifting activation values. After three cycles, all of the activation values with an x-coordinate of 0 have been shifted out of the activation window buffer 1830, while the activation values with coordinates of (3,0), (3,1), and (3,2) have been shifted into the buffer 1830 and the activation values with x-coordinates of 1 and 2 have been shifted by three register blocks. In the fourth stage 1920, the second set of dot products are computed using these activations. By shifting the values within the window buffer 1830, the activation values with x-coordinate of 1 will be multiplied by the same weight values in this set of dot products as the activation values with x-coordinate of 0 were multiplied by in the previous set of dot products (and similarly for the other activation values).

Figure 20A:
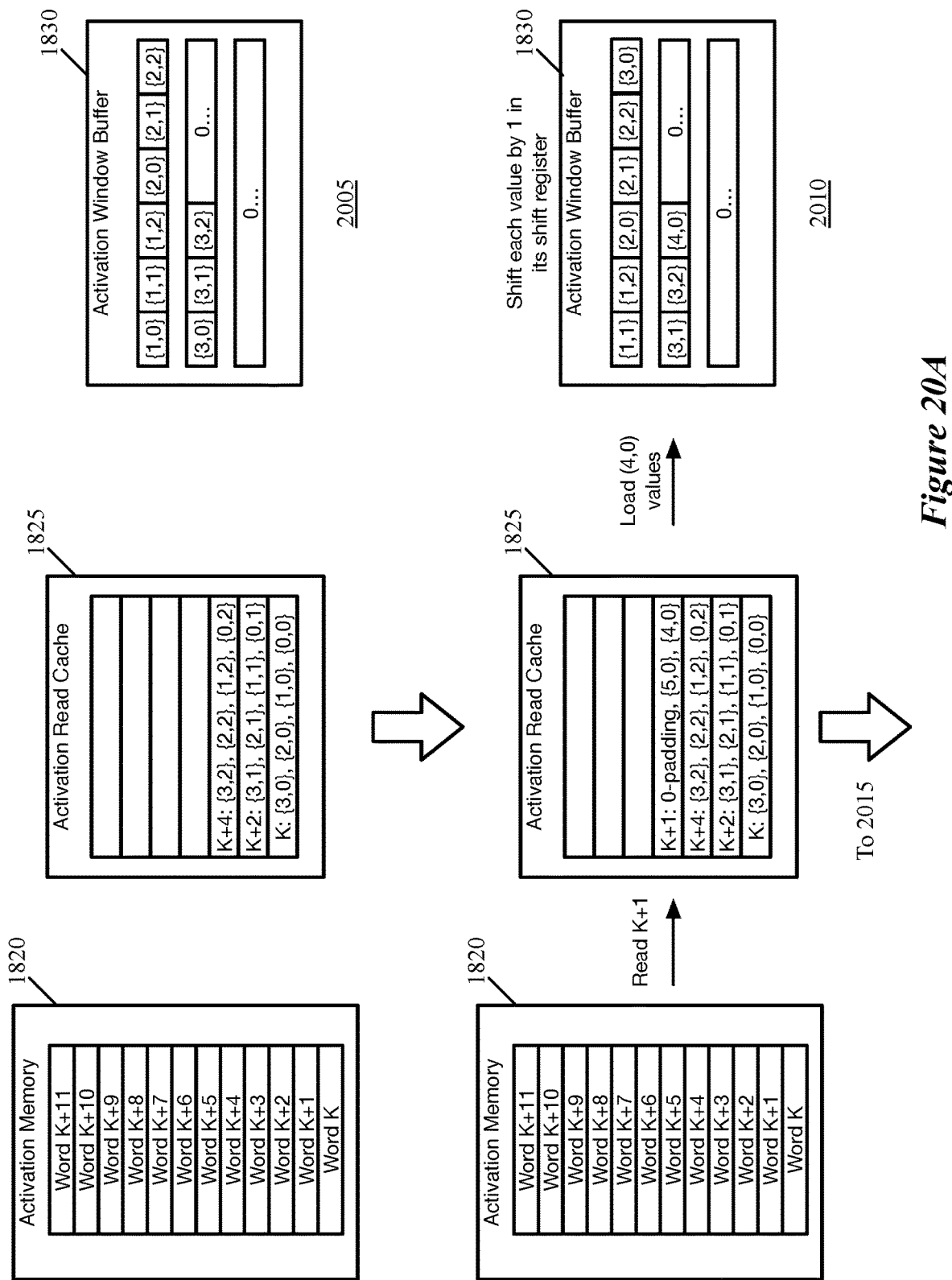
FIGS. 20A-B conceptually illustrate the loading of activation values for a third set of dot products into the activation window buffer while shifting activation values from the second dot product within the activation window buffer.
Figure 20B:
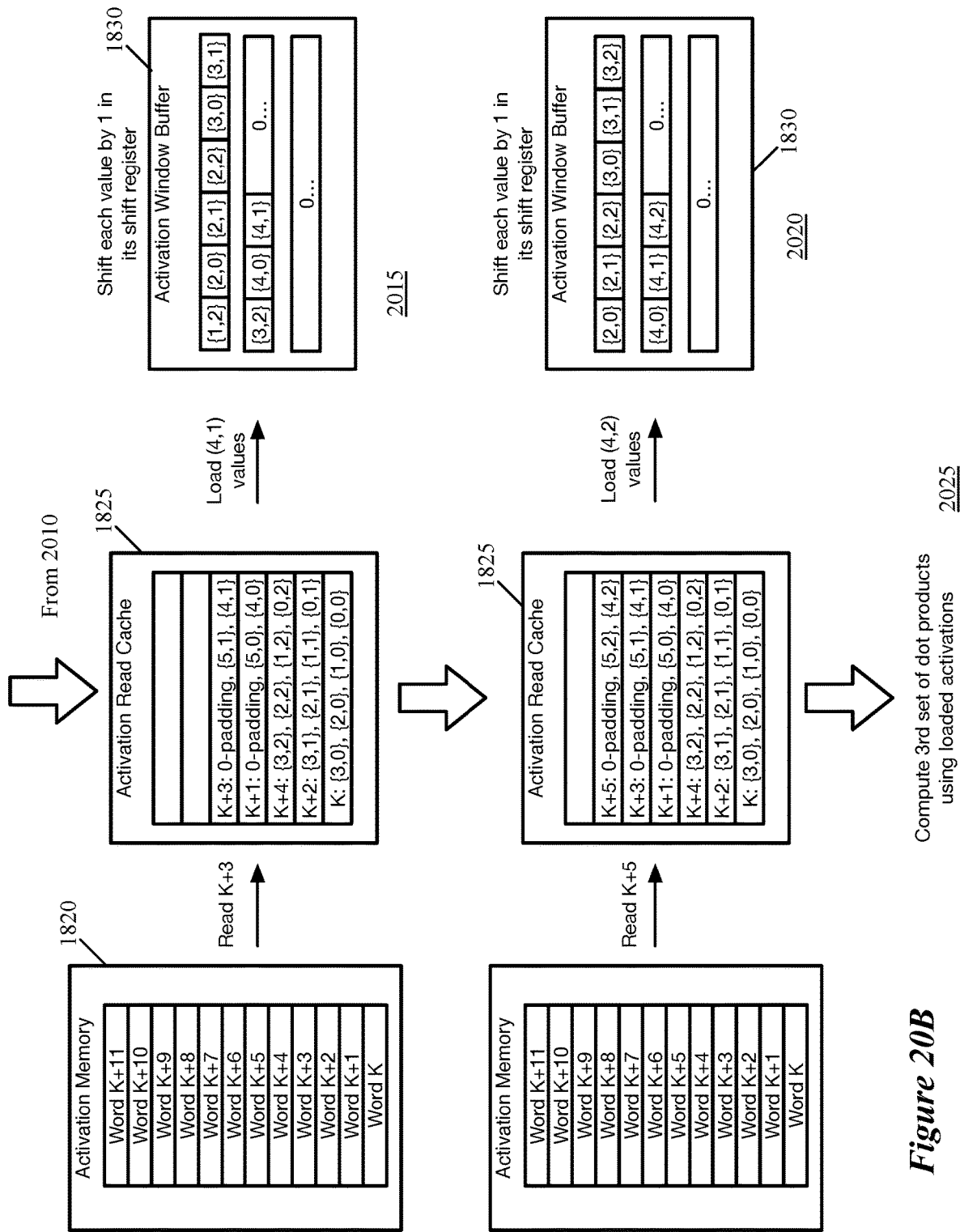

FIGS. 20A-B conceptually illustrate the loading of activation values for a third set of dot products into the activation window buffer 1830 while shifting activation values from the second dot product within the activation window buffer 1830 over five stages 2005-2025. In this example, activation values are required that are stored in RAM words that have not yet been read from the core memory 1820.

The first stage 2005 illustrates the activation memory 1820, activation read cache 1825, and activation window buffer 1830 in the same state as in stage 1810 of FIG. 19, as the second set of dot products are computed. The second stage 2010 illustrates that the RAM word K+1 is read from activation memory 1820 by the activation memory controller and stored in the activation read cache 1825. In addition, the first set of activation values from this RAM word, with the coordinate (4,0), are loaded into the activation window buffer 1830 (while shifting the data within that buffer by one register block). In some embodiments, the word K+1 is stored in a new (currently unused row) of the activation read cache 1825. In this example, some of the activations stored in the words K+2 and K+4 will be used in the next row of dot products (though the activations stored in the word K will not be), so these words remain in the cache instead of being overwritten. Other embodiments also only overwrite words in the cache when the cache rows are completely full, which is not the case in this example.

The third stage 2015 illustrates that the memory controller reads the RAM word K+3 from the activation memory 1820 and stores this word in the activation read cache 1825. In addition, the activation values at coordinate (4,1) are loaded into the activation window buffer 1830, at the entry points in each shift register. Concurrently, the activation values in the buffer are shifted by one register block.

Similarly, in the fourth stage 2020, the memory controller reads the RAM word K+5 from the activation memory 1820 and stores this word in the activation read cache 1825. In addition, the activation values at coordinate (4,2) are loaded into the activation window buffer 1830, at the entry points in each shift register. Concurrently, the activation values at coordinate (0,0) are shifted by one register block. Finally, in the fifth stage 2025, the next set of dot products are computed using the activations loaded into the activation window buffer 2025. This process continues until the row of dot products is completed (with a fourth dot product that does not require any additional memory reads), and the process returns to the start of the next row of dot products.

The integrated circuit of some embodiments can be embedded into various different types of devices in order to perform different purposes (e.g., face recognition, object categorization, voice analysis, etc.). For each type of device, a network is trained, obeying the sparsity and/or ternary constraints, with the network parameters stored with the IC to be executed by the IC on the device. These devices can include mobile devices, desktop computers, Internet of Things (IoT devices), etc.

Figure 21:
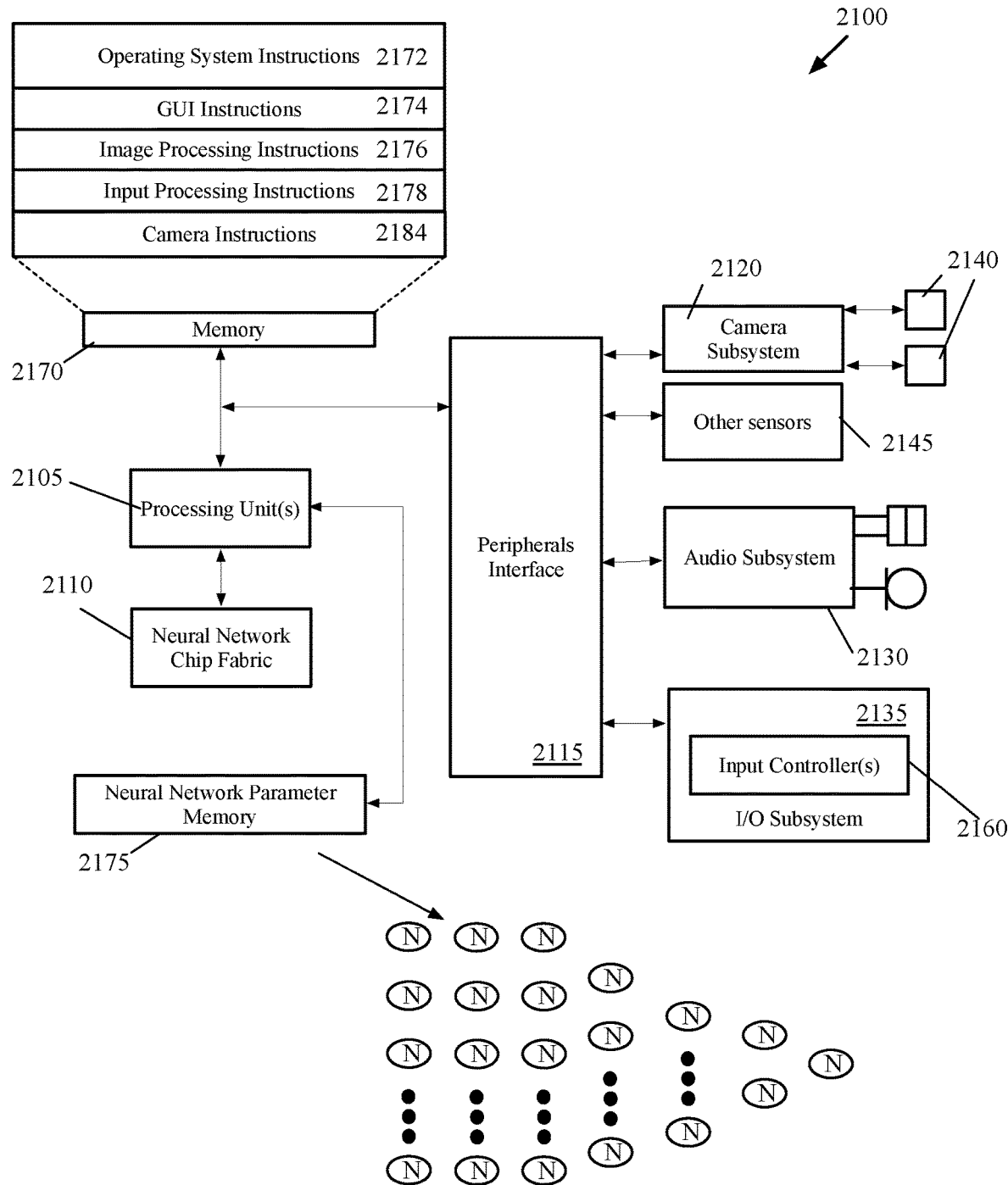
FIG. 21 is an example of an architecture of an electronic device that includes the neural network integrated circuit of some embodiments.

FIG. 21 is an example of an architecture 2100 of an electronic device that includes the neural network integrated circuit of some embodiments. The electronic device may be a mobile computing device such as a smartphone, tablet, laptop, etc., or may be another type of device (e.g., an IoT device, a personal home assistant). As shown, the device 2100 includes one or more general-purpose processing units 2105, a neural network chip fabric 2110, and a peripherals interface 2115.

The peripherals interface 2115 is coupled to various sensors and subsystems, including a camera subsystem 2120, an audio subsystem 2130, an I/O subsystem 2135, and other sensors 2145 (e.g., motion/acceleration sensors), etc. The peripherals interface 2115 enables communication between the processing units 2105 and various peripherals. For example, an orientation sensor (e.g., a gyroscope) and an acceleration sensor (e.g., an accelerometer) can be coupled to the peripherals interface 2115 to facilitate orientation and acceleration functions. The camera subsystem 2120 is coupled to one or more optical sensors 2140 (e.g., charged coupled device (CCD) optical sensors, complementary metal-oxide-semiconductor (CMOS) optical sensors, etc.). The camera subsystem 2120 and the optical sensors 2140 facilitate camera functions, such as image and/or video data capturing.

The audio subsystem 2130 couples with a speaker to output audio (e.g., to output voice navigation instructions). Additionally, the audio subsystem 2130 is coupled to a microphone to facilitate voice-enabled functions, such as voice recognition, digital recording, etc. The I/O subsystem 2135 involves the transfer between input/output peripheral devices, such as a display, a touch screen, etc., and the data bus of the processing units 2105 through the peripherals interface 2115. The I/O subsystem 2135 various input controllers 2160 to facilitate the transfer between input/output peripheral devices and the data bus of the processing units 2105. These input controllers 2160 couple to various input/control devices, such as one or more buttons, a touchscreen, etc.

In some embodiments, the device includes a wireless communication subsystem (not shown in FIG. 21) to establish wireless communication functions. In some embodiments, the wireless communication subsystem includes radio frequency receivers and transmitters and/or optical receivers and transmitters. These receivers and transmitters of some embodiments are implemented to operate over one or more communication networks such as a GSM network, a Wi-Fi network, a Bluetooth network, etc.

As illustrated in FIG. 21, a memory 2170 (or set of various physical storages) stores an operating system (OS) 2172. The OS 2172 includes instructions for handling basic system services and for performing hardware dependent tasks. The memory 2170 also stores various sets of instructions, including (1) graphical user interface instructions 2174 to facilitate graphic user interface processing; (2) image processing instructions 2176 to facilitate image-related processing and functions; (3) input processing instructions 2178 to facilitate input-related (e.g., touch input) processes and functions; and (4) camera instructions 2184 to facilitate camera-related processes and functions. The processing units 2110 execute the instructions stored in the memory 2170 in some embodiments.

The memory 2170 may represent multiple different storages available on the device 2100. In some embodiments, the memory 2170 includes volatile memory (e.g., high-speed random access memory), non-volatile memory (e.g., flash memory), a combination of volatile and non-volatile memory, and/or any other type of memory.

The instructions described above are merely exemplary and the memory 2170 includes additional and/or other instructions in some embodiments. For instance, the memory for a smartphone may include phone instructions to facilitate phone-related processes and functions. An IOT device, for instance, might have fewer types of stored instructions (and fewer subsystems), to perform its specific purpose and have the ability to receive a single type of input that is evaluated with its neural network.

The above-identified instructions need not be implemented as separate software programs or modules. Various other functions of the device can be implemented in hardware and/or in software, including in one or more signal processing and/or application specific integrated circuits.

In addition, a neural network parameter memory 2175 stores the weight values, bias parameters, etc. for implementing one or more machine-trained networks by the neural network chip fabric 2110. As mentioned above, different clusters of cores of the fabric 2110 can implement different machine-trained networks in parallel in some embodiments. In different embodiments, these neural network parameters are stored on-chip (i.e., in memory that is part of the neural network chip fabric 2110) or loaded onto the IC 2110 from the neural network parameter memory 2175 via the processing unit(s) 2105.

While the components illustrated in FIG. 21 are shown as separate components, one of ordinary skill in the art will recognize that two or more components may be integrated into one or more integrated circuits. In addition, two or more components may be coupled together by one or more communication buses or signal lines (e.g., a bus between the general-purpose processing units 2105 and the neural network IC 2110, which enables the processing units 2105 to provide inputs to the neural network IC 2110 and receive the outputs of the network from the IC 2110. Also, while many of the functions have been described as being performed by one component, one of ordinary skill in the art will realize that the functions described with respect to FIG. 21 may be split into two or more separate components.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 22:
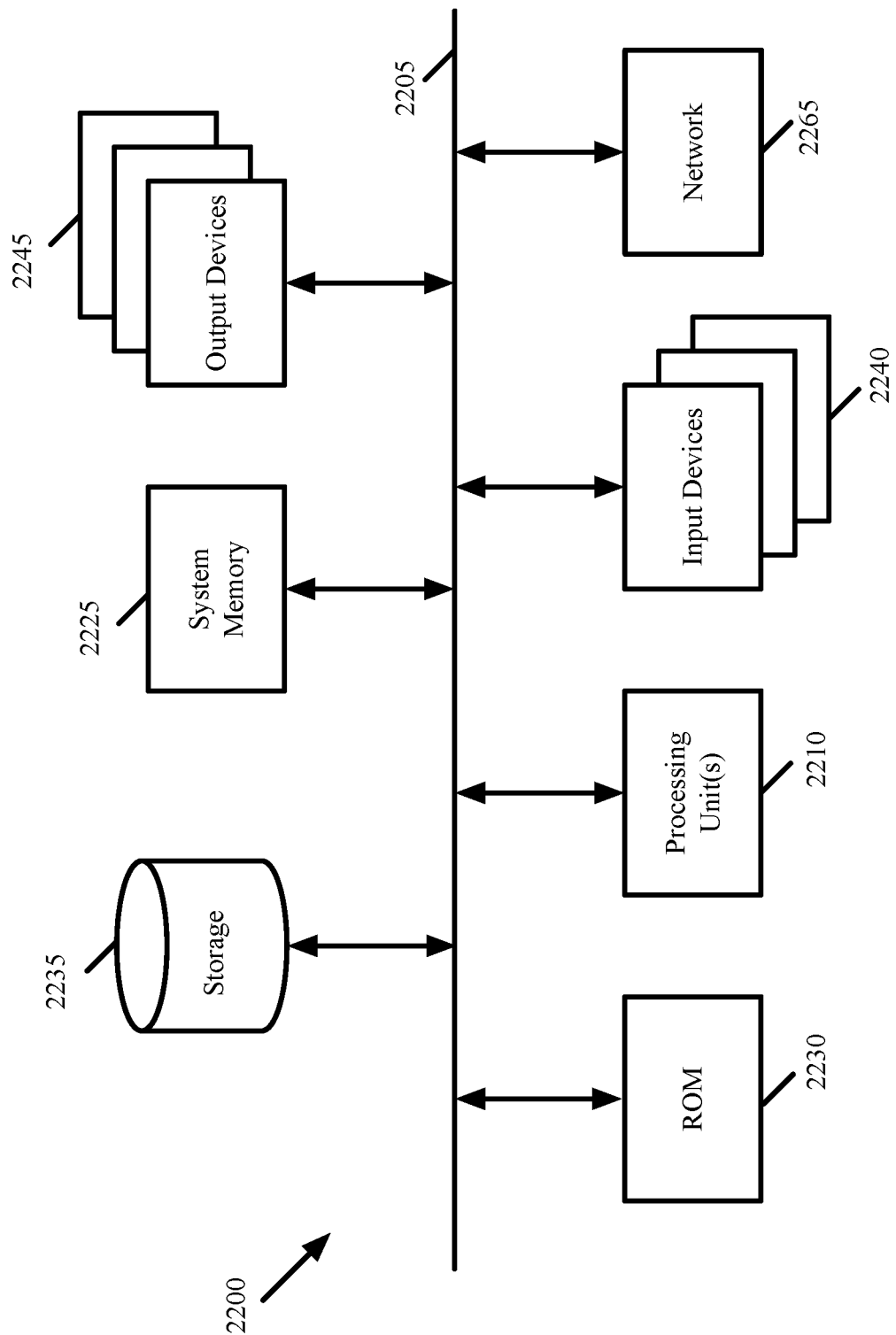
FIG. 22 conceptually illustrates an electronic system with which some embodiments of the invention are implemented.

FIG. 22 conceptually illustrates an electronic system 2200 with which some embodiments of the invention are implemented. The electronic system 2200 can be used to execute any of the control and/or compiler systems described above in some embodiments. The electronic system 2200 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2200 includes a bus 2205, processing unit(s) 2210, a system memory 2225, a read-only memory 2230, a permanent storage device 2235, input devices 2240, and output devices 2245.

The bus 2205 collectively represents all system, peripheral, and chipset buses that communicatively connect the numerous internal devices of the electronic system 2200. For instance, the bus 2205 communicatively connects the processing unit(s) 2210 with the read-only memory 2230, the system memory 2225, and the permanent storage device 2235.

From these various memory units, the processing unit(s) 2210 retrieves instructions to execute and data to process in order to execute the processes of the invention. The processing unit(s) may be a single processor or a multi-core processor in different embodiments.

The read-only-memory (ROM) 2230 stores static data and instructions that are needed by the processing unit(s) 2210 and other modules of the electronic system. The permanent storage device 2235, on the other hand, is a read-and-write memory device. This device is a non-volatile memory unit that stores instructions and data even when the electronic system 2200 is off. Some embodiments of the invention use a mass-storage device (such as a magnetic or optical disk and its corresponding disk drive) as the permanent storage device 2235.

Other embodiments use a removable storage device (such as a floppy disk, flash drive, etc.) as the permanent storage device. Like the permanent storage device 2235, the system memory 2225 is a read-and-write memory device. However, unlike storage device 2235, the system memory is a volatile read-and-write memory, such a random-access memory. The system memory stores some of the instructions and data that the processor needs at runtime. In some embodiments, the invention's processes are stored in the system memory 2225, the permanent storage device 2235, and/or the read-only memory 2230. From these various memory units, the processing unit(s) 2210 retrieves instructions to execute and data to process in order to execute the processes of some embodiments.

The bus 2205 also connects to the input and output devices 2240 and 2245. The input devices enable the user to communicate information and select commands to the electronic system. The input devices 2240 include alphanumeric keyboards and pointing devices (also called "cursor control devices"). The output devices 2245 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 22, bus 2205 also couples electronic system 2200 to a network 2265 through a network adapter (not shown). In this manner, the computer can be a part of a network of computers (such as a local area network ("LAN"), a wide area network ("WAN"), or an Intranet, or a network of networks, such as the Internet. Any or all components of electronic system 2200 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra-density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, some of the figures (including FIGS. 10 and 17) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A neural network inference circuit for executing a neural network that comprises a plurality of computation nodes at a plurality of layers, each of a set of the computation nodes comprising a dot product of input values and weight values, the neural network inference circuit comprising:
   a set of dot product cores, each dot product core comprising:
      a set of partial dot product computation circuits to compute dot products between sets of input values and sets of weight values; and
      a set of memories to store the sets of weight values and sets of input values for a layer of the neural network,
   wherein the input values for a particular layer of the neural network are stored in the sets of memories of a plurality of the cores, wherein a starting memory location in the set of memories of a first core of the plurality of cores for the input values of the particular layer stored in the first core is the same as a starting memory location for the input values of the particular layer in the set of memories of each of the other cores of the plurality of cores that store the input values for the particular layer.

2. The neural network inference circuit of claim 1, wherein the input values for the particular layer are arranged in a plurality of two-dimensional grids, wherein each input value has (i) a first coordinate in a first dimension of the grid to which the input value belongs, (ii) a second coordinate in a second dimension of the grid to which the input value belongs, and (iii) a third coordinate indicating to which of the grids the input value belongs.

3. The neural network inference circuit of claim 2, wherein a first input value stored at a particular memory location of a first one of the cores has the same first and second coordinates as a second input value stored at the same particular memory location of each of the other cores of the plurality of cores that store the input values for the particular layer.

4. The neural network inference circuit of claim 3, wherein the first and second input values have different third coordinates indicating that the first and second input values belong to different two-dimension grids of input values.

5. The neural network inference circuit of claim 2, wherein a particular computation node of the particular layer uses a subset of the input values for the particular layer.

6. The neural network inference circuit of claim 5, wherein the subset of the input values used by the particular computation node comprises a same contiguous portion of each of the two-dimensional grids.

7. The neural network inference circuit of claim 5, wherein a plurality of computation nodes of the particular layer use the same subset of input values.

8. The neural network inference circuit of claim 1, wherein each core of the plurality of cores stores a same number of the input values for the particular layer.

9. The neural network inference circuit of claim 1, wherein each core of the plurality of cores except for one particular core of the plurality of cores stores a same number of the input values for the particular layer.

10. The neural network inference circuit of claim 6, wherein the particular core stores fewer input values for the particular layer than the number of input values stored by each of the other cores of the plurality of cores.

11. The neural network inference circuit of claim 1, wherein the set of memories of each core comprises a plurality of memory banks, each memory bank comprising a plurality of words.

12. The neural network inference circuit of claim 11, wherein each input value comprises a same number of bits such that each word has storage for a same number of input values.

13. The neural network inference circuit of claim 11, wherein the starting memory location in each of the cores of the plurality of cores for the particular layer is a starting location within a particular word of the cores.

14. The neural network inference circuit of claim 1, wherein the input values for the particular layer stored in a particular core are stored in a contiguous portion of the set of memories of the particular core.

15. The neural network inference circuit of claim 1 further comprising a set of dot product aggregation circuits for aggregating partial dot products from the plurality of cores.

16. The neural network inference circuit of claim 1, wherein:
   the particular layer is a first layer and the plurality of the cores is a first plurality of the cores;
   the input values for a second layer of the neural network are stored in the sets of memories of a second plurality of the cores; and
   a starting memory location in the set of memories of a second core of the second plurality of cores for the input values of the second layer stored in the second core is the same as a starting memory location for the input values of the second layer in the set of memories of each of the other cores of the second plurality of cores that store the input values for the second layer.

17. The neural network inference circuit of claim 16, wherein at least a subset of the first plurality of cores is the same as a subset of the second plurality of cores.

18. The neural network inference circuit of claim 16, wherein the input values of the second layer are output values of the computation nodes of the first layer.

19. The neural network inference circuit of claim 18, wherein the starting memory location for the input values of the second layer in each of the cores of the second plurality of cores is a different location than the starting memory location for the input values of the first layer in each of the cores of the first plurality of cores.

20. The neural network inference circuit of claim 16, wherein the first plurality of cores is a different number of cores than the second plurality of cores.

* * * * *